US012574012B2

(12) United States Patent
Nakamura et al.

(10) Patent No.: US 12,574,012 B2
(45) Date of Patent: Mar. 10, 2026

(54) FILTER DEVICE AND MULTIPLEXER

(71) Applicant: Murata Manufacturing Co., Ltd., Nagaokakyo (JP)

(72) Inventors: Kentaro Nakamura, Nagaokakyo (JP); Takuro Okada, Nagaokakyo (JP); Takuya Yabu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 124 days.

(21) Appl. No.: 18/736,823

(22) Filed: Jun. 7, 2024

(65) Prior Publication Data

US 2025/0030403 A1     Jan. 23, 2025

(30) Foreign Application Priority Data

Jul. 20, 2023     (JP) ................................. 2023-118305

(51) Int. Cl.
| | |
|---|---|
| *H03H 9/56* | (2006.01) |
| *H03H 9/13* | (2006.01) |
| *H03H 9/205* | (2006.01) |
| *H03H 9/70* | (2006.01) |

(52) U.S. Cl.
CPC ........... *H03H 9/568* (2013.01); *H03H 9/133* (2013.01); *H03H 9/205* (2013.01); *H03H 9/70* (2013.01)

(58) Field of Classification Search
CPC ........ H03H 9/568; H03H 9/133; H03H 9/205; H03H 9/70; H03H 9/1457; H03H 9/6483; H03H 9/46; H03H 9/0566
See application file for complete search history.

(56) References Cited

U.S. PATENT DOCUMENTS

| | | | |
|---|---|---|---|
| 2019/0123720 A1 | 4/2019 | Takamine | |
| 2024/0250658 A1* | 7/2024 | Okada | H03H 9/02015 |
| 2025/0030400 A1* | 1/2025 | Yabu | H03H 9/6483 |
| 2025/0158593 A1* | 5/2025 | Nakamura | H03H 9/25 |
| 2025/0167756 A1* | 5/2025 | Yabu | H03H 9/568 |
| 2025/0175145 A1* | 5/2025 | Nakamura | H03H 9/02992 |
| 2025/0274096 A1* | 8/2025 | Nakamura | H03H 9/568 |

(Continued)

FOREIGN PATENT DOCUMENTS

| | | | | |
|---|---|---|---|---|
| CN | 110417373 A | * | 11/2019 | ............. H03H 9/174 |
| JP | 08222992 A | * | 8/1999 | |
| JP | 2003101386 A | * | 4/2003 | |

(Continued)

*Primary Examiner* — Andrea Lindgren Baltzell
*Assistant Examiner* — Kimberly E Glenn
(74) *Attorney, Agent, or Firm* — Keating & Bennett, LLP

(57)     ABSTRACT

A filter device includes a first signal terminal, a second signal terminal, and a plurality of resonators including a plurality of series arm resonators and a plurality of parallel arm resonators. At least one of the plurality of series arm resonators and the plurality of parallel arm resonators is an excitation angle change resonator. The excitation angle change resonator includes a piezoelectric substrate including a piezoelectric body layer, and an IDT electrode including a plurality of electrode fingers provided on the piezoelectric substrate. The piezoelectric body layer has a propagation axis. The plurality of electrode fingers are curved. An excitation direction of an acoustic wave in a portion of an electrode finger in the plurality of electrode fingers is one of first to third directions.

36 Claims, 24 Drawing Sheets

(56)        References Cited

U.S. PATENT DOCUMENTS

2025/0274098 A1 *   8/2025   Nakamura ............. H03H 9/132
2025/0317118 A1 *   10/2025  Nakamura ......... H03H 9/02858

FOREIGN PATENT DOCUMENTS

JP        2020155968  A  *  9/2020
WO     WO-2011108229  A1 *  9/2011  .......... H03H 9/1457
WO        2018/003296  A1     1/2018

* cited by examiner

FIG. 19
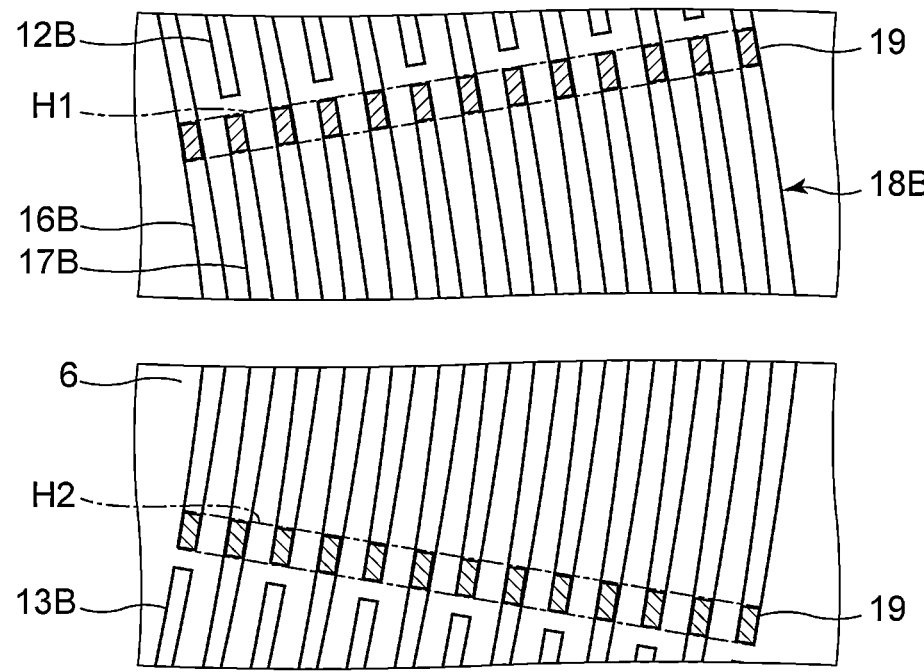
FIG. 20A
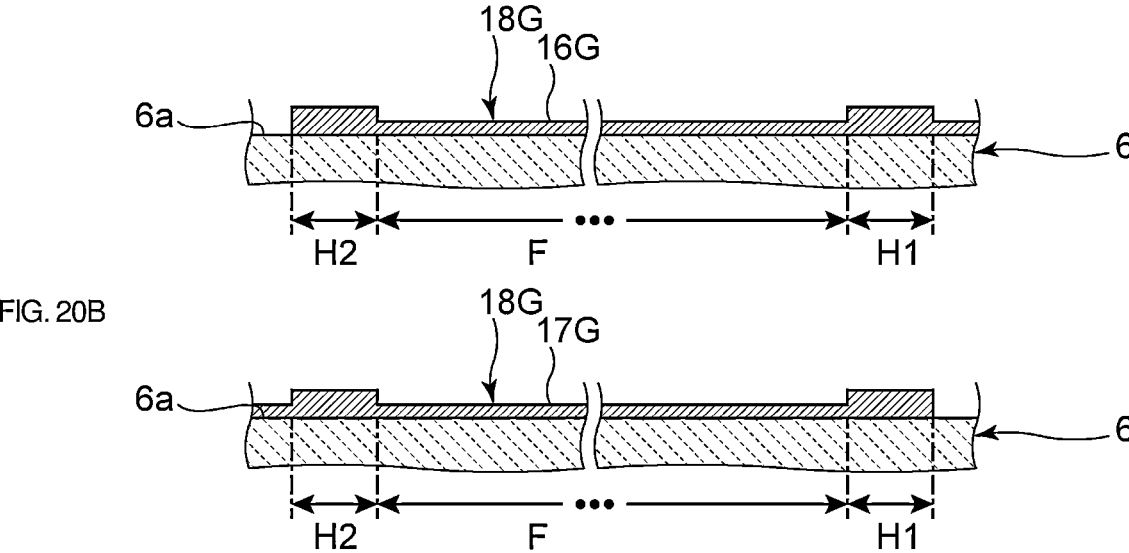
FIG. 20B

FILTER DEVICE AND MULTIPLEXER

CROSS REFERENCE TO RELATED APPLICATIONS

This application claims the benefit of priority to Japanese Patent Application No. 2023-118305, filed on Jul. 20, 2023. The entire contents of this application are hereby incorporated herein by reference.

BACKGROUND OF THE PRESENT INVENTION

1. Field of the Invention

The present invention relates to a filter device including a plurality of acoustic wave resonators, and a multiplexer.

2. Description of the Related Art

In the related art, a filter including the plurality of acoustic wave resonators is widely used in, for example, mobile phones. International Publication No. 2018/003296 discloses an example of a quadplexer as the multiplexer. The quadplexer has a transmission filter and a reception filter of Band 1 and a transmission filter and a reception filter of Band 3. Each filter 1s connected in common to a common terminal. The common terminal is a terminal on an antenna side. Each filter includes a plurality of resonators. All of the resonators include an interdigital transducer (IDT) electrode. When filters of a plurality of communication bands are connected in common to a terminal connected to an antenna, unwanted waves generated in a resonator close to the terminal affect filter characteristics of the other filters in many cases. For example, when a Rayleigh wave is generated in a resonator of a reception filter of Band 1, a frequency of the Rayleigh wave is located in a pass band of a transmission filter of Band 3. Therefore, in the transmission filter of Band 3 in the quadplexer described in International Publication No. 2018/003296, the insertion loss tends to increase due to the Rayleigh waves generated in the resonator of the reception filter of Band 1.

SUMMARY OF THE INVENTION

Example embodiments of the present invention provide filter devices which are each able to reduce or prevent an influence of unwanted waves when used in a multiplexer, and multiplexers which are each able to reduce or prevent an influence of unwanted waves.

According to the present invention, a filter device includes a first signal terminal and a second signal terminal, and a plurality of resonators including a plurality of series arm resonators and a plurality of parallel arm resonators. At least one of the plurality of series arm resonators and the plurality of parallel arm resonators is an excitation angle change resonator. The excitation angle change resonator includes a piezoelectric substrate including a piezoelectric body layer, and an interdigital transducer (IDT) electrode including a plurality of electrode fingers provided on the piezoelectric substrate. The piezoelectric body layer includes a propagation axis. The plurality of electrode fingers are curved. An excitation direction of an acoustic wave in a portion of an electrode finger in the plurality of electrode fingers is one of a first direction perpendicular or substantially perpendicular to an extending direction of the electrode finger, a second direction connecting a shortest distance between the electrode finger and an electrode finger adjacent to the electrode finger, and a third direction of an electric field vector generated between the electrode finger and the electrode finger adjacent to the electrode finger. When an angle between the excitation direction and an extending direction of the propagation axis is defined as an excitation angle, the excitation angle is not uniform in the IDT electrode of the excitation angle change resonator. When a set of the series arm resonator and the parallel arm resonator which are adjacent to each other is defined as one ladder portion, a plurality of the ladder portions are provided between the first signal terminal and the second signal terminal. At least one of the series arm resonator and the parallel arm resonator is a mutually different resonator in the adjacent ladder portions. When half of the ladder portions located on a first signal terminal side in all of the ladder portions are defined as front half ladder portions, and the resonators in the plurality of resonators, from the resonator located closest to the first signal terminal side to the series arm resonator and the parallel arm resonator of the ladder portion located closest to a second signal terminal side in the front half ladder portions are defined as front half resonators, at least one of the front half resonators is the excitation angle change resonator.

According to an example embodiments of the present invention, a multiplexer includes a common connection terminal and a plurality of filters including a first filter and a second filter which are connected in common to the common connection terminal. At least the first filter in the plurality of filters is a filter device according to an example embodiment of the present invention.

According to example embodiments of the present invention, it is possible to provide filter devices which are each able to reduce or prevent an influence of unwanted waves when used in the multiplexer, and multiplexers which are each able to reduce or prevent an influence of unwanted waves.

The above and other elements, features, steps, characteristics and advantages of the present invention will become more apparent from the following detailed description of the example embodiments with reference to the attached drawings.

BRIEF DESCRIPTION OF THE DRAWINGS

FIG. 19 is a schematic plan view showing a vicinity of a first edge region and a second edge region in the excitation angle change resonator of the first filter in a tenth modified example of the first example embodiment of the present invention.

FIG. 20A is a schematic cross-sectional view showing a cross section along an extending direction of a first electrode finger in the vicinity of a first edge region, a second edge region, and a central region of the first electrode finger in an eleventh modified example of the first example embodiment of the present invention; FIG. 20B is a schematic cross-sectional view showing a cross section along an extending direction of a second electrode finger in the vicinity of the first edge region, the second edge region, and the central region of the second electrode finger in the eleventh modified example of the first example embodiment of the present invention.

DETAILED DESCRIPTION OF THE EXAMPLE EMBODIMENTS

Hereinafter, the present invention will be clearly understood by describing example embodiments of the present invention with reference to the drawings.

Each example embodiment described in the present specification is merely an example, and configurations can be partially replaced or combined with each other between different example embodiments.

Figure 1:
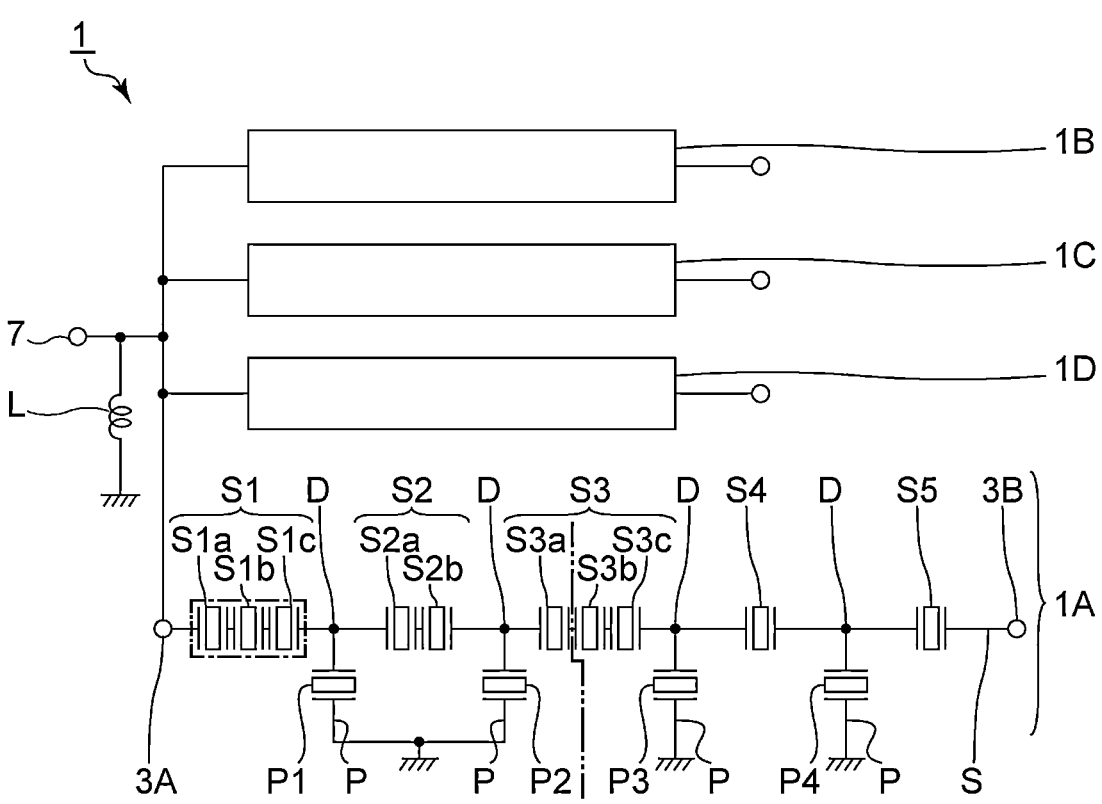
FIG. 1 is a schematic circuit diagram of a multiplexer according to a first example embodiment of the present invention.

FIG. 1 is a schematic circuit diagram of a multiplexer according to a first example embodiment of the present invention. In FIG. 1, second to fourth filters (to be described later) are shown by a block diagram.

As shown in FIG. 1, a multiplexer 1 of the present example embodiment is preferably a quadplexer, for example. The multiplexer 1 includes a first filter 1A, a second filter 1B, a third filter 1C, and a fourth filter 1D. The first filter 1A is a filter device according to an example embodiment of the present invention.

The multiplexer 1 is not limited to the quadplexer. The multiplexer 1 may include at least the first filter 1A and the second filter 1B. For example, the multiplexer 1 may be a multiplexer including two or more filters, such as a duplexer, a triplexer, and a quintplexer.

Each filter of the multiplexer 1 is a bandpass filter. Therefore, each filter has a pass band. More specifically, communication bands of the multiplexer 1 are Band 1 and Band 3.

The first filter 1A is a reception filter of Band 1. The pass band of the first filter 1A is, for example, about 2,110 MHz to about 2,170 MHz. The second filter 1B is a transmission filter of Band 3. The pass band of the second filter 1B is, for example, about 1,710 MHz to about 1,785 MHz. The third filter 1C is a reception filter of Band 3. The pass band of the third filter 1C is, for example, about 1,805 MHz to about 1,880 MHz. The fourth filter 1D is a transmission filter of Band 1. The pass band of the fourth filter 1D is, for example, about 1,920 MHz to about 1,980 MHz. However, the communication band of the multiplexer 1 is not limited to the above-described example and any other desirable communication band could be used instead.

The multiplexer 1 includes a common connection terminal 7. The first filter 1A, the second filter 1B, the third filter 1C, and the fourth filter 1D are connected in common to the common connection terminal 7. In the present example embodiment, the common connection terminal 7 is an antenna terminal. The antenna terminal is connected to an antenna. For example, the common connection terminal 7 may be formed as wiring, or may be formed as an electrode pad.

An inductor L is connected between the common connection terminal 7 and a ground potential. The inductor L is an inductor to perform impedance adjustment. The inductor L is not necessarily needed and may be omitted if so desired.

The first filter 1A includes a first signal terminal 3A, a second signal terminal 3B, a plurality of ground terminals, and a plurality of resonators. The first signal terminal 3A is an input terminal of the first filter 1A. The second signal terminal 3B is an output terminal of the first filter 1A. The ground terminal is a terminal connected to the ground potential. The plurality of resonators are a plurality of series arm resonators and a plurality of parallel arm resonators. The first filter 1A is a ladder filter.

In the first signal terminal 3A and the second signal terminal 3B, the first signal terminal 3A is located on the common connection terminal 7 side. The first signal terminal 3A is electrically coupled to the common connection terminal 7 by wiring. Therefore, in the first filter 1A, the first signal terminal 3A is an antenna terminal.

In the present example embodiment, all of the series arm resonators and all of the parallel arm resonators in the first filter 1A are acoustic wave resonators. All of the acoustic wave resonators of the first filter 1A includes an IDT electrode.

In a circuit configuration of the first filter 1A, a series arm S, a plurality of parallel arms P, and a plurality of nodes D are provided. The series arm S is a path connecting the first signal terminal 3A defining and functioning as an input terminal and the second signal terminal 3B defining and functioning as an output terminal. The series arm S is provided with each series arm resonator. On the other hand, each parallel arm P is a path that branches from the series arm S to each ground terminal. Each parallel arm P is provided with each parallel arm resonator. On the other hand, the node D is a connection point between the series arm S and the parallel arm P.

The first filter 1A includes a plurality of series arm resonator assemblies. The series arm resonator assembly is one series arm resonator or a group of a plurality of series arm resonators connected to each other in series or in parallel without using the node D. More specifically, the series arm resonator assembly is a portion provided with one or more series arm resonators between the input terminal and the node D, between the nodes D, or between the node D and the output terminal. In the first filter 1A, the input terminal is the first signal terminal 3A as described above. The output terminal is the second signal terminal 3B. For example, the series arm resonator assembly may be a portion including a plurality of divided series arm resonators.

Specifically, the plurality of series arm resonator assemblies of the first filter 1A include a series arm resonator assembly S1, a series arm resonator assembly S2, a series arm resonator assembly S3, a series arm resonator assembly S4, and a series arm resonator assembly S5. In the present example embodiment, the series arm resonator assembly S1 preferably includes a plurality of series arm resonators divided in series. That is, in the series arm resonator assembly S1, the plurality of divided series arm resonators are connected to each other in series. Similarly, the series arm resonator assembly S2 and the series arm resonator assembly S3 include the plurality of series arm resonators divided in series. On the other hand, each of the series arm resonator assembly S4 and the series arm resonator assembly S5 includes one series arm resonator.

When the series arm resonator assembly includes the plurality of series arm resonators, the plurality of series arm resonators do not need to be series arm resonators divided in series. A relationship of structural parameters between the plurality of series arm resonators of the series arm resonator assembly is not particularly limited. The plurality of series arm resonators of the series arm resonator assembly may be connected to each other in series, or may be connected to each other in parallel.

The plurality of series arm resonator assemblies are connected to each other in series between the first signal terminal 3A and the second signal terminal 3B. More specifically, the series arm resonator assembly S1, the series arm resonator assembly S2, the series arm resonator assembly S3, the series arm resonator assembly S4, and the series arm resonator assembly S5 are connected in this order from the first signal terminal 3A side.

Each of the series arm resonator assembly S1 and the series arm resonator assembly S3 includes three divided series arm resonators. The series arm resonator assembly S2 includes two divided series arm resonators. More specifically, the series arm resonator assembly S1 includes a series arm resonator S1a, a series arm resonator S1b, and a series arm resonator S1c. The series arm resonator assembly S2 includes a series arm resonator S2a and a series arm resonator S2b. The series arm resonator assembly S3 includes a series arm resonator S3a, a series arm resonator S3b, and a series arm resonator S3c.

In the present example embodiment, only one node D is located between the series arm resonator assemblies. For example, the plurality of nodes D may be located between the series arm resonator assemblies. When each of a portion between the first signal terminal 3A and the series arm resonator assembly, a portion between the second signal terminal 3B and the series arm resonator assembly, and a portion between the adjacent series arm resonator assemblies is defined as a section, at least one node D may be located in each section between at least the adjacent series arm resonator assemblies.

The first filter 1A includes a plurality of parallel arm resonator assemblies. Specifically, one parallel arm resonator assembly is a parallel arm resonator located in a parallel arm connected to the node D located in the same section. For example, as in the present example embodiment, when only one node D and only one parallel arm P are located in the same section, the parallel arm resonator assembly is one parallel arm resonator, or a group of a plurality of parallel arm resonators connected to each other in series or in parallel in the parallel arm P. On the other hand, for example, when the plurality of nodes D and the plurality of parallel arms P are located in the same section, the plurality of parallel arm resonators located in the plurality of parallel arms P are included in one parallel arm resonator assembly.

When only one node D and only one parallel arm P are located in the same section, for example, the parallel arm resonator assembly may be a portion including a plurality of divided parallel arm resonators. Hereinafter, the series arm resonator assembly and the parallel arm resonator assembly may be collectively and simply referred to as a resonator assembly.

Specifically, the plurality of parallel arm resonator assemblies of the first filter 1A are a parallel arm resonator assembly P1, a parallel arm resonator assembly P2, a parallel arm resonator assembly P3, and a parallel arm resonator assembly P4. In the present example embodiment, all of the parallel arm resonator assemblies of the first filter 1A include one parallel arm resonator.

The parallel arm resonator assembly P1 is connected between the node D between the series arm resonator assembly S1 and the series arm resonator assembly S2 and the ground potential. The parallel arm resonator assembly P2 is connected between the node D between the series arm resonator assembly S2 and the series arm resonator assembly S3 and the ground potential. The parallel arm resonator assembly P3 is connected between the node D between the series arm resonator assembly S3 and the series arm resonator assembly S4 and the ground potential. The parallel arm resonator assembly P4 is connected between the node D between the series arm resonator assembly S4 and the series arm resonator assembly S5 and the ground potential.

Figure 2:
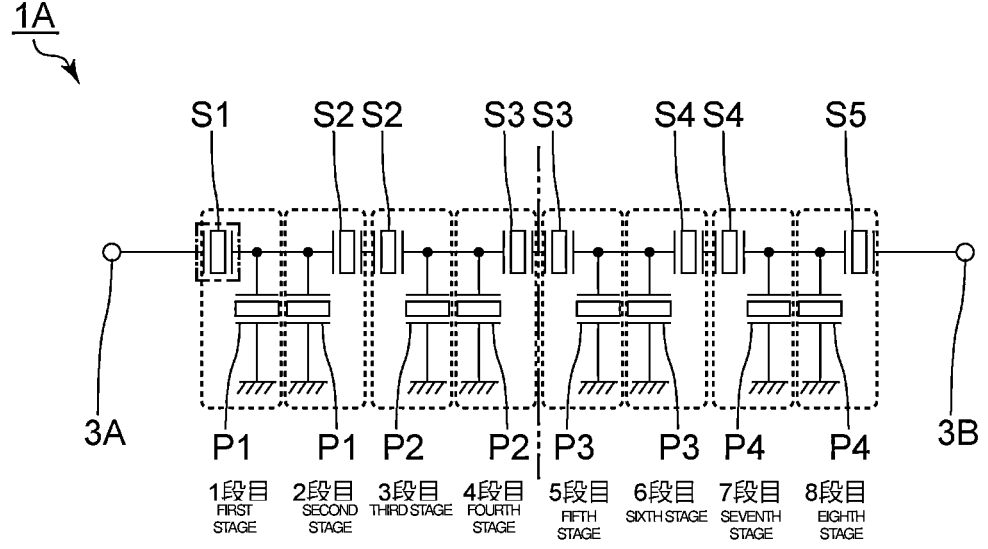
FIG. 2 is a circuit diagram describing a ladder portion of a first filter in the first example embodiment of the present invention.

FIG. 2 is a circuit diagram describing a ladder portion of the first filter in the first example embodiment. In FIG. 2, in order to describe the ladder portion (to be described later), for convenience, one series arm resonator assembly is indicated by reference numerals of one or two resonators. Similarly, for convenience, one parallel arm and a parallel arm resonator assembly located in the parallel arm are indicated by reference numerals of two parallel arms and two resonators.

Hereinafter, as shown by a broken line in FIG. 2, a set of the series arm resonators and the parallel arm resonators which are adjacent to each other is defined as the ladder portions in one stage. In the first filter 1A, a plurality of the ladder portions are provided between the first signal terminal 3A and the second signal terminal 3B. Specifically, the ladder portions in eight stages are formed. The ladder portions in first to eighth stages are aligned in order from the first signal terminal 3A side to the second signal terminal 3B side.

The ladder portion in the first stage is preferably defined by the series arm resonator S1c and the parallel arm resonator of the parallel arm resonator assembly P1 which are shown in FIG. 1. The ladder portion in the second stage which is adjacent to the ladder portion is preferably by the parallel arm resonator of the parallel arm resonator assembly P1 and the series arm resonator S2a. In the adjacent ladder portions, the series arm resonators are different from each other, and the parallel arm resonators are common to each other.

However, the present invention is not limited thereto. For example, the ladder portion in the third stage shown in FIG. 2 is defined by the series arm resonator S2b and the parallel arm resonator of the parallel arm resonator assembly P2 which are shown in FIG. 1. Therefore, in the ladder portion in the second stage and the ladder portion in the third stage which are adjacent to each other, the series arm resonators are different from each other, and the parallel arm resonators are different from each other.

Alternatively, for example, the ladder portion in the sixth stage shown in FIG. 2 is defined by the parallel arm resonator of the parallel arm resonator assembly P3 and the series arm resonator of the series arm resonator assembly S4. The ladder portion in the seventh stage is defined by the series arm resonator of the series arm resonator assembly S4 and the parallel arm resonator of the parallel arm resonator assembly P4. Therefore, in the ladder portion in the sixth stage and the ladder portion in the seventh stage which are adjacent to each other, the parallel arm resonators are different from each other, and the series arm resonators are common to each other. In this way, in the adjacent ladder portions, at least one of the series arm resonator and the parallel arm resonator may be a mutually different resonator.

Here, in all of the ladder portions, half ladder portions located on the first signal terminal 3A side are defined as front half ladder portions. In the plurality of resonators, the resonators form the resonator located closest to the first signal terminal 3A side to the series arm resonator and the parallel arm resonator of the ladder portion located closest to the second signal terminal 3B side in the front half ladder portions are defined as front half resonators. In the present example embodiment, the front half ladder portions are the ladder portion in a first stage to the ladder portion in a fourth stage. The front half resonators include a series arm resonator S1a, a series arm resonator S1b, a series arm resonator S1c, a parallel arm resonator, a series arm resonator S2a, and a series arm resonator S2b of a parallel arm resonator assembly P1, and a parallel arm resonator and a series arm resonator S3a of a parallel arm resonator assembly P2.

As described above, all of the plurality of series arm resonators and the plurality of parallel arm resonators of the first filter 1A are acoustic wave resonators. As will be described in detail later, the acoustic wave resonators include an excitation angle change resonator and an acoustic wave resonator other than the excitation angle change resonator. In FIG. 1, the resonator surrounded by a one-dot chain line is the excitation angle change resonator. The same applies to other schematic circuit diagrams or circuit diagrams.

Characteristics of the present example embodiment show that at least one of the front half resonators is the excitation angle change resonator. Specifically, in the present example embodiment, each series arm resonator of the series arm resonator assembly S1 is the excitation angle change resonator. The excitation angle change resonator is a resonator whose excitation angle is changed in an intersection region. In this manner, influence of unwanted waves can be reduced or prevented in the multiplexer 1. Hereinafter, details of the above-described advantageous effect will be described below along with configurations of the present example embodiment and details of the excitation angle and the excitation angle change resonator.

Figure 3:
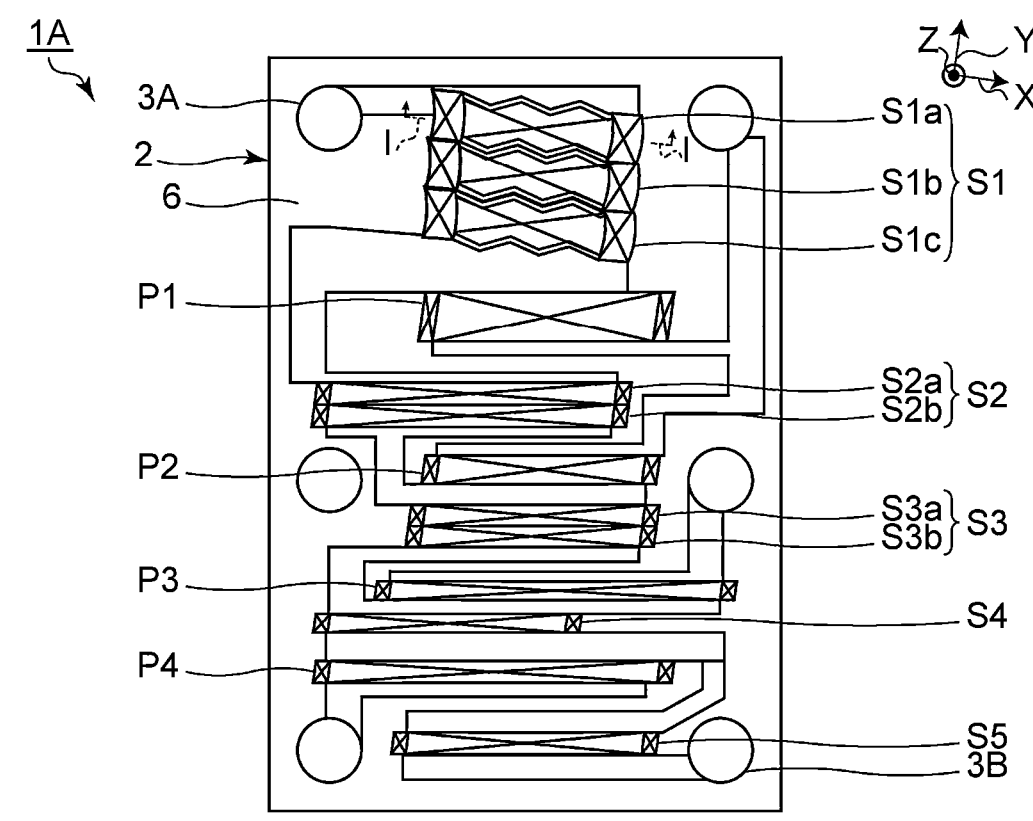
FIG. 3 is a schematic plan view of the first filter in the first example embodiment of the present invention.
Figure 4:
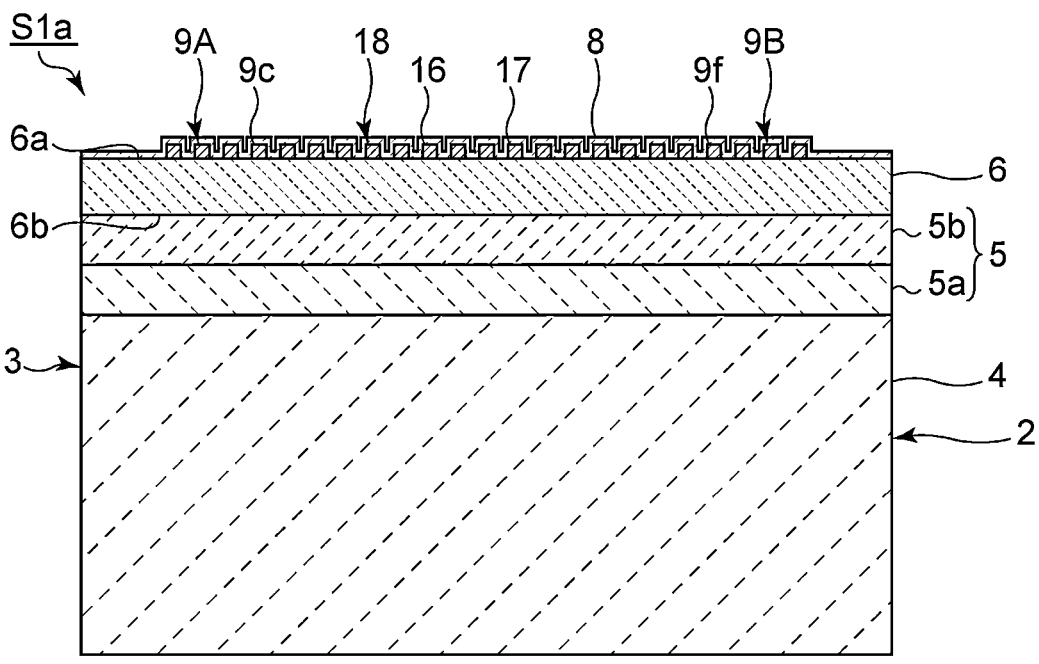
FIG. 4 is a schematic cross-sectional view taken along line I-I in FIG. 3.
Figure 5:
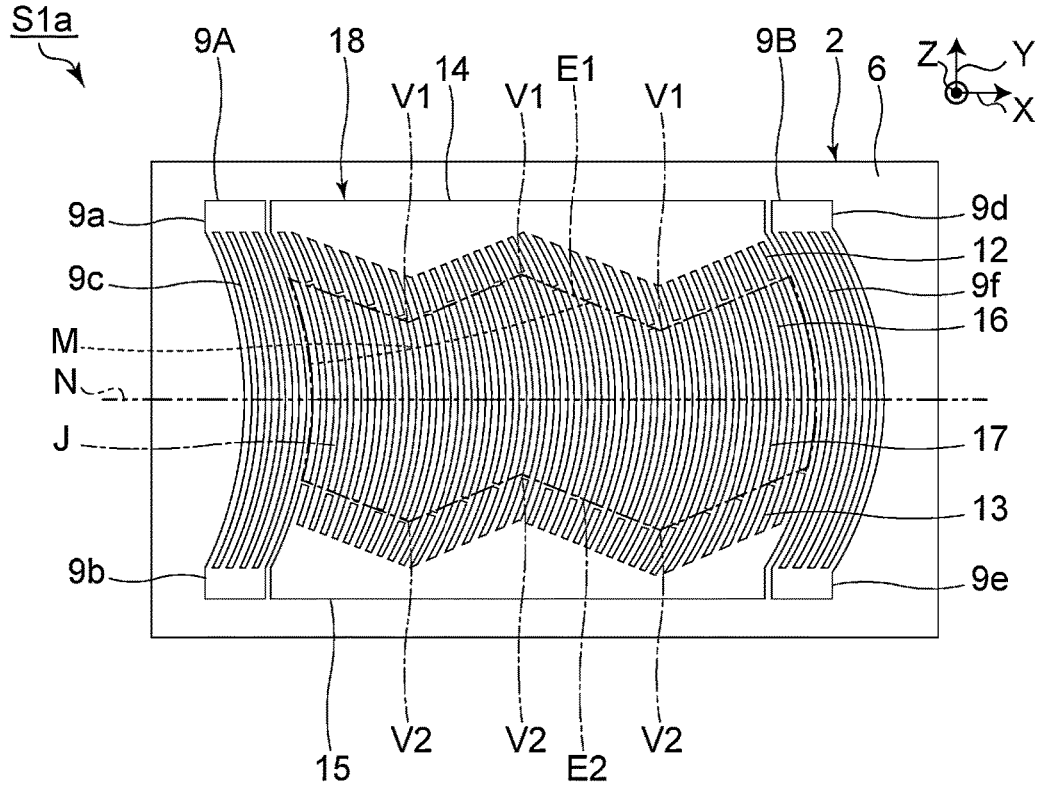
FIG. 5 is a schematic plan view of an excitation angle change resonator of the first filter in the first example embodiment of the present invention.

FIG. 3 is a schematic plan view of the first filter according to the first example embodiment. FIG. 4 is a schematic cross-sectional view taken along line I-I in FIG. 3. FIG. 5 is a schematic plan view of the excitation angle change resonator of the first filter in the first example embodiment. In FIG. 3, an IDT electrode and a reflector (to be described later) are shown by a schematic view in which two diagonal lines are added to a figure including a curve or a rectangle. The same applies to other schematic plan views. A dielectric film (to be described later) is omitted in FIGS. 3 and 5. The same applies to other plan views.

As shown in FIG. 3, the first filter 1A includes a piezoelectric substrate 2. The piezoelectric substrate 2 is preferably a laminated substrate including a piezoelectric body layer 6. That is, the piezoelectric substrate 2 is a substrate having piezoelectricity. All of the acoustic wave resonators in the first filter 1A share the piezoelectric substrate 2. Each of the acoustic wave resonators includes an IDT electrode. The IDT electrode of each acoustic wave resonator is provided on the piezoelectric substrate 2.

As shown in FIG. 4, the piezoelectric substrate 2 includes a support portion 3 and the piezoelectric body layer 6. More specifically, the support portion 3 preferably includes a support substrate 4 and an intermediate layer 5. The intermediate layer 5 includes a first layer 5a and a second layer 5b. The first layer 5a is provided on the support substrate 4. The second layer 5b is provided on the first layer 5a. The piezoelectric body layer 6 is provided on the second layer 5b. A layer configuration of the piezoelectric substrate 2 is not limited to the above-described example. For example, the intermediate layer 5 may be a single layer dielectric film. Alternatively, the piezoelectric substrate 2 may be a substrate including only the piezoelectric body layer 6.

In the present example embodiment, silicon is preferably used as a material of the support substrate 4. Silicon nitride is used as a material of the first layer 5a. Silicon oxide is used as a material of the second layer 5b. Rotational Y-cut X-propagation lithium tantalate is used as a material of the piezoelectric body layer 6. In this way, the piezoelectric body layer 6 has a propagation axis. A direction of the propagation axis is an X-direction. However, the material of each layer of the piezoelectric substrate 2 is not limited to the above-described example.

The piezoelectric body layer 6 includes a first main surface 6a and a second main surface 6b. The first main surface 6a and the second main surface 6b oppose each other. The second main surface 6b in the first main surface 6a and the second main surface 6b is located on the support substrate 4 side. An IDT electrode 18 of the series arm resonator S1a is provided on the first main surface 6a of the piezoelectric body layer 6. The IDT electrode of each of the acoustic wave resonators other than the series arm resonator S1a are similarly provided on the first main surface 6a.

As shown in FIG. 5, the IDT electrode 18 of the series arm resonator S1a which is the excitation angle change resonator includes a pair of busbars. Specifically, the pair of busbars are a first busbar 14 and a second busbar 15. The first busbar 14 and the second busbar 15 oppose each other. The IDT electrode 18 includes a plurality of electrode fingers. Specifically, the plurality of electrode fingers are a plurality of first electrode fingers 16 and a plurality of second electrode fingers 17. Each one end of the plurality of first electrode fingers 16 is connected to the first busbar 14. Each one end of the plurality of second electrode fingers 17 is connected to the second busbar 15.

Each of the plurality of first electrode fingers 16 and the plurality of second electrode fingers 17 includes a base end portion, a tip portion, and a pair of end edge portions. Specifically, the base end portion of the first electrode finger 16 is a portion connected to the first busbar 14. The pair of end edge portions of the first electrode finger 16 are portions connecting the base end portion and the tip portion. The base end portion of the second electrode finger 17 is a portion connected to the second busbar 15. The pair of end edge portions of the second electrode finger 17 are portions connecting the base end portion and the tip portion in a plan view. The plurality of first electrode fingers 16 and the plurality of second electrode fingers 17 interdigitate with each other. In the present specification, a plan view means a view when viewed a direction corresponding to an upper side in FIG. 4. In FIG. 4, for example, the piezoelectric body layer 6 side on the support substrate 4 side and the piezoelectric body layer 6 side is the upper side.

Each tip portion of the plurality of first electrode fingers 16 and the plurality of second electrode fingers 17 includes a tip. A virtual line formed by connecting the tips of the plurality of second electrode fingers 17 is defined as a first envelope curve E1. Similarly, a virtual line formed by connecting the tips of the plurality of first electrode fingers 16 is defined as a second envelope curve E2. Hereinafter, the first electrode finger 16 and the second electrode finger 17 may be simply referred to as an electrode finger. The first busbar 14 and the second busbar 15 may be simply described as a busbar.

A region between the first envelope curve E1 and the second envelope curve E2 is an intersection region J. More specifically, a region surrounded by an end edge portion of the electrode finger in one end in an alignment direction of the plurality of electrode fingers, an end edge portion of the electrode finger in the other end in the plurality of electrode fingers, the first envelope curve E1, and the second envelope curve E2 is the intersection region J. Therefore, the first envelope curve E1 corresponds to an end edge portion of the intersection region J on the first busbar 14 side. The second envelope curve E2 corresponds to an end edge portion of the intersection region J on the second busbar 15 side. In the intersection region J, the adjacent electrode fingers overlap each other when viewed in an extending direction of the first envelope curve E1 or the second envelope curve E2.

In the present example embodiment, the intersection region J is formed to include one curve region. The curve region is a region where each shape of the plurality of first electrode fingers 16 and the plurality of second electrode fingers 17 in a plan view is a curve shape. One end edge of the curve region forming the intersection region J is the first envelope curve E1. The other end edge is the second envelope curve E2. In the series arm resonator S1a which is the excitation angle change resonator, the plurality of electrode fingers may be curved. For example, the shape of the plurality of electrode fingers in a plan view may be a shape curved in a plurality of nodes.

The acoustic wave is excited by applying an AC voltage to the IDT electrode 18. Specifically, for example, an SH mode is excited as a main mode. In this case, Rayleigh waves become unwanted waves. However, the main mode is not limited to the SH mode.

The intersection region J of the IDT electrode 18 is the curve region. The shape of each electrode finger in a plan view in the curve region is the curve shape. Therefore, an excitation direction of the acoustic wave is not uniform in the curve region of the IDT electrode 18.

Specifically, in the curve region, the excitation direction of the acoustic wave in a portion of an electrode finger in the plurality of first electrode fingers 16 and the plurality of second electrode fingers 17 is one of following first to third directions. The first direction is a direction perpendicular to an extending direction of the electrode finger. The second direction is a direction connecting a shortest distance between the electrode finger and the first electrode finger 16 or the second electrode finger 17 adjacent to the electrode finger. The third direction is a vector direction of an electric field generated between the electrode finger and the first electrode finger 16 or the second electrode finger 17 adjacent to the electrode finger.

The shape of each electrode finger in the curve region is a curve shape. Therefore, the extending direction of one electrode finger differs depending on each position. In the present specification, unless otherwise specified, the extending direction of the electrode fingers having the curve shape is as follows.

First, a pair of end edge portions of each electrode finger have a curve shape. When a virtual line parallel to the extending direction of the propagation axis is drawn to connect both end edge portions in a portion of the electrode finger, the center of gravity of the portion located on the virtual line is defined as a representative point in the virtual line. Innumerable virtual lines can be drawn in the electrode finger, and there exist innumerable representative points. The extending direction of a tangent line of a curve connecting the representative points is defined as the extending direction of the electrode finger.

An angle between the excitation direction of the acoustic wave and the extending direction of the propagation axis of the piezoelectric body layer 6 is defined as an excitation angle $\theta_{C\_prop}$. The excitation angle change resonator in the present invention is a resonator in which the excitation angle $\theta_{C\_prop}$ is changed in the intersection region J. In other words, the excitation angle $\theta_{C\_prop}$ is not uniform in the intersection region J of the excitation angle change resonator.

In the present example embodiment, the extending direction of the propagation axis is parallel to the extending direction of a two-dot chain line N in FIG. 5. In a portion indicated by the two-dot chain line N, the excitation angle $\theta_{C\_prop}$ is about 0°. A portion where the excitation angle $\theta_{C\_prop}$ is about 0° is linearly aligned. On the other hand, as shown by a curve M in FIG. 5, in the present example embodiment, when portions where the excitation angle $\theta_{C\_prop}$ is other than 0° and the excitation angle $\theta_{C\_prop}$ is the same are connected, the portion has a curve shape. The curve M in FIG. 5 is an example of a portion where the excitation angle $\theta_{C\_prop}$ is other than 0° and the excitation angle $\theta_{C\_prop}$ is the same or substantially the same. In the curve region, there exist innumerable curves similar to the curve M. In this way, the shape of the plurality of first electrode fingers 16 and the plurality of second electrode fingers 17 in a plan view is a shape in which portions where the excitation angle $\theta_{C\_prop}$ is other than 0° and the same portion are aligned in a curve shape.

In the present specification, a positive direction of the excitation angle $\theta_{C\_prop}$ is defined as a counterclockwise direction when viewed in a plan view. More specifically, a direction from the second busbar 15 side toward the first busbar 14 side is the positive direction. Hereinafter, unless otherwise specified, a direction in which the electrode finger is curved to protrude is defined as an outer direction. For example, a right direction in FIG. 5 is the outer direction of the IDT electrode 18. A direction opposite to the outer direction is an inner direction. For example, a left direction in FIG. 5 is the inner direction of the IDT electrode 18.

In the IDT electrode 18 of the present example embodiment, an electrode finger pitch and a duty ratio are constant in the portion where the excitation angle $\theta_{C\_prop}$ is the same or substantially the same. The electrode finger pitch is a distance between centers of the first electrode finger 16 and the second electrode finger 17 which are adjacent to each other. When a wavelength defined by the electrode finger pitch of the IDT electrode 18 is A and the electrode finger pitch is p, $\lambda=2p$ is satisfied.

The first envelope curve E1 in the series arm resonator S1a includes a plurality of portions inclined with respect to the propagation axis. The first envelope curve E1 has a plurality of bending portions V1. More specifically, the bending portion is a portion where the extending direction of the envelope curve is changed. In the present example embodiment, the shape of the first envelope curve E1 is a wavy shape in which adjacent bending portions V1 are linearly connected. The shape of the first envelope curve E1 may be a wavy shape in which the adjacent bending portions V1 are connected by a curve.

Similarly, the second envelope curve E2 includes a plurality of portions inclined with respect to the propagation axis. The second envelope curve E2 includes a plurality of bending portions V2. The shape of the second envelope curve E2 is a wavy shape in which the adjacent bending portions V2 are linearly connected. The shape of the second envelope curve E2 may be a wavy shape in which the adjacent bending portions V2 are connected by a curve.

As described above, in the present example embodiment, both of the first envelope curve E1 and the second envelope curve E2 include the plurality of bending portions. However, at least one of the first envelope curve E1 and the second envelope curve E2 may include at least one bending portion.

The IDT electrode 18 includes a plurality of segments when the electrode finger passing through the bending portion V1 of the first envelope curve E1 is set as a boundary. The plurality of segments are aligned in the extending direction of the propagation axis. In FIG. 5, four segments are schematically shown.

The excitation angle $\theta_{C\_prop}$ in an end portion of the first envelope curve E1 or a portion located in the bending portion V1 is defined as an excitation angle $\theta_{C\_AP1\_m}$ on the first envelope curve. m is a natural number. The excitation angle $\theta_{C\_AP1\_m}$ on the first envelope curve can be defined for the end portion of the first envelope curve E1 or each of the bending portions V1. Specifically, m in the excitation angle $\theta_{C\_AP1\_m}$ on the first envelope curve is sequentially set to 1, 2, 3, and so on from the end portion and the bending portion V1 on the inner side of the IDT electrode 18. In this way, a numerical value of m is smaller in the excitation angle $\theta_{C\_AP1\_m}$ on the first envelope curve of the portion located on the inner side. For example, the excitation angle $\theta_{C\_prop}$ of the portion located in the end portion on the inner side is an excitation angle $\theta_{C\_AP1\_1}$ on the first envelope curve. The excitation angle $\theta_{C\_prop}$ in the innermost bending portion V1 is an excitation angle $\theta_{C\_AP1\_2}$ on the first envelope curve.

Similarly, an excitation angle $\theta_{C\_prop}$ of the end portion of the second envelope curve E2 or the portion located in the bending portion V2 is defined as an excitation angle $\theta_{C\_AP2\_m}$ on the second envelope curve. A numerical value of m is smaller in the excitation angle $\theta_{C\_AP2\_m}$ on the second envelope curve of the portion located on the inner side.

Figure 6:
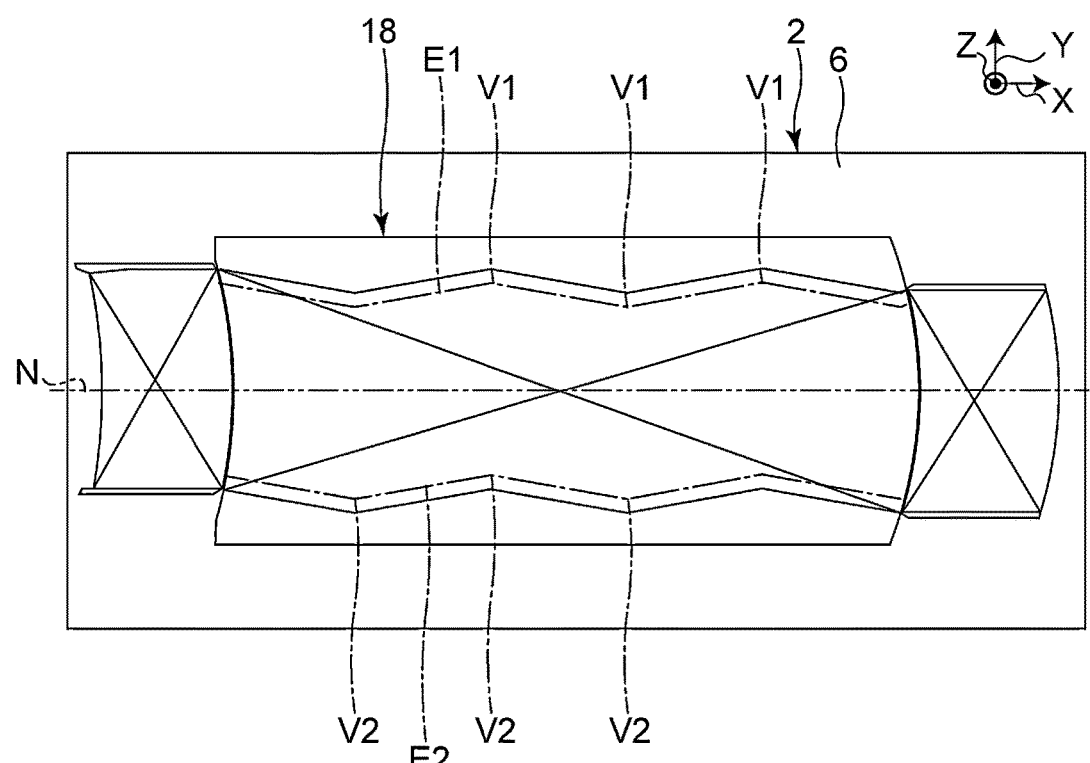
FIG. 6 is a schematic plan view of the first filter in the first example embodiment of the present invention.

As described above, in FIG. 5, four segments are schematically shown. However, the IDT electrode 18 includes five segments. Here, the five segments in the IDT electrode 18 are schematically shown in FIG. 6. In the present example embodiment, m is a numerical value of 1 or greater and 6 or smaller.

As shown in FIG. 5, the IDT electrode 18 includes a plurality of offset electrodes. Specifically, the plurality of offset electrodes are a plurality of first offset electrodes 12 and a plurality of second offset electrodes 13. Each one end of the plurality of first offset electrodes 12 is connected to the first busbar 14. The first electrode finger 16 and the first offset electrode 12 are alternately aligned. Each one end of the plurality of second offset electrodes 13 is connected to the second busbar 15. The second electrode finger 17 and the second offset electrode 13 are alternately aligned.

As in the plurality of first electrode fingers 16 and the plurality of second electrode fingers 17, each of the plurality of first offset electrodes 12 and the plurality of second offset electrodes 13 includes a base end portion and a tip portion. The base end portion of the first electrode finger 16 and the first offset electrode 12 is a portion connected to the first busbar 14. The base end portion of the second electrode finger 17 and the second offset electrode 13 is a portion connected to the second busbar 15. The tip portion of the first electrode finger 16 and the tip portion of the second offset electrode 13 oppose each other with a gap therebetween. The tip portion of the second electrode finger 17 and the tip portion of the first offset electrode 12 oppose each other with a gap therebetween.

The plurality of first offset electrodes 12 and the plurality of second offset electrodes 13 are not necessarily needed. Hereinafter, the first offset electrode 12 and the second offset electrode 13 may be simply described as an offset electrode. Each shape of the plurality of offset electrodes in a plan view includes a curve shape portion.

A pair of reflectors 9A and a reflector 9B are provided on the piezoelectric body layer 6. The reflector 9A and the reflector 9B oppose each other with the IDT electrode 18 interposed therebetween in an alignment direction of the plurality of electrode fingers of the IDT electrode 18.

The reflector 9A includes a pair of reflector busbars 9a and a reflector busbar 9b. The reflector busbar 9a and the reflector busbar 9b oppose each other. The reflector 9A includes a plurality of reflector electrode fingers 9c. Each one end of the plurality of reflector electrode fingers 9c is connected to the reflector busbar 9a. Each of the other ends of the plurality of reflector electrode fingers 9c is connected to the reflector busbar 9b. Each shape of the plurality of reflector electrode fingers 9c of the reflector 9A in a plan view includes a curve shape.

Similarly, the reflector 9B includes a pair of reflector busbars 9d and a reflector busbar 9e, and a plurality of reflector electrode fingers 9f. The IDT electrode 18, the reflector 9A, and the reflector 9B include a single layer metal film. Specifically, in the present example embodiment, for example, Al is used as materials of the IDT electrode 18, the reflector 9A, and the reflector 9B. The materials of the IDT electrode 18, the reflector 9A, and the reflector 9B are not limited to the above-described example. Alternatively, the IDT electrode 18, the reflector 9A, and the reflector 9B may include a laminated metal film.

In the piezoelectric body layer 6 of the first filter 1A, the extending direction of the propagation axis is an X-propagation direction. However, the present invention is not limited thereto. For example, the extending direction of the propagation axis may be a 90° X-propagation direction or may be a direction perpendicular or substantially perpendicular to one of the extending directions of the electrode fingers in the IDT electrode 18.

As shown in FIG. 4, a dielectric film 8 is provided on the piezoelectric body layer 6 to cover the IDT electrode 18. Since the IDT electrode 18 is protected by the dielectric film 8, the IDT electrode 18 is unlikely to be damaged. In the present example embodiment, for example, silicon oxide is provided as a material of the dielectric film 8. The material of the dielectric film 8 is not limited to the above-described example.

The dielectric film 8 also covers the IDT electrode of each of the acoustic wave resonators other than the series arm resonator S1a. In the present example embodiment, the thickness of the dielectric film 8 is constant. A configuration in which the dielectric film 8 is provided can also be adopted in forms of the present invention other than the present example embodiment. The dielectric film 8 is not necessarily needed.

As described above, in the first filter 1A, the series arm resonator S1a, the series arm resonator S1b, and the series arm resonator S1c of the series arm resonator assembly S1 shown in FIG. 1 are the excitation angle change resonators. The configuration of the series arm resonator S1a has been described with reference to FIGS. 5. However, the series arm resonator S1b and the series arm resonator S1c are also formed in the same or substantially the same manner as that in the series arm resonator S1a. In the present example embodiment, each of the series arm resonators of the series arm resonator assembly S1 is a resonator divided in series, and has the same design parameter. However, the design parameter may appropriately vary between the series arm resonators.

On the other hand, the resonator other than each of the series arm resonators of the series arm resonator assembly S1 is not the excitation angle change resonator. The configuration of the series arm resonator S2a will be described as an example.

Figure 7:
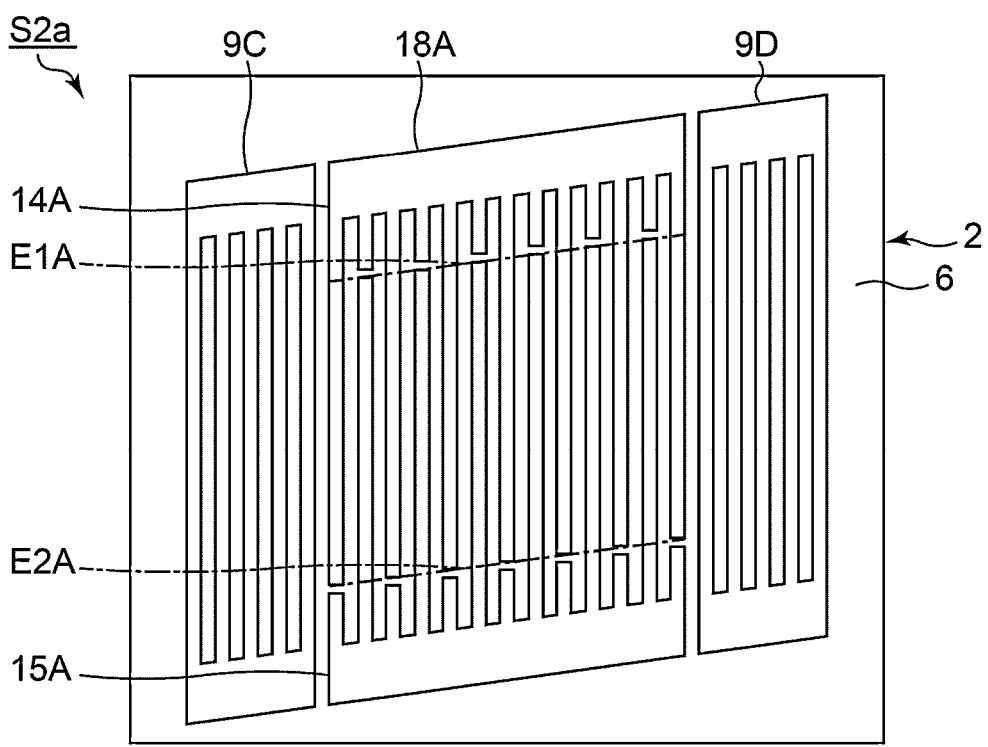
FIG. 7 is a schematic plan view of an acoustic wave resonator other than the excitation angle change resonator of the first filter in the first example embodiment of the present invention.

FIG. 7 is a schematic plan view of the acoustic wave resonator other than the excitation angle change resonator of the first filter in the first example embodiment.

In the series arm resonator S2a, the shape of each electrode finger of the IDT electrode 18A is preferably linear. Therefore, in the intersection region, the excitation angle $\theta_{C\_prop}$ is constant. Specifically, the excitation angle $\theta_{C\_prop}$ is about 0° in any portion of the intersection region. The first envelope curve E1A and the second envelope curve E2A of the IDT electrode 18A are inclined with respect to the propagation axis. The first busbar 14A and the second busbar 15A have a linear shape. In this way, the IDT electrode 18A is an inclined IDT electrode. The shape of the plurality of reflector electrode fingers in the reflector 9C and the reflector 9D of the series arm resonator S2*a* is linear.

In the present example embodiment, the acoustic wave resonator other than the excitation angle change resonator is formed in the same or substantially the same manner as that in the series arm resonator S2*a*. However, the design parameter is appropriately set in each of the acoustic wave resonators other than the excitation angle change resonator.

As described above, in the first filter 1A of the multiplexer 1, in the front half resonators, each of the series arm resonators of the series arm resonator assembly S1 shown in FIG. 1 is the excitation angle change resonator. In this manner, influence of unwanted waves can be reduced or prevented in the multiplexer 1. Details will be described below by comparing the present example embodiment and a first comparative example with each other.

The first comparative example is different from the first example embodiment in that all of the acoustic wave resonators are formed in the same manner as that in the acoustic wave resonator shown in FIG. 7. A circuit configuration of the multiplexer of the first comparative example is preferably the same as a circuit configuration of the first example embodiment. Attenuation frequency characteristics are compared between the second filter 1B in the first example embodiment and the second filter in the first comparative example. The attenuation frequency characteristic of each filter in the first example embodiment is shown together.

The design parameter of the excitation angle change resonator in the first example embodiment is as follows. Here, a dimension of the offset electrode along a connecting direction of the base end portion and the tip portion is defined as the length of the offset electrode. A dimension of a gap between the tip portion of the electrode finger and the tip portion of the offset electrode along a direction in which the electrode finger and the offset electrode oppose each other is defined as a gap length. In the present example embodiment, the gap length between the tip portion of the second electrode finger 17 and the tip portion of the first offset electrode 12 and the gap length between the tip portion of the first electrode finger 16 and the tip portion of the second offset electrode 13 are the same as each other.

Support Substrate 4: Material_S1, Surface Orientation_(100), $\psi$ at Euler Angles ($\varphi$, $\theta$, $\psi$) about 45°

First Layer 5a of Intermediate Layer 5: Material SiN, Thickness about 0.514$\lambda$ Second Layer 5b of Intermediate Layer 5: Material SiO$_2$, Thickness about 0.384$\lambda$ Piezoelectric Body Layer 6: Material Rotational Y-cut 50° X-propagation LiTaO$_3$, Thickness about 0.343$\lambda$ IDT Electrode 18: Material Al, Thickness about 0.05$\lambda$ Dielectric Film 8: Material_SiO$_2$, Thickness 0.02$\lambda$ Wavelength $\lambda$: about 1.7509 μm in the portion where the Excitation Angle $\theta_{C\_prop}$ is about 0°

Number of Pairs of Electrode Fingers of IDT Electrode 18: 100 pairs

Duty Ratio: about 0.5

Gap Length: about 0.135$\lambda$

Length of Offset Electrode: about 3.5$\lambda$ Distance in Direction Orthogonal to Propagation Axis between First Envelope Curve E1 and Second Envelope Curve E2: about 25$\lambda$ First Envelope curve E1: Absolute Value of Inclination Angle with respect to Propagation Axis about 20°, Number of Pairs of Electrode Fingers Between Bending Portions V1_20 Pairs Second Envelope Curve E2: Absolute Value of Inclination Angle with respect to Propagation Axis: about 20°, Number of Pairs of Electrode Fingers between Bending Portions V2: 20 pairs Excitation Angle on First Envelope Curve: $\theta_{C\_AP1\_1}$=about 12°, $\theta_{C\_AP1\_2}$=about 8°, $\theta_{C\_AP1\_3}$=about 16°, $\theta_{C\_AP1\_4}$=about 10°, $\theta_{C\_AP1\_5}$=about 10°, $\theta_{C\_AP1\_6}$=about 16°

Excitation Angle on Second Envelope Curve: $\theta_{C\_AP1\_1}$=about 9°, $\theta_{C\_AP1\_2}$=about 15°, $\theta_{C\_AP1\_3}$=about 8°, $\theta_{C\_AP1\_4}$=about 15.5°, $\theta_{C\_AP1\_5}$=about 10°, $\theta_{C\_AP1\_6}$=about 16°

Reflector 9A and Reflector 9B: Number of Pairs of Reflector Electrode Fingers 20 pairs In the first example embodiment and the first comparative example, the IDT electrode in the acoustic wave resonator other than the IDT electrode of the excitation angle change resonator is an inclined IDT electrode. In the inclined IDT electrode in the first example embodiment and the first comparative example, an absolute value of an inclination angle with respect to a propagation angle of the first envelope curve and the second envelope curve is about 7.5°, for example.

Figure 8:
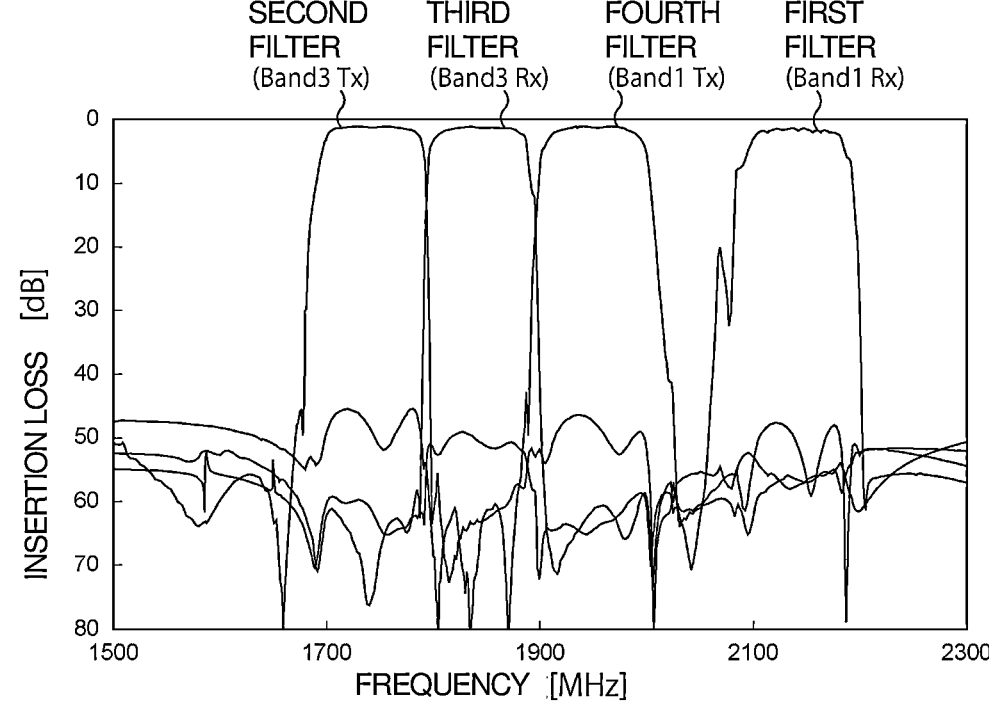
FIG. 8 is a view showing attenuation frequency characteristics of the first filter, a second filter, a third filter, and a fourth filter in the first example embodiment of the present invention.
Figure 9:
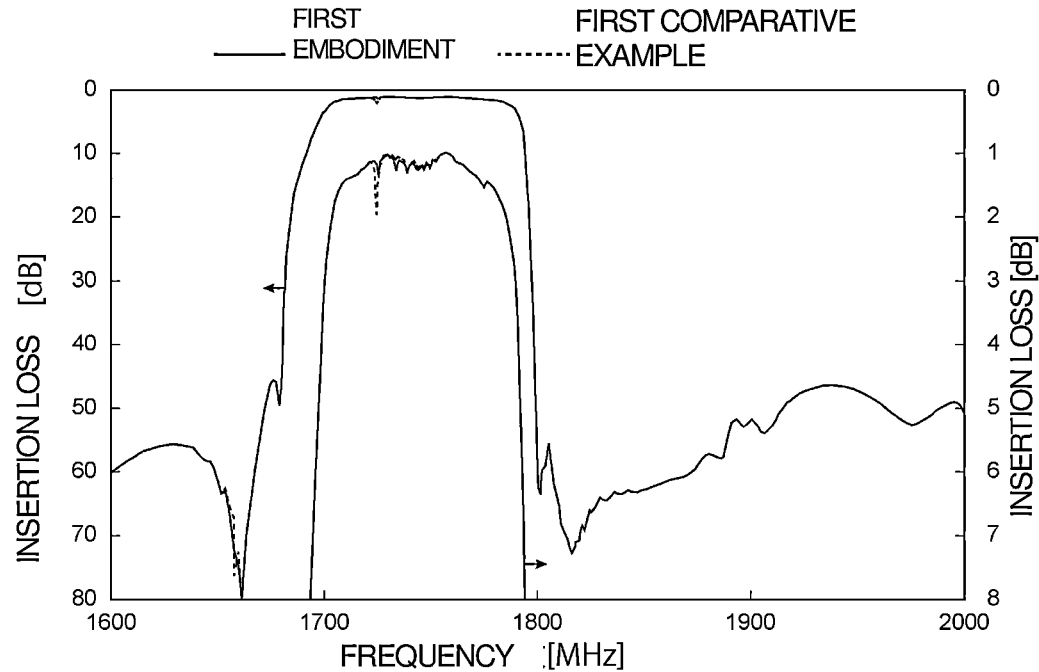
FIG. 9 is a view showing the attenuation frequency characteristics of the second filter in the first example embodiment and a first comparative example of the present invention.

FIG. 8 is a view showing the attenuation frequency characteristics of the first filter, the second filter, the third filter, and the fourth filter in the first example embodiment. FIG. 9 is a view showing the attenuation frequency characteristics of the second filter in the first example embodiment and the first comparative example.

As shown in FIG. 8, an insertion loss of each filter in the first example embodiment is sufficiently small.

As shown in FIG. 9, a large ripple is generated inside the pass band in the attenuation frequency characteristics of the second filter in the first comparative example. In contrast, in the attenuation frequency characteristics of the second filter in the first example embodiment, the ripple is reduced or prevented inside the pass band. The above-described ripple is caused by unwanted waves generated in the acoustic wave resonator of the first filter. In the first example embodiment, since the unwanted waves can be reduced or prevented, it is possible to reduce prevent an increase in the insertion loss of the second filter. The reason is as follows.

In the intersection region J of the series arm resonator S1a shown in FIG. 5, curve shape portions where the excitation angle $\theta_{C\_prop}$ is other than 0° and the excitation angle $\theta_{C\_prop}$ is the same or substantially the same are innumerably aligned in a direction where the first busbar 14 and the second busbar 15 oppose each other. The excitation angles $\theta_{C\_prop}$ are preferably different from each other in the above-described curve shape portions. In the portions where the excitation angles $\theta_{C\_prop}$ are different from each other, propagation characteristics of the unwanted waves are different from each other. In this manner, the unwanted waves can be dispersed, and the unwanted waves can be effectively reduced or prevented. In particular, the unwanted waves outside the band can be reduced or prevented. In the present specification, the outside of the band in the acoustic wave device means a lower band side of a resonant frequency and a higher band side of an anti-resonant frequency.

Furthermore, when the unwanted waves are generated in the acoustic wave resonator close to the common connection terminal 7 shown in FIG. 1, in the first filter 1A, influence of the unwanted waves on other filters is large. Here, as described above, in all of the ladder portions shown in FIG. 2, the half ladder portions located on the first signal terminal 3A side are the front half ladder portions. On the other hand, the ladder portions located on the second signal terminal 3B side with respect to the front half ladder portions are rear half ladder portions. A boundary between the front half ladder portions and the rear half ladder portions is shown by a two-dot chain line in FIGS. 1 and 2.

In the plurality of resonators, the resonators from the resonator located closest to the first signal terminal 3A side to the series arm resonator and the parallel arm resonator of the ladder portion located closest to the second signal terminal 3B side in the front half ladder portions are the front half resonators. When the unwanted waves are generated in the front half resonators, the influence of the unwanted waves on other filters is particularly large.

In the first example embodiment, the series arm resonator S1a, the series arm resonator S1b, and the series arm resonator S1c which are the front half resonators are the excitation angle change resonators. In this manner, the unwanted waves outside the band can be reduced or prevented in three front half resonators. Therefore, the ripple caused by the unwanted waves in the second filter 1B can be reduced or prevented. However, at least one of the front half resonators may be the excitation angle change resonator.

In addition, all of the resonators other than the front half resonators are acoustic wave resonators which are not the excitation angle change resonators. Specifically, in all of the resonators other than the front half resonators, the excitation angle $\theta_{C\_prop}$ is constant in all of the intersection regions. In this manner, in the resonators, the resonant frequency and the anti-resonant frequency can easily coincide with each other in all of the intersection regions, and resonance characteristics can be easily improved. Therefore, filter characteristics of the first filter 1A can be easily and effectively improved. Moreover, even when the unwanted waves are generated in the resonators, the influence on other filters is small.

Here, an example in which the unwanted waves outside the band can be reduced or prevented in the excitation angle change resonator will be specifically described. Phase characteristics of the excitation angle change resonator and the acoustic wave resonator shown in FIG. 7 are compared. In the comparison, both the resonators do not include the dielectric film 8 shown in FIG. 4. Hereinafter, the design parameter of the excitation angle change resonator will be described. The design parameter of the excitation angle change resonator is the same as the design parameter of the excitation angle change resonator in the comparison shown in FIG. 9 in the first envelope curve E1, the second envelope curve E2, the excitation angle on the first envelope curve, the excitation angle on the second envelope curve, and the number of pairs of reflector electrode fingers.

Support Substrate: Material_Si, Surface Orientation_ (100), ψ at Euler Angles (φ, θ, ψ) about 45°

First Layer of Intermediate Layer: Material_SiN, Thickness about 0.45λ

Second Layer of Intermediate Layer: Material SiO₂, Thickness about 0.337λ

Piezoelectric Body Layer: Material_Rotational Y-cut 50° X-propagation LiTaO₃, Thickness about 0.3λ

IDT Electrode: Material_Al, Thickness about 0.07λ

Wavelength λ: 2 μm in the portion where the Excitation Angle $\theta_{C\_prop}$ is about 0°

Number of Pairs of Electrode Fingers of IDT Electrode: 100 pairs

Duty Ratio: about 0.5

Gap Length: about 0.135λ

Length of Offset Electrode: about 3.5λ

Distance in Direction Orthogonal to Propagation Axis between First Envelope Curve E1 and Second Envelope Curve E2: about 25λ

In the inclined IDT electrode in the acoustic wave resonator which is not the excitation angle change resonator, the absolute value of the inclination angle with respect to the propagation angle of the first envelope curve and the second envelope curve is about 7.5°, for example. The duty ratio is about 0.5, for example. The number of pairs of electrode fingers in the IDT electrode is 100 pairs. The dimension of the intersection region along the extending direction of the plurality of electrode fingers is about 25λ, for example.

Figure 10:
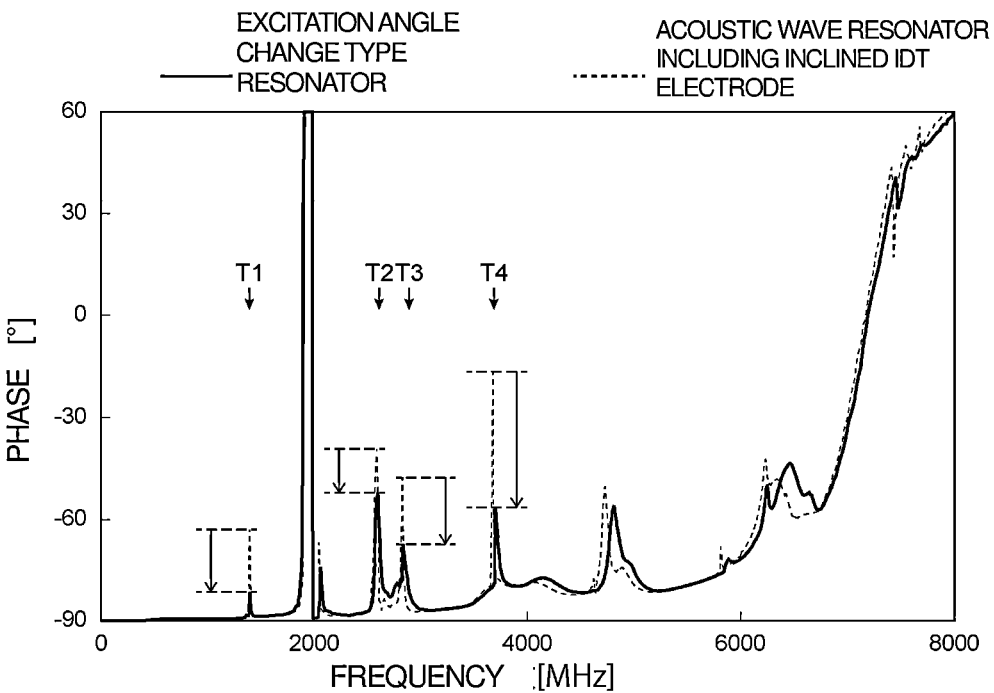
FIG. 10 is a view showing phase characteristics in the excitation angle change resonator and an acoustic wave resonator having an inclined IDT electrode.

FIG. 10 is a view showing the phase characteristics in the excitation angle change resonator and the acoustic wave resonator including the inclined IDT electrode.

As shown in FIG. 10, in the acoustic wave resonator including the inclined IDT electrode, large unwanted waves are generated in the vicinity of each of the frequencies indicated by an arrow T1, an arrow T2, an arrow T3, and an arrow T4. The frequency indicated by the arrow T1 is a frequency on the lower band side of the resonant frequency. The unwanted waves generated in the vicinity of the frequency indicated by the arrow T1 are Rayleigh waves. On the other hand, the frequencies indicated by the arrow T2, the arrow T3, and the arrow T4 are frequencies on the higher band side of the anti-resonant frequency.

As shown in FIG. 10, it can be understood that in the excitation angle change resonator, the unwanted waves can also be reduced or prevented in the vicinity of any of the frequencies indicated by the arrow T1, the arrow T2, the arrow T3, and the arrow T4.

Incidentally, in the first example embodiment, all of the three series arm resonators of the series arm resonator assembly S1 are the excitation angle change resonators. Here, the influence on the reduction or prevention of the unwanted waves is studied by changing only the number and disposition of the excitation angle change resonators in the series arm resonator assembly S1. Specifically, the above-described study is performed in the first example embodiment and first to fourth modified examples of the first example embodiment.

More specifically, in the first modified example, only the series arm resonator S1a is the excitation angle change resonator. In the second modified example, the series arm resonator S1a and the series arm resonator S1b are the excitation angle change resonators. In the third modified example, only the series arm resonator S1c is the excitation angle change resonator. In the fourth modified example, the series arm resonator S1b and the series arm resonator S1c are the excitation angle change resonators.

Return losses on the common connection terminal 7 side of the first filter are compared in the first example embodiment, the first to fourth modified examples thereof, and the first comparative example.

Figure 11:
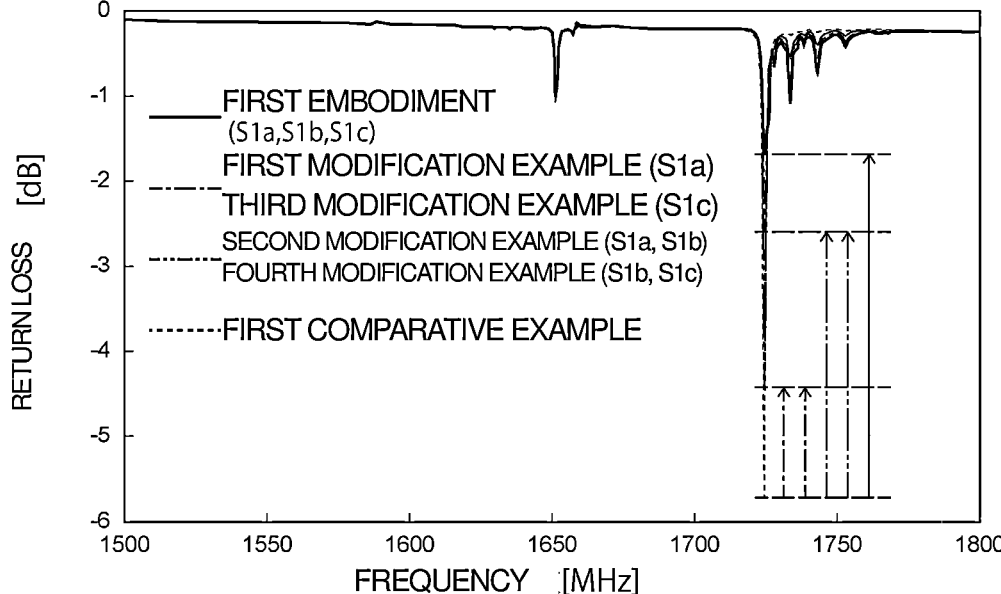
FIG. 11 is a view showing a return loss in the first example embodiment of the present invention, first to fourth modified examples thereof, and the first comparative example.

FIG. 11 is a view showing the return loss in the first example embodiment, the first to fourth modified examples thereof, and the first comparative example. A reference numeral in parentheses in FIG. 11 indicate a reference numeral of the series arm resonator which is the excitation angle change resonator.

Table 1 shows the return loss of the unwanted waves generated in the vicinity of 1,725 MHz in the first example embodiment, the first to fourth modified examples thereof, and the first comparative example. 1,725 MHz is a frequency lower than the resonant frequency of each series arm resonator of the series arm resonator assembly S1. Therefore, the unwanted waves are the unwanted wave outside the band.

TABLE 1

| | Disposition of Excitation angle change resonators | Return Loss [dB] |
| --- | --- | --- |
| First Example Embodiment | Series Arm Resonators S1a, S1b, S1c | 1.74 |
| First Modified example | Series Arm Resonator S1a | 4.3 |
| Second Modified example | Series Arm Resonators S1a, S1b | 2.52 |
| Third Modified example | Series Arm Resonator S1c | 4.3 |
| Fourth Modified example | Series Arm Resonators S1b, S1c | 2.52 |
| First Comparative Example | None | 5.7 |

As shown in FIGS. 11 and Table 1, in the first comparative example, the absolute value of the return loss of the unwanted waves generated in the vicinity of 1,725 MHz is as great as about 5.7 dB. On the other hand, it can be understood that the unwanted waves are reduced or prevented in the first example embodiment and the first to fourth modified examples thereof.

The number of the excitation angle change resonators included in the series arm resonator assembly S1 is three in the first example embodiment, is two in the second modified example and the fourth modified example, and is one in the first modified example and the third modified example. In the first example embodiment, the absolute value of the return loss of the unwanted wave is as small as about 1.74 dB. In the second modified example and the fourth modified example, the absolute value of the return loss of the unwanted waves is about 2.52 dB. In the first modified example and the third modified example, the absolute value of the return loss of the unwanted waves is about 4.3 dB. Based on the results, it can be understood that the unwanted waves generated in the vicinity of 1,725 MHz are reduced or prevented as the number of the excitation angle change resonators included in the series arm resonator assembly S1 is larger.

In the first modified example and the third modified example, dispositions of the excitation angle change resonators are different from each other. However, in the first modified example and the third modified example, the unwanted waves are reduced or prevented to approximately the same extent. In the second modified example and the fourth modified example, dispositions of the excitation angle change resonators are different from each other. However, in the second modified example and the fourth modified example, the unwanted waves are reduced or prevented to approximately the same extent. In this way, it can be understood that the number of the excitation angle change resonators in the series arm resonator assembly S1 has larger influence on the reduction or prevention of the unwanted waves outside the band than the disposition of the excitation angle change resonators in the series arm resonator assembly S1.

In the filter, when the series arm resonator assembly includes the plurality of series arm resonators in the portion including only the front half ladder portions of the front half ladder portions and the rear half ladder portions, it is preferable that a half or more of the series arm resonators of the series arm resonator assemblies are the excitation angle change resonators. It is more preferable that all of the series arm resonators of the series arm resonator assembly are the excitation angle change resonators. In this manner, the unwanted waves outside the band can be effectively reduced or prevented. In this manner, the influence of the unwanted waves on the second filter 1B defining and functioning as the other filter can be effectively reduced or prevented.

As in the first example embodiment, it is preferable that at least one series arm resonator of the series arm resonator assembly S1 located closest to the first signal terminal 3A side in the plurality of series arm resonator assemblies is the excitation angle change resonator. It is more preferable that the half or more of the series arm resonators in the series arm resonator assembly S1 are the excitation angle change resonators, and it is much more preferable that all of the series arm resonators of the series arm resonator assembly S1 are the excitation angle change resonators. In this manner, the influence of the unwanted waves on other filters can be effectively reduced or prevented.

Hereinafter, details of the first example embodiment will be further described.

A portion including a portion located on the first envelope curve E1 in the first electrode finger 16 shown in FIG. 5 and adjacent to the tip portion of any one second electrode finger 17 is an adjacent portion of the first electrode finger 16. A portion including a portion located on the second envelope curve E2 in the second electrode finger 17 and adjacent to the tip portion of any one first electrode finger 16 is an adjacent portion of the second electrode finger 17. A portion in a range of approximately $1\lambda$ along the extending direction of the electrode finger from the tip of the electrode finger is the tip portion of the electrode finger. A range of the adjacent portion is also the range of approximately $1\lambda$ along the extending direction of the electrode finger. For example, an electrode finger pitch defining and functioning as a reference for the range of the tip portion and the adjacent portion may be a narrowest electrode finger pitch in the portion where the excitation angle $\theta\theta_{prop}$ is about $0°$.

In the series arm resonator S1a defining and functioning as the excitation angle change resonator of the first example embodiment, the shape of the plurality of first electrode fingers 16 and the plurality of second electrode fingers 17 in a plan view is a shape whose curvature is gently changed. Specifically, the shape of the plurality of first electrode fingers 16 and the plurality of second electrode fingers 17 in a plan view is a shape that can be approximated to an arc. However, for example, the shape of the plurality of first electrode fingers 16 and the plurality of second electrode fingers 17 in a plan view may be a shape that can be approximated to an elliptical arc. The shape of each electrode finger in a plan view does not need to be the shape that can be approximated to the arc or the elliptical arc. For example, the shape of each electrode finger in a plan view may be a shape of a parabola that cannot be approximated to the arc and the elliptical arc.

Hereinafter, a preferable configuration established in at least one excitation angle change resonator in the present invention will be described.

It is preferable that the shapes of all of the electrode fingers in the IDT electrode 18 in a plan view are curve shapes which are different from each other. The example will be specifically described as three types of examples. As an example of the first type, it is preferable that the curvatures are different from each other between the tip portions located on the first envelope curve E1 side, between the adjacent portions, or between the tip portion and the adjacent portion, in all of the first electrode fingers 16 and all of the second electrode fingers 17. More specifically, it is preferable that the curvatures are different from each other between the tip portions of all of the second electrode fingers 17, between the adjacent portions of all of the first electrode fingers 16, and between the tip portions of all of the second electrode fingers 17, and the adjacent portions of all of the first electrode fingers 16.

As an example of the second type, it is preferable that the curvatures are different from each other between the tip portions located on the second envelope curve E2 side, between the adjacent portions, or between the tip portion and the adjacent portion, in all of the first electrode fingers 16 and all of the second electrode fingers 17. More specifically, it is preferable that the curvatures are different from each other between the tip portions of all of the first electrode fingers 16, between the adjacent portions of all of the second electrode fingers 17, and between the tip portion of all of the first electrode fingers 16 and the adjacent portion of all of the second electrode fingers 17.

As an example of the third type, it is preferable that the curvatures are different from each other between the portions located in the portions where the excitation angle $\theta_{C\_prop}$ is about 0° in all of the first electrode fingers 16 and all of the second electrode fingers 17. In this way, the shapes of all of the electrode fingers in the IDT electrode 18 in a plan view are curve shapes which are different from each other. Accordingly, the unwanted waves can be more reliably and effectively reduced or prevented.

In the first example embodiment, all of the above-described three types of examples are satisfied. However, in at least one set of electrode fingers in the plurality of first electrode fingers 16 and the plurality of second electrode fingers 17, the curvatures may be different from each other between the tip portions located on the first envelope curve E1 side, between the adjacent portions, or between the tip portion and the adjacent portion.

In the first example embodiment, in the curve region, the shape of the plurality of electrode fingers in a plan view is the curve that is not the arc or the elliptical arc. The shape of the plurality of electrode fingers in a plan view is a shape that can be approximated to the arc. In other words, the shape of the plurality of electrode fingers is in a state where the shape appears to be approximated to the arc when viewed in a plan view. In addition, the shapes of the plurality of electrode fingers in a plan view are curve shapes which are different from each other. Therefore, a relationship shown in FIG. 12 is established.

Figure 12:
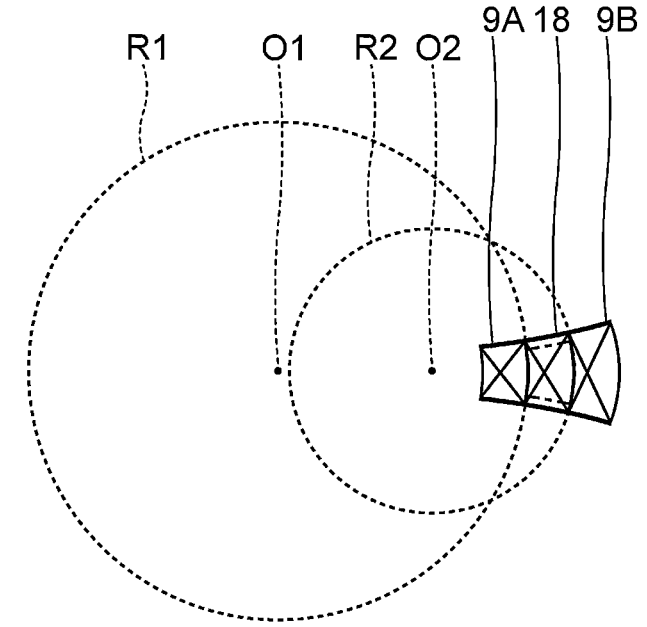
FIG. 12 is a schematic plan view showing a circle including an arc when a shape of the IDT electrode in the first example embodiment of the present invention in a plan view of an electrode finger is approximated to an arc.

FIG. 12 is a schematic plan view showing a circle including the arc when the shape of the electrode finger in a plan view of the IDT electrode in the first example embodiment is approximated to the arc.

In FIG. 12, two circles R1 and a circle R2 are indicated by broken lines. The circle R1 and the circle R2 are circles including each arc when the shapes of the two electrode fingers different from each other in a plan view are approximated by the arc. A position of a center O1 of the circle R1 and a position of a center O2 of the circle R2 are different from each other.

In the curve region, when the shapes of all of the first electrode fingers 16 and all of the second electrode fingers 17 in a plan view are approximated to the arc, it is preferable that the positions of the centers of the circles including the arcs are different from each other. In this case, as described above, the shapes of all of the electrode fingers in the IDT electrode 18 in a plan view are the curve shapes which are different from each other. In this manner, the unwanted waves can be more reliably and effectively reduced or prevented. However, in the curve region, when the shape of at least one set of electrode fingers in the plurality of first electrode fingers 16 and the plurality of second electrode fingers 17 in a plan view is approximated to the arc, the positions of the centers of the circles including the arcs may be different from each other.

In the curve region, a configuration may be adopted in which the shape of the plurality of first electrode fingers 16 and the plurality of second electrode fingers 17 in a plan view can be approximated to the elliptical arc. In this case, in the curve region, when the shapes of all of the first electrode fingers 16 and all of the second electrode fingers 17 in a plan view are approximated to the elliptical arc, it is preferable that the positions of midpoints of a focus of an ellipse including the elliptical arc are different from each other. However, in the curve region, when the shape of at least one set of electrode fingers in the plurality of first electrode fingers 16 and the plurality of second electrode fingers 17 in a plan view is approximated to the elliptical arc, the positions of the midpoints of the focus of the ellipse including the elliptical arc may be different from each other.

It is preferable that the resonant frequencies or the anti-resonant frequencies of the main mode in at least one excitation angle change resonator such as the series arm resonator Sla substantially coincide with each other in all of the intersection regions J. It is more preferable that the resonant frequencies or the anti-resonant frequencies substantially coincide with each other in each of the intersection regions J of all of the excitation angle change resonators. In the portions where the excitation angles $\theta_{C\_prop}$ of the excitation angle change resonators are different from each other, relationships between the resonant frequencies and the anti-resonant frequencies of the main mode and the unwanted waves are different from each other. Therefore, when the resonant frequencies or the anti-resonant frequencies of the main mode coincide with each other in all of the intersection regions J of the excitation angle change resonator, the frequencies of the unwanted waves are different from each other in the portions where the excitation angles $\theta_{C\_prop}$ are different from each other. In this manner, the unwanted waves outside the band are dispersed. Therefore, the unwanted waves outside the band, such as Rayleigh waves, for example, can be further reduced or prevented.

In addition, since the resonant frequencies or the anti-resonant frequencies in the intersection region J substantially coincide with each other, the main mode is preferably excited. Therefore, resonance characteristics can be more reliably improved. In this manner, filter characteristics of the first filter 1A in the multiplexer 1 can be more reliably improved.

In the present specification, description that one frequency and the other frequency coincide or substantially coincide with each other means that the absolute value of the difference between both frequencies is equal to or smaller than about 2% of a reference frequency, for example. The reference frequency refers to a frequency when the excitation angle $\theta_{C\_prop}$ is about 0°.

In the intersection region J of the excitation angle change resonator, it is preferable that the absolute value of the difference between the highest resonant frequency and the lowest resonant frequency of the main mode is equal to or smaller than about 1% of the reference frequency, for example. Alternatively, in the intersection region J of the excitation angle change resonator, it is preferable that the absolute value of the difference between the highest anti-resonant frequency and the lowest anti-resonant frequency of the main mode is equal to or smaller than about 1% of the reference frequency, for example. In this manner, resonance characteristics can be more reliably improved.

For example, in the series arm resonator S1a, it is preferable that at least one of the duty ratio, the electrode finger pitch, and the thickness of the plurality of first electrode fingers 16 and the plurality of second electrode fingers 17 is changed in accordance with the excitation angle $\theta_{C\_prop}$. It is preferable that at least one of the parameters is changed in accordance with the excitation angle $\theta_{C\_prop}$ such that the resonant frequencies or the anti-resonant frequencies substantially coincide with each other in at least a portion of the intersection region J. It is more preferable that at least one of the parameters is changed in accordance with the excitation angle $\theta_{C\_prop}$ such that the resonant frequencies or the anti-resonant frequencies substantially coincide with each other in all of the intersection regions J. In this manner, resonance characteristics of the excitation angle change resonator can be more reliably improved.

Alternatively, when the thickness of the intermediate layer 5 inside the piezoelectric substrate 2 affects the frequency, the parameter may be changed in the intersection region J in accordance with the excitation angle $\theta_{C\_prop}$. As in the first example embodiment, when the dielectric film 8 is provided on the piezoelectric substrate 2 to cover the IDT electrode 18, the thickness of the dielectric film may be changed in accordance with the excitation angle $\theta_{C\_prop}$ in the intersection region J. The plurality of parameters of the IDT electrode 18 or the parameters other than the IDT electrode 18 may be changed in the intersection region J in accordance with the excitation angle $\theta_{C\_prop}$. In these cases, the resonant frequencies or the anti-resonant frequencies can substantially coincide with each other in at least a portion or all of the intersection regions J.

It is preferable that at least one of the electrode finger pitch and the duty ratio is constant in the portion where the excitation angle $\theta_{C\_prop}$ is the same or substantially the same in the IDT electrode 18. It is more preferable that both the electrode finger pitch and the duty ratio are constant in the portion where the excitation angle $\theta_{C\_prop}$ is the same or substantially the same. In this manner, resonance characteristics of the excitation angle change resonator can be more reliably improved.

Hereinafter, examples of materials of respective members in the piezoelectric substrate 2 will be described.

As a material of the support substrate 4 shown in FIG. 4, for example, a piezoelectric body such as aluminum nitride, lithium tantalate, lithium niobate, and crystal, ceramic such as alumina, sapphire, magnesia, silicon nitride, silicon carbide, zirconia, cordierite, mullite, steatite, forsterite, spinel, and sialon, a dielectric such as aluminum oxide, silicon oxynitride, diamond-like carbon (DLC), and diamond, or a semiconductor such as silicon, and alternatively, a material having the above-described materials as the main components can be used. The above-described spinel includes, for example, an aluminum compound containing one or more elements selected from Mg, Fe, Zn, and Mn, and oxygen. Examples of the above-described spinel can include $MgAl_2O_4$, $FeAl_2O_4$, $ZnAl_2O_4$, and $MnAl_2O_4$. It is preferable to use high-resistance silicon for the support substrate 4. It is preferable that volume resistivity of the material of the support substrate 4 is, for example, equal to or higher than about 1000 $\Omega \cdot$cm. In the first example embodiment, for example, the high-resistance silicon is used as the material of the support substrate 4.

The first layer 5a of the intermediate layer 5 is a high acoustic velocity film. The high acoustic velocity film is a film having a relatively high acoustic velocity. More specifically, the acoustic velocity of the bulk wave propagating through the high acoustic velocity film is higher than the acoustic velocity of the acoustic wave propagating through the piezoelectric body layer 6. As a material of the first layer 5a which is the high acoustic velocity film, for example, a piezoelectric body such as aluminum nitride, lithium tantalate, lithium niobate, and crystal, ceramic such as alumina, sapphire, magnesia, silicon nitride, silicon carbide, zirconia, cordierite, mullite, steatite, forsterite, spinel, and sialon, a dielectric such as aluminum oxide, silicon oxynitride, diamond-like carbon (DLC), and diamond, or a semiconductor such as silicon, and alternatively, a material having the above-described materials as the main components can be used. The above-described spinel includes an aluminum compound containing one or more elements selected from Mg, Fe, Zn, and Mn, and oxygen. Examples of the above-described spinel can include $MgAl_2O_4$, $FeAl_2O_4$, $ZnAl_2O_4$, and $MnAl_2O_4$. In the first example embodiment, the silicon nitride is used as the material of the first layer 5a.

The second layer 5b of the intermediate layer 5 is preferably a low acoustic velocity film. The low acoustic velocity film is a film having a relatively low acoustic velocity. More specifically, the acoustic velocity of the bulk wave propagating through the low acoustic velocity film is lower than the acoustic velocity of the bulk wave propagating through the piezoelectric body layer 6. As a material of the second layer 5b which is the low acoustic velocity film, for example, a dielectric such as a compound obtained by adding fluorine, carbon, or boron to glass, silicon oxide, silicon oxynitride, lithium oxide, tantalum oxide, or silicon oxide, or a material having the above-described materials as the main components can be used. In the first example embodiment, for example, the silicon oxide is used as the material of the second layer 5b.

As the material of the piezoelectric body layer 6 shown in FIG. 4, for example, lithium tantalate, lithium niobate, zinc oxide, aluminum nitride, crystal, or lead zirconate titanate (PZT) can also be used. As the material of the piezoelectric body layer 6, it is preferable to use lithium tantalate or lithium niobate. In the first example embodiment, for example, the lithium tantalate is used as the material of the piezoelectric body layer 6.

In the first example embodiment, in the piezoelectric substrate 2, the first layer 5a defining and functioning as the high acoustic velocity film, the second layer 5b defining and functioning as the low acoustic velocity film, and the piezoelectric body layer 6 are laminated in this order. In this manner, energy of the acoustic wave can be effectively confined on the piezoelectric body layer 6 side.

As the materials of the IDT electrode 18, the reflector 9A, and the reflector 9B, for example, one or more types of metal selected from Ti, Mo, Ru, W, Al, Pt, Ir, Cu, Cr, and Sc may be used. The IDT electrode 18 and each reflector may include a single layer metal film, or may include a laminated metal film. In the first example embodiment, for example, the Al is used as the materials of the IDT electrode 18, the reflector 9A, and the reflector 9B.

In the present specification, the main component means a component whose occupied ratio exceeds 50% by weight. The material of main component may exist in any one state of single crystal, polycrystal, and amorphous, or in a mixed state thereof.

Incidentally, as shown in FIG. 5, the first envelope curve E1 of the IDT electrode 18 includes the plurality of bending portions V1. However, the first envelope curve E1 may have a linear shape that does not include the bending portion V1. The first envelope curve E1 may extend parallel to the extending direction of the propagation axis. Similarly, the second envelope curve E2 may have a linear shape that does not include the bending portion V2. The second envelope curve E2 may extend parallel to the extending direction of the propagation axis.

In the present example embodiment, the intersection region J includes only one curve region. The intersection region J may include a plurality of curve regions.

Returning to FIG. 1, the second filter 1B, the third filter 1C, and the fourth filter 1D each include a substrate different from the piezoelectric substrate of the first filter 1A. That is, each filter includes an individual piezoelectric substrate. Each of these filters is preferably defined by an individual element chip. More specifically, the first filter 1A has a Wafer Level Package (WLP) structure. The same applies to each of the other filters. Although not shown, the multiplexer 1 includes a mounting substrate. The first filter 1A, the second filter 1B, the third filter 1C, and the fourth filter 1D are mounted on the mounting substrate.

The multiplexer 1 may have a chip size package (CSP) structure. Specifically, for example, at least one filter of the first filter 1A, the second filter 1B, the third filter 1C, and the fourth filter 1D may be mounted on the mounting substrate by using a conductive bonding agent provided for each terminal.

The common connection terminal 7 shown in FIG. 1 is provided in the mounting substrate. The first signal terminal 3A of the first filter 1A is electrically coupled to the common connection terminal 7 by wiring. One signal terminal in each of the other filters is similarly electrically coupled to the common connection terminal 7 by wiring.

All resonators in the first filter 1A share the same piezoelectric substrate 2. However, each resonator of the first filter 1A may include a separate piezoelectric substrate. Alternatively, some of the plurality of resonators in all of the resonators may share one piezoelectric substrate, and a plurality of other resonators may share another piezoelectric substrate. For example, the plurality of excitation angle change resonators may share one piezoelectric substrate, and the plurality of resonators which are not the excitation angle change resonators may share another piezoelectric substrate. The same applies to each filter other than the first filter 1A.

In the multiplexer, the plurality of filters may share the same piezoelectric substrate. In this case, all of the resonators of the plurality of filters are formed in the same piezoelectric substrate.

In the first example embodiment, the pass band of the first filter 1A is located on the higher band side with respect to the pass band of the second filter 1B. In this case, for example, it is preferable that the pass band of the second filter 1B include at least a portion of the frequency which is equal to or higher than about 0.5 times and is equal to or lower than about 0.9 times the resonant frequency of the excitation angle change resonator of the first filter 1A. In the above-described frequency range, the unwanted waves can be more reliably reduced or prevented in the excitation angle change resonator of the first filter 1A. Therefore, the influence of the unwanted waves on the second filter 1B can be more reliably reduced or prevented.

On the other hand, the pass band of the first filter 1A may be located on the lower band side with respect to the pass band of the second filter 1B if so desired. In the excitation angle change resonator of the first filter 1A, the unwanted waves generated on the higher band side of the anti-resonant frequency can be reduced or prevented. Therefore, the influence of the unwanted waves on the second filter 1B can be more reliably reduced or prevented.

Hereinafter, fifth to twelfth modified examples of the first example embodiment, which are different from the first example embodiment only in configurations of the IDT electrode and each reflector in the excitation angle change resonator, will be described. As in the first example embodiment, in the first filter of the fifth to twelfth modified examples, the excitation angle change resonator is disposed. The unwanted waves outside the band can be reduced or prevented in the excitation angle change resonator. Therefore, in the multiplexers of the fifth to twelfth modified examples, the influence of the unwanted wave can be reduced or prevented, and a decrease in the insertion loss in each filter can be reduced or prevented.

Figure 13:
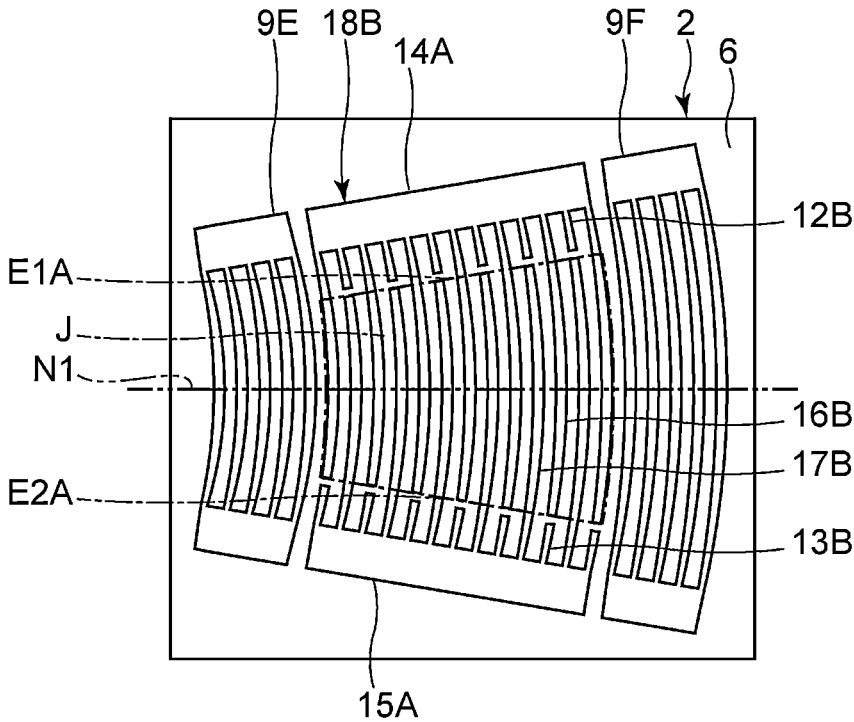
FIG. 13 is a schematic plan view of the excitation angle change resonator of the first filter in a fifth modified example of the first example embodiment of the present invention.

FIG. 13 is a schematic plan view of the excitation angle change resonator of the first filter in the fifth modified example of the first example embodiment.

In the present modified example, the shape of the plurality of first electrode fingers 16B and the second electrode finger 17B of the IDT electrode 18B in a plan view is an arc shape. The shape of the plurality of electrode fingers in a plan view may include an elliptical arc shape.

In the IDT electrode 18B, each shape of the plurality of electrode fingers in a plan view is a shape corresponding to each arc of a plurality of concentric circles. Therefore, the centers of the circles including the arcs in the shapes of the plurality of electrode fingers coincide with each other. A two-dot chain line N1 in FIG. 13 is a straight line passing through the center and the intersection region J. More specifically, the two-dot chain line N1 passes through the center of the intersection region J. In the present modified example, the two-dot chain line N1 extends parallel or substantially parallel to the extending direction of the propagation axis.

When an elliptical coefficient of a circle or ellipse including the arc in the shape of the plurality of electrode fingers is defined as α2/α1, the elliptical coefficient α2/α1 in the present modified example is 1. α1 corresponds to a dimension along a direction of an axis passing through the intersection region J, in a long axis and a short axis of the ellipse. α2 corresponds to a dimension along a direction of an axis that does not pass through the intersection region J, in the long axis and the short axis of the ellipse.

The first envelope curve E1A is linear, and is inclined with respect to the propagation axis. Similarly, the second envelope curve E2A is linear, and is inclined with respect to the propagation axis. The intersection region J of the IDT electrode 18B has a line symmetrical shape when an axis extending parallel to the propagation axis is defined as a symmetry axis. However, the first envelope curve E1A and the second envelope curve E2A may extend in parallel. In the present modified example, the first busbar 14A and the second busbar 15A have a linear shape.

When the straight line passing through the center of the intersection region J is defined as a reference line, the two-dot chain line N1 coincides with the reference line in the present modified example. The reference line does not necessarily need to extend parallel to the extending direction of the propagation axis. As described above, the centers of the circles including the arcs in the shapes of the plurality of electrode fingers coincide with each other. The center is defined as a fixed point. An angle between the straight line passing through the first envelope curve E1A and the fixed point and the reference line is defined as an intersection angle $\theta_{C1\_Ap}$. However, in the present modified example, an extension line of the first envelope curve E1A passes through the fixed point. Therefore, the intersection angle $\theta_{C1\_AP}$ is synonymous with an angle between the extension line of the first envelope curve E1A and the reference line.

The angle between the straight line passing through the second envelope curve E2 and the fixed point and the reference line is defined as an intersection angle $\theta_{C2\_AP}$. However, in the present modified example, the extension line of the second envelope curve E2A passes through the fixed point. Therefore, the intersection angle $\theta_{C2\_AP}$ is synonymous with an angle between the extension line of the second envelope curve E2A and the reference line. At each intersection angle and the excitation angle $\theta_{C\_prop}$, a relationship of $\theta_{C\_AP2} \leq \theta_{C\_prop} \leq \theta_{C\_AP1}$ is established. In the present modified example, the absolute values of the intersection angle $\theta_{C\_AP1}$ and the intersection angle $\theta_{C\_AP2}$ are the same. Therefore, the absolute value of the excitation angle $\theta_{C\_prop}$ is $0° \leq |\theta_{C\_prop}| \leq |\theta_{C\_AP1}| = |\theta_{C\_AP2}|$ The shape of the plurality of first offset electrodes 12B and the plurality of second offset electrodes 13B in a plan view is an arc shape. Specifically, each shape of the plurality of first offset electrodes 12B and the plurality of second offset electrodes 13B in a plan view is a shape corresponding to each arc of the plurality of concentric circles. Therefore, the centers of the circles including the arcs in the shapes of the plurality of offset electrodes coincide with each other. More specifically, in the present modified example, the centers of the circles including the arcs in the shapes of the plurality of electrode fingers and the plurality of offset electrodes coincide with each other. In this manner, a leakage from the intersection region J of the main mode can be effectively reduced or prevented.

However, the shape of the plurality of offset electrodes is not limited to the above-described example. For example, the shape of the plurality of offset electrodes in a plan view may be linear. In this case, the length of the plurality of offset electrodes can be shortened. In this manner, electric resistance of the IDT electrode 18B can be reduced.

Each shape of the plurality of reflector electrode fingers of the reflector 9E and the reflector 9F in a plan view is a shape corresponding to each arc of the plurality of concentric circles. More specifically, in the present modified example, the centers of the circles including the arcs in the shapes of the plurality of electrode fingers and the plurality of reflector electrode fingers coincide with each other. In this manner, resonance characteristics can be more reliably improved. However, the shape of the plurality of reflector electrode fingers is not limited to the above-described example.

The shape of the plurality of electrode fingers in a plan view may include an elliptical arc shape. More specifically, in this case, each shape of the plurality of electrode fingers in a plan view includes a shape corresponding to each elliptical arc of a plurality of ellipses whose centers of gravity are located at the same position. The center of gravity here is the center of the two foci of the ellipse. In this case, as in the fifth modified example, in the excitation angle change resonator, the unwanted waves outside the band such as the Rayleigh waves can be reduced or prevented. When the shape including the arc in the shape of the plurality of electrode fingers is the ellipse, an elliptical coefficient $\alpha2/\alpha1$ is other than 1.

When the shape of the plurality of electrode fingers in a plan view includes the elliptical arc, it is preferable that the shape of the plurality of offset electrodes in a plan view also includes the elliptical arc. In this case, it is preferable that the centers of gravity of the ellipses including the elliptical arcs in the shapes of the plurality of electrode fingers and the plurality of offset electrodes coincide with each other. In this manner, a leakage from the intersection region J of the main mode can be effectively reduced or prevented.

When the shape of the plurality of electrode fingers in a plan view includes the elliptical arc, it is preferable that the shape of the plurality of reflector electrode fingers of each reflector in a plan view also includes the elliptical arc. In this case, it is preferable that the centers of gravity of the ellipses including the elliptical arcs in the shapes of the plurality of electrode fingers and the plurality of reflector electrode fingers coincide with each other. In this manner, resonance characteristics can be more reliably improved.

Figure 14:
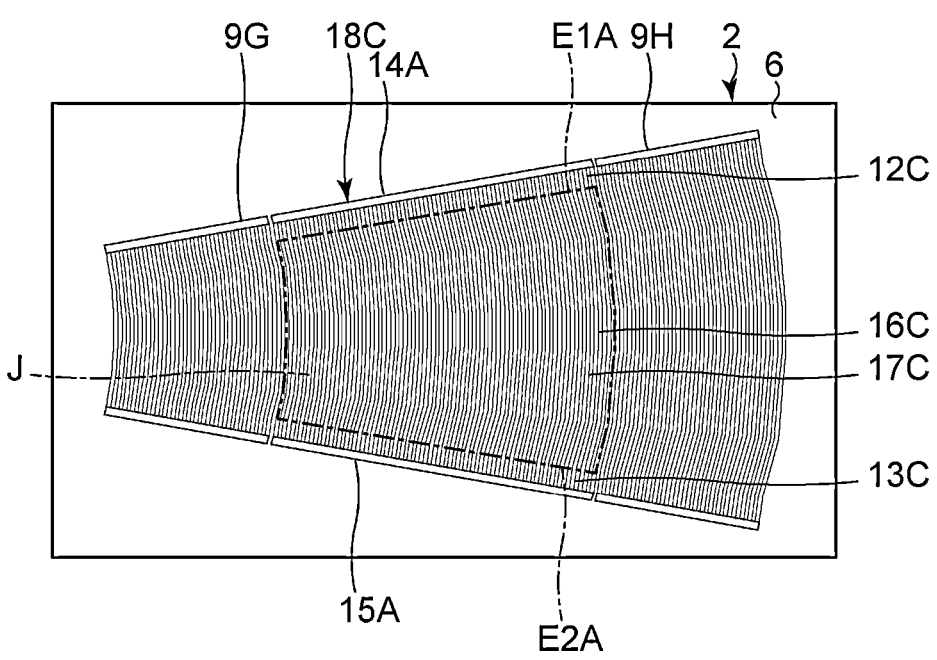
FIG. 14 is a schematic plan view of the excitation angle change resonator of the first filter in a sixth modified example of the first example embodiment of the present invention.

FIG. 14 is a schematic plan view of the excitation angle change resonator of the first filter according to a sixth modified example of the first example embodiment.

In the IDT electrode 18C of the present modified example, the shape of the plurality of first electrode fingers 16C and the plurality of second electrode fingers 17C in a plan view is a shape curved in a plurality of nodes. More specifically, the shape of the plurality of first electrode fingers 16C and the plurality of second electrode fingers 17C in a plan view is a shape in which straight lines are connected to each other in each node. In the present modified example, each electrode finger is curved as a whole to protrude in a right direction in FIG. 14. The shape of each electrode finger in a plan view can be approximated to the arc, the elliptical arc, or a parabola.

Figure 15:
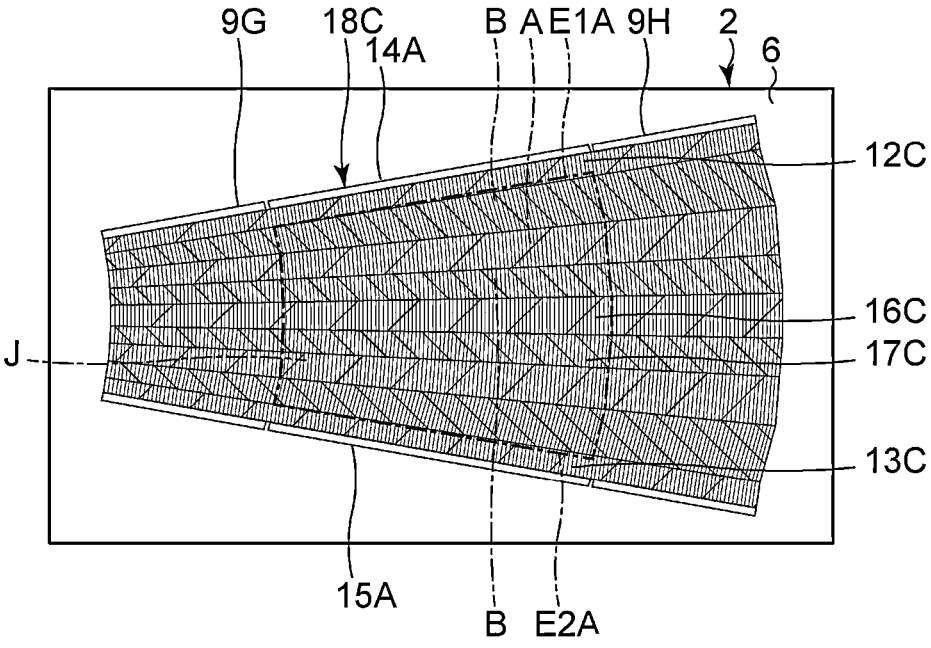
FIG. 15 is a schematic plan view showing a parallel region and a non-parallel region in the sixth modified example of the first example embodiment of the present invention.

FIG. 15 is a schematic plan view showing a parallel region and a non-parallel region according to the sixth modified example of the first example embodiment. In FIG. 15, each region is shown by hatching. The parallel region and a region obtained by extending the parallel region (to be described later) are provided with the same hatching. The non-parallel region and a region obtained by extending the non-parallel region (to be described later) are provided with the same hatching.

The intersection region J has a plurality of parallel regions A and a plurality of non-parallel regions B. Specifically, the parallel region A is a region where the plurality of first electrode fingers 16C and the plurality of second electrode fingers 17C extend in parallel. The non-parallel region B is a region where the extending directions of the plurality of first electrode fingers 16C and the plurality of second electrode fingers 17C intersect each other. The intersection region J may include at least two parallel regions A and at least one non-parallel region B.

In the IDT electrode 18C, all of the parallel regions A and all of the non-parallel regions B respectively include a portion of all of the first electrode fingers 16C and a portion of all of the second electrode fingers 17C. However, the parallel region A does not need to include a portion of all of the first electrode fingers 16C and a portion of all of the second electrode fingers 17C. The same applies to the non-parallel region B.

The parallel region A and the non-parallel region B are alternately provided. Each of the plurality of first electrode fingers 16C and the second electrode fingers 17C linearly extends in the plurality of parallel regions A and the non-parallel regions B, and is curved at a boundary between the parallel region A and the non-parallel region B. In the present example embodiment, the parallel regions A and the non-parallel regions B are alternately located in all of the intersection regions J. In at least a portion of the intersection region J, the parallel region A and the non-parallel region B may be alternately disposed.

In the plurality of parallel regions A, the extending directions of the plurality of electrode fingers are different from each other. Therefore, in the intersection region J, the excitation direction and the excitation angle $\theta_{C\_prop}$ of the acoustic wave are not uniform.

As in each electrode finger of the IDT electrode 18C, the shape of the plurality of reflector electrode fingers of the reflector 9G and the reflector 9H in a plan view is a shape curved in the plurality of nodes. Specifically, the plurality of reflector electrode fingers linearly extend in a region obtained by extending the parallel region A and a region obtained by extending the non-parallel region B. The plurality of reflector electrode fingers are curved at a boundary between the region obtained by extending the parallel region A and the region obtained by extending the non-parallel region B. In this manner, resonance characteristics can be more reliably improved.

In the present modified example, the shape of the plurality of first offset electrodes 12C and the plurality of second offset electrodes 13C in a plan view is preferably linear. The shape of the plurality of first offset electrodes 12C and the plurality of second offset electrodes 13C in a plan view may alternatively be a curve shape in which straight lines are connected to each other.

Figure 16:
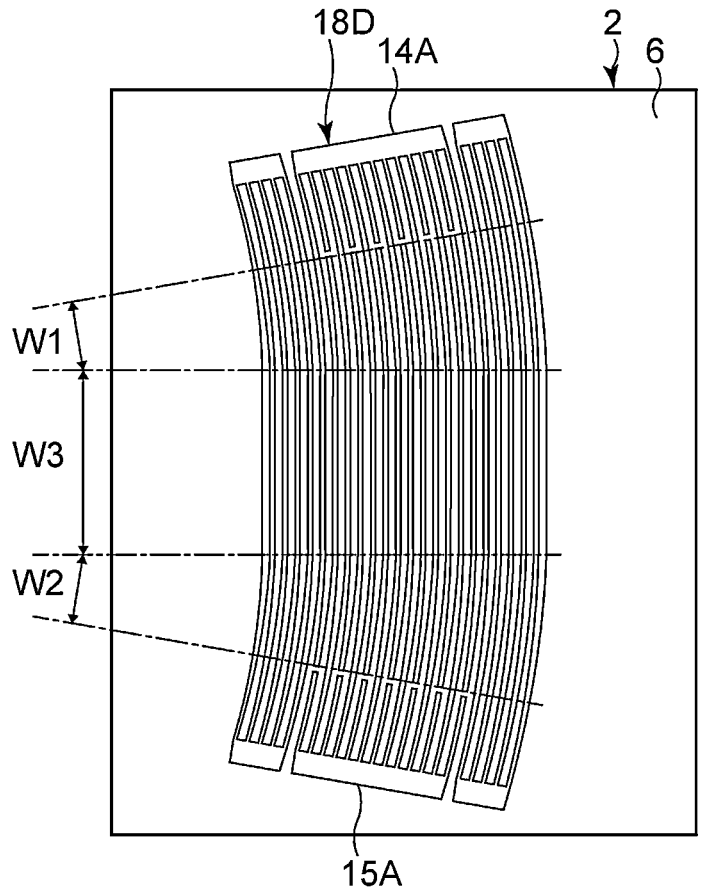
FIG. 16 is a schematic plan view of an excitation angle change resonator of a first filter according to a seventh modified example of the first example embodiment of the present invention.

FIG. 16 is a schematic plan view of the excitation angle change resonator of the first filter according to a seventh modified example of the first example embodiment.

In the present modified example, the plurality of electrode fingers in the IDT electrode 18D include a linear portion. Specifically, the intersection region of the IDT electrode 18D includes a first region W1, a second region W2, and a third region W3. The first region W1, the second region W2, and the third region W3 are aligned in a direction in which the first busbar 14A and the second busbar 15A oppose each other. More specifically, the first region W1 and the second region W2 oppose each other with the third region W3 interposed therebetween. The first region W1 is located on the first busbar 14A side. The second region W2 is located on the second busbar 15A side. In the third region W3, the shape of the plurality of electrode fingers in a plan view is a linear shape.

On the other hand, in the first region W1 and the second region W2, the shape of the plurality of electrode fingers in a plan view is the elliptical arc shape. In this way, each electrode finger includes a portion in which the curvature of the shape in a plan view is different. In the first region W1 and the second region W2, the shape of the plurality of electrode fingers in a plan view may be the arc shape. Alternatively, in the first region W1 and the second region W2, the shape of the plurality of electrode fingers in a plan view may be a curve shape that can be approximated to the arc or the elliptical arc. In the present modified example, the excitation direction and the excitation angle $\theta_{C\_prop}$ of the acoustic waves are not uniform in the intersection region.

In the present modified example, in all of the third regions W3, the extending direction of the propagation axis of the piezoelectric body layer 6 and the extending direction of the plurality of electrode fingers are orthogonal to each other. In the third region W3, the excitation angle $\theta_{C\_prop}$ is about 0°. Therefore, the third region W3 is a stable region with respect to the propagation axis. Since the intersection region has the third region W3, deterioration of a specific band can be reduced or prevented. The specific band is represented by |fr−fa|/fr×100 [%] when the resonant frequency is defined as fr and the anti-resonant frequency is defined as fa. The excitation angle $\theta_{C\_prop}$ in the third region W3 is not limited to about 0°.

Figure 17:
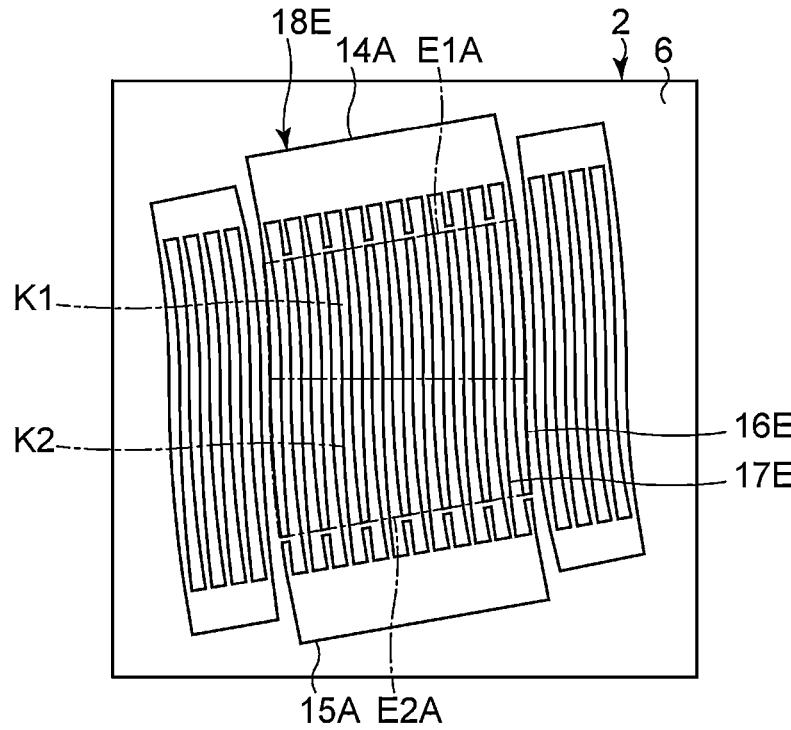
FIG. 17 is a schematic plan view of the excitation angle change resonator of the first filter in an eighth modified example of the first example embodiment of the present invention.

FIG. 17 is a schematic plan view of the excitation angle change resonator of the first filter according to an eighth modified example of the first example embodiment.

In the present modified example, the intersection region has a plurality of curve regions. Specifically, the plurality of curve regions are a first curve region K1 and a second curve region K2. The first curve region K1 includes a first envelope curve E1A. The second curve region K2 includes a second envelope curve E2A. A boundary between the first curve region K1 and the second curve region K2 is linear.

In the present modified example, in each curve region, each shape of the plurality of first electrode fingers 16E and the plurality of second electrode fingers 17E in a plan view is a single arc shape. Each shape of the plurality of electrode fingers in a plan view is a shape obtained by connecting two arcs to each other. In each electrode finger, two curve shapes are inverted from each other at a boundary between the first curve region K1 and the second curve region K2.

Specifically, in the first curve region K1, the plurality of electrode fingers are curved to protrude in the right direction in FIG. 17. Each arc in the shape of a portion located in the first curve region K1 in the plurality of electrode fingers is the arc in a plurality of concentric circles. Therefore, the centers of the circles including the arcs in the shapes of the plurality of electrode fingers coincide with each other in the first curve region K1.

On the other hand, in the second curve region K2, the plurality of electrode fingers are curved to protrude in the left direction in FIG. 17. Each arc in the shape of a portion located in the second curve region K2 in the plurality of electrode fingers is the arc in a plurality of concentric circles. Therefore, the centers of the circles including the arcs in the shapes of the plurality of electrode fingers coincide with each other in the second curve region K2.

The center of the circle including the arc in the shape of the plurality of electrode fingers in the first curve region K1 and the center of the circle including the arc in the shape of the plurality of electrode fingers in the second curve region K2 oppose each other with the IDT electrode 18E interposed therebetween.

In this way, each shape of the plurality of first electrode fingers 16E and the plurality of second electrode fingers 17E in a plan view may include at least two curve shape portions in which curved directions of the first electrode finger 16E and the second electrode finger 17E are different from each other in the intersection region. In this case, in the intersection region, the excitation direction and the excitation angle $\theta_{C\_prop}$ of the acoustic waves are not uniform.

In each curve region, the shape of the plurality of electrode fingers in a plan view may be a single elliptical arc. Alternatively, for example, in each curve region, the shape of the plurality of electrode fingers in a plan view may be a curve shape that can be approximated to the single arc or the elliptical arc.

As in the plurality of electrode fingers in the IDT electrode 18E, each shape of the plurality of reflector electrode fingers of each reflector in a plan view is a shape obtained by connecting two arcs to each other. Each shape of the reflector electrode fingers in a plan view may be a shape obtained by connecting two elliptical arcs to each other. Alternatively, for example, each shape of the reflector electrode fingers in a plan view may be a shape obtained by connecting two curves that can be approximated to the arc or the elliptical arc.

Figure 18:
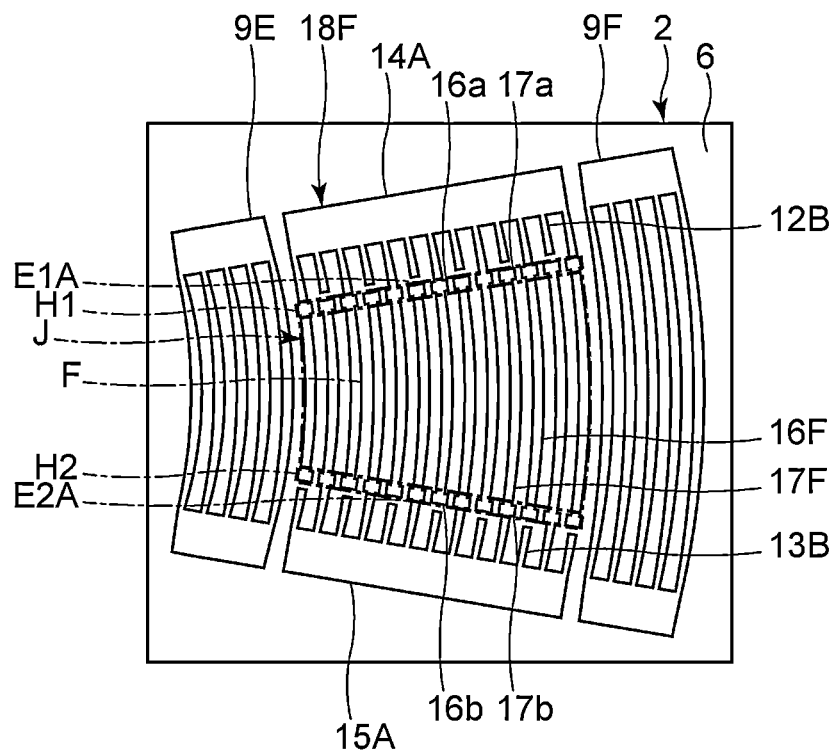
FIG. 18 is a schematic plan view of the excitation angle change resonator of the first filter in a ninth modified example of the first example embodiment of the present invention.

FIG. 18 is a schematic plan view of the excitation angle change resonator of the first filter according to a ninth modified example of the first example embodiment.

The intersection region J of the IDT electrode 18F preferably includes a central region F and a pair of edge regions. Specifically, the pair of edge regions are a first edge region H1 and a second edge region H2. The first edge region H1 includes a first envelope curve E1A as an end edge portion.

The second edge region H2 includes a second envelope curve E2A as an end edge portion. The first edge region H1 and the second edge region H2 oppose each other with the central region F interposed therebetween. It is pointed out that each of the intersection regions of other example embodiments and modified examples also includes the first edge region, the second edge region, and the central region.

The first edge region H1 is a region where the tip portion of the second electrode finger 17F and the adjacent portion of the first electrode finger 16F are located. That is, the first edge region H1 is a region in a range of approximately 1λ along the extending direction of the electrode finger from the tip of the second electrode finger 17F, when the second electrode finger 17F is set as a reference. Similarly, the second edge region H2 is a region in a range of approximately 1λ along the extending direction of the electrode finger from the tip of the first electrode finger 16F, when the first electrode finger is set as the reference.

Each electrode finger of the IDT electrode 18F includes a wide portion in the first edge region H1 and the second edge region H2. The width of the electrode finger in the wide portion is wider than the width of the electrode finger in the central region F.

Specifically, the first electrode finger 16F includes a wide portion 16a in the first edge region H1. The second electrode finger 17F also includes a wide portion 17a in the first edge region H1. On the other hand, the first electrode finger 16F includes a wide portion 16b in the second edge region H2. The second electrode finger 17F also includes a wide portion 17b in the second edge region H2. In this manner, the acoustic velocity in the first edge region H1 and the second edge region H2 is lower than the acoustic velocity in the central region F. In this manner, a low acoustic velocity region is formed in the first edge region H1 and the second edge region H2. The low acoustic velocity region is a region whose acoustic velocity is lower than the acoustic velocity in the central region F. In the low acoustic velocity region, the low acoustic velocity region may be formed in at least a portion of the first edge region H1 and the second edge region H2. However, as in the present modified example, it is preferable that the low acoustic velocity region is formed as a whole in both the first edge region H1 and the second edge region H2.

In the present modified example, the central region F and the pair of low acoustic velocity regions are located in this order from the inner side portion to the outer side portion in the direction in which the first busbar 14A and the second busbar 15A oppose each other. In this manner, a piston mode is established. In this manner, a transverse mode can be reduced or prevented. In addition, energy of a main mode can be effectively confined on the central side portion of the intersection region J, and characteristics of the main mode can be improved.

A configuration of the IDT electrode 18F is preferably the same as that of the fifth modified example except for the first edge region H1 and the second edge region H2. Therefore, in the intersection region, the excitation direction and the excitation angle $\theta_{C\_prop}$ of the acoustic wave are not uniform.

In at least one of the first edge region H1 and the second edge region H2, at least one electrode finger may include the wide portion. However, in at least one of the first edge region H1 and the second edge region H2, it is preferable that the plurality of electrode fingers include the wide portion, and it is more preferable that all of the electrode fingers include the wide portion. In both the first edge region H1 and the second edge region H2, it is more preferable that the plurality of electrode fingers include the wide portion, and it is much more preferable that all of the electrode fingers include the wide portion. In this manner, the piston mode can be more reliably established.

The shape of the plurality of electrode fingers in the IDT electrode 18F in a plan view is the arc shape. However, a configuration in which the low acoustic velocity region is provided in the first edge region H1 or the second edge region H2 in the acoustic wave resonator can also be adopted for another configuration of the present invention in which the shape of the electrode finger is different from that of the present modified example.

In the IDT electrode 18F, the width of each electrode finger is wide over the entire edge region. The shape of each wide portion in a plan view is a quadrangle. However, the width of each electrode finger may be wide in at least a portion of each edge region. The shape of each wide portion in a plan view is not limited to the quadrangle. The width of each reflector electrode finger of each reflector may be wide in a portion located on an extension line of the first edge region H1 and a portion located on an extension line of the second edge region H2.

On the other hand, in a tenth modified example shown in FIG. 19, the plurality of mass addition films 19 are provided. In this manner, the low acoustic velocity region is formed in the first edge region H1 and the second edge region H2. Specifically, in the first edge region H1, the mass addition film 19 is provided on each of the first electrode fingers 16B and on each of the second electrode fingers 17B. The same applies to the second edge region H2. The configuration of the IDT electrode 18B is the same as the configuration of the fifth modified example.

In the present modified example, each of the mass addition films 19 is provided only on one electrode finger. In this case, as a material of the mass addition film 19, appropriate metal or dielectric can be used. However, the mass addition film 19 may be provided over the plurality of electrode fingers. In this case, as the material of the mass addition film 19, appropriate dielectric can be used.

The mass addition film 19 may be laminated with at least one electrode finger in the plurality of electrode fingers in at least one of the first edge region H1 and the second edge region H2. Specifically, in at least one of the first edge region H1 and the second edge region H2, the mass addition film 19 may be provided to overlap at least one of the plurality of first electrode fingers 16B and the plurality of second electrode fingers 17B when viewed in a plan view. In this case, the low acoustic velocity region is formed in at least a portion of at least one of the first edge region H1 and the second edge region H2.

It is preferable that the plurality of electrode fingers are laminated with the mass addition film 19 in at least one of the first edge region H1 and the second edge region H2, and it is more preferable that all of the electrode fingers are laminated with the mass addition film 19. Alternatively, it is more preferable that the plurality of electrode fingers are laminated with the mass addition film 19 in both the first edge region H1 and the second edge region H2. In this manner, the piston mode can be more reliably established. It is much more preferable that all of the electrode fingers are laminated with the mass addition film 19 in both edge regions. In this case, the low acoustic velocity region is formed in all of both edge regions. In this manner, the piston mode can be more reliably established.

In a portion where the electrode finger and the mass addition film 19 are laminated, the piezoelectric substrate 2, the electrode finger, and the mass addition film 19 are laminated in this order. However, in the portion where the electrode finger and the mass addition film 19 are laminated, the piezoelectric substrate 2, the mass addition film 19, and the electrode finger may be laminated in this order. That is, the mass addition film 19 may be provided between the piezoelectric substrate 2 and the electrode finger. A portion located on the extension line of the first edge region H1 and a portion located on the extension line of the second edge region H2 in each reflector electrode finger of each reflector may also be laminated with the mass addition film 19.

As a material of the mass addition film 19, the same metal as the metal used for each electrode finger may be used. This configuration corresponds to a configuration of an eleventh modified example shown in FIGS. 20A and 20B. That is, as shown in FIG. 20A, in an IDT electrode 18G, the thickness of the first edge region H1 and the second edge region H2 of the first electrode finger 16G is thicker than the thickness in the central region F of the first electrode finger 16G. As shown in FIG. 20B, the thickness of the second electrode finger 17G in the first edge region H1 and the second edge region H2 is thicker than the thickness in the central region F of the second electrode finger 17G. In this manner, the low acoustic velocity region is formed in each of the first edge region H1 and the second edge region H2.

FIG. 20A schematically shows a cross section of the first electrode finger 16G along the extending direction of the first electrode finger 16G. Similarly, FIG. 20B schematically shows a cross section of the second electrode finger 17G along the extending direction of the second electrode finger 17G. The configuration of the IDT electrode 18G is the same as that of the fifth modified example except for the first edge region H1 and the second edge region H2.

The thickness of at least one electrode finger in at least one of the first edge region H1 and the second edge region H2 may be thicker than the thickness of the electrode finger in the central region F. However, it is preferable that each thickness of the plurality of electrode fingers in at least one of the first edge region H1 and the second edge region H2 is thicker than the thickness of the electrode finger in the central region F. It is more preferable that each thickness of all of the electrode fingers in at least one of the first edge region H1 and the second edge region H2 is thicker than the thickness of the electrode finger in the central region F.

It is more preferable that each thickness of the plurality of electrode fingers in both the first edge region H1 and the second edge region H2 is thicker than the thickness of the electrode finger in the central region F. It is much more preferable that each thickness of all of the electrode fingers in both the first edge region H1 and the second edge region H2 is thicker than the thickness of the electrode finger in the central region F. In this manner, the piston mode can be more reliably established.

In the present modified example, the thickness of each electrode finger is thicker over all of the edge regions. However, the thickness of each electrode finger may be thicker in at least a portion of each edge region. Each reflector electrode finger of each reflector may also be thicker in a portion located on the extension line of the first edge region H1 and a portion located on the extension line of the second edge region H2. The low acoustic velocity region may be formed by applying a plurality of configurations in the ninth to eleventh modified examples.

Figure 21:
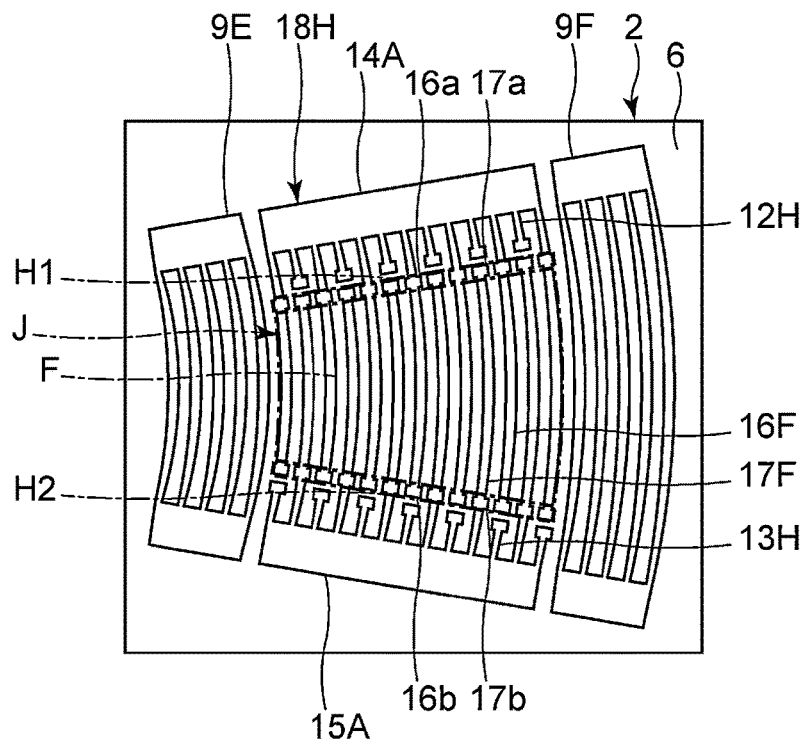
FIG. 21 is a schematic plan view of the excitation angle change resonator of the first filter in a twelfth modified example of the first example embodiment of the present invention.

FIG. 21 is a schematic plan view of the excitation angle change resonator of the first filter according to a twelfth modified example of the first example embodiment.

The configuration of the IDT electrode 18H according to the present modified example is the same as the configuration of the IDT electrode 18F in the ninth modified example, except for the first offset electrode 12H and the second offset electrode 13H. Therefore, in the intersection region J, the excitation direction and the excitation angle $\theta_{C\_prop}$ of the acoustic wave are not uniform. The width of the tip portion of the first offset electrode 12H of the present modified example is wider than the width of other portions of the first offset electrode 12H. The width of the tip portion of the second offset electrode 13H is wider than the width of other portions of the second offset electrode 13H.

Figure 22:
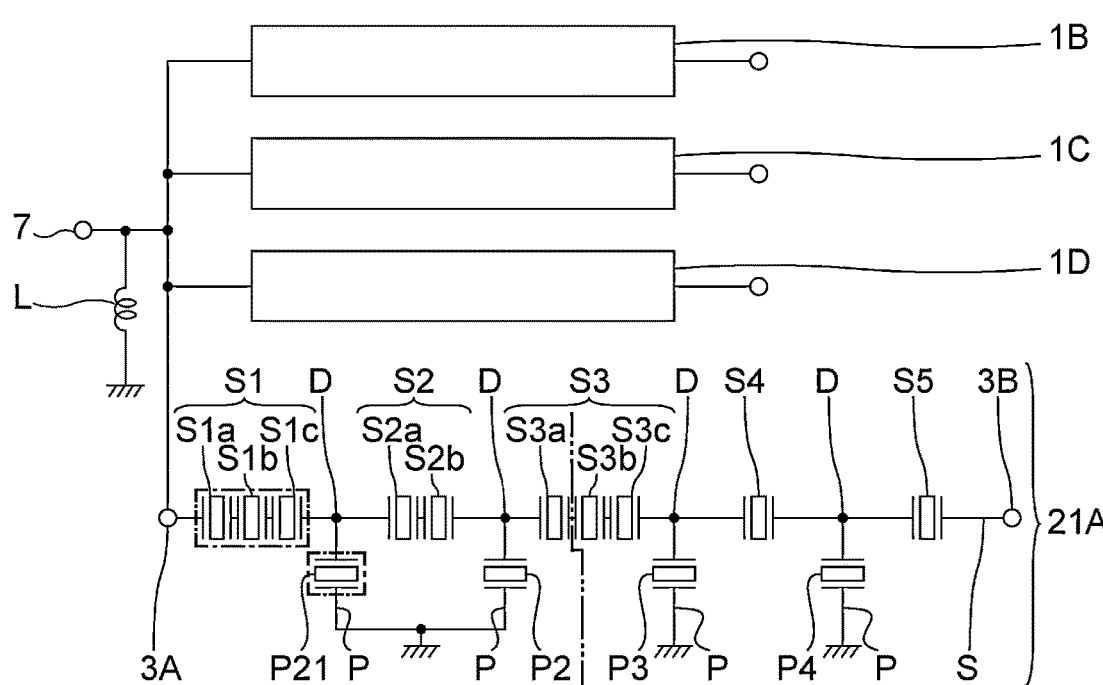
FIG. 22 is a schematic circuit diagram of a multiplexer according to a second example embodiment of the present invention.
Figure 23:
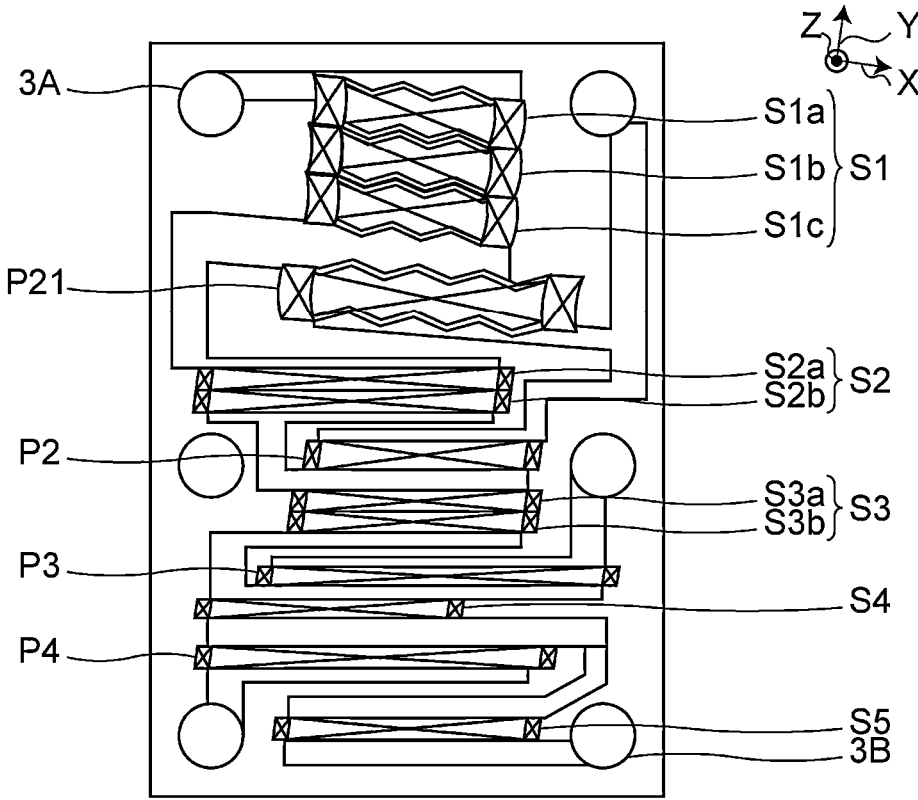
FIG. 23 is a schematic plan view of a first filter in the second example embodiment of the present invention.

FIG. 22 is a schematic circuit diagram of a multiplexer according to a second example embodiment of the present invention. FIG. 23 is a schematic plan view of the first filter in the second example embodiment.

As shown in FIGS. 22 and 23, the present example embodiment is different from the first example embodiment in that the parallel arm resonator of the parallel arm resonator assembly P21 is the excitation angle change resonator. Except for the above-described points, the multiplexer of the present example embodiment preferably has the same or substantially the same configuration as that of the multiplexer 1 of the first example embodiment. In the second example embodiment, the circuit configuration is the same as that of the first example embodiment.

The attenuation frequency characteristics in the vicinity of the frequency where the Rayleigh waves are generated as the unwanted waves outside the band are compared in the first filter 21A in the second example embodiment and the first filter in the first comparative example. The first comparative example is the same as the comparative example according to the comparison shown in FIG. 9. The attenuation frequency characteristics in the first example embodiment are shown together. Structural parameters of the parallel arm resonator of the parallel arm resonator assembly P21 will be described below. The structural parameter of each series arm resonator in the series arm resonator assembly S1 is the same as the structural parameter in the first example embodiment according to the comparison shown in FIG. 9.

The thickness of each member in the parallel arm resonator is the same as the thickness of each member in the series arm resonator. However, the wavelength λ in the parallel arm resonator is different from the wavelength λ in the series arm resonator. Therefore, a value of the thickness of each member in the parallel arm resonator when the wavelength λ is set as a reference is different from the thickness of each member in the series arm resonator when the wavelength λ is set as the reference.

Support Substrate: Material_Si, Surface Orientation_ (100), ψ at Euler Angles (φ, θ, ψ) about 45°

First Layer of Intermediate Layer: Material_SiN, Thickness about 0.491λ

Second Layer of Intermediate Layer: Material_SiO$_2$, Thickness about 0.367λ

Piezoelectric Body Layer: Material Rotational Y-cut 50° X-propagation LiTaO$_3$, Thickness about 0.327λ

IDT Electrode: Material_Al, Thickness about 0.0791λ Dielectric Film: Material SiO$_2$, Thickness about 0.0191λ

Wavelength λ: about 1.8325 μm in the portion where the Excitation Angle $\theta_{C\_prop}$ is about 0°

Figure 24:
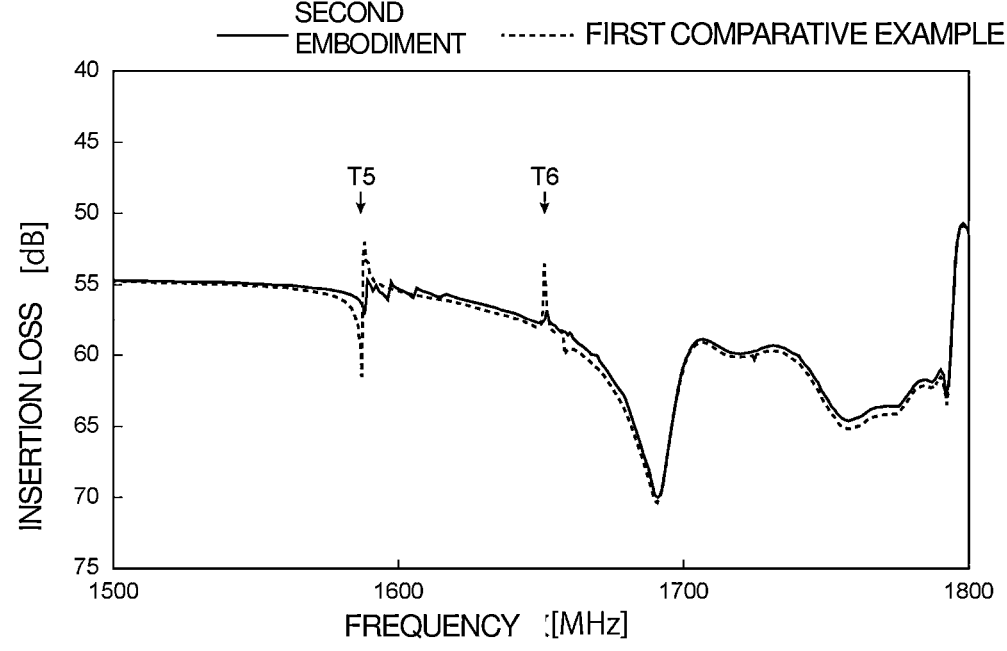
FIG. 24 is a view showing attenuation frequency characteristics in the vicinity of a frequency where a Rayleigh wave is generated, of the first filter in the second example embodiment and the first comparative example of the present invention.
Figure 25:
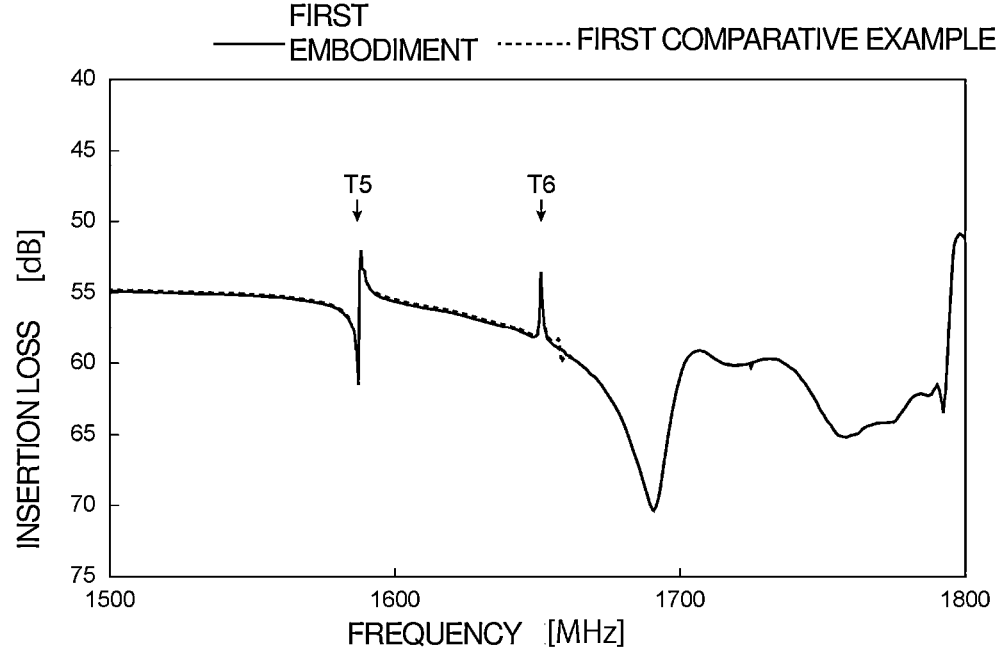
FIG. 25 is a view showing the attenuation frequency characteristics in the vicinity of the frequency where the Rayleigh wave is generated, of the first filter in the first example embodiment and the first comparative example of the present invention.
Figure 25:

FIG. 24 is a view showing the attenuation frequency characteristics in the vicinity of the frequency where the Rayleigh waves are generated, in the first filter according to the second example embodiment and the first comparative example. FIG. 25 is a view showing the attenuation frequency characteristics in the vicinity of the frequency where the Rayleigh waves are generated, in the first filter according to the first example embodiment and the first comparative example.

As shown in FIG. 24, in the first comparative example, the Rayleigh waves are generated in the vicinity of the frequencies indicated by arrows T5 and T6. The Rayleigh waves are the unwanted waves outside the band. On the other hand, in the second example embodiment, it can be understood that the Rayleigh waves are reduced or prevented.

On the other hand, as shown in FIG. 25, the Rayleigh waves are not reduced or prevented in the first example embodiment. In the first example embodiment shown in FIG. 1, unlike the second example embodiment, the parallel arm resonator of the parallel arm resonator assembly P1 in the first filter 1A is not the excitation angle change resonator. Therefore, it can be understood that the Rayleigh waves are generated in the parallel arm resonator of the parallel arm resonator assembly P1. In the second example embodiment, it can be understood that the Rayleigh waves which are the unwanted waves outside the band are reduced or prevented, since the parallel arm resonator is the excitation angle change resonator.

The return loss on the common connection terminal side is measured in the first filter according to the first example embodiment, the second example embodiment, and the first comparative example.

Figure 26:
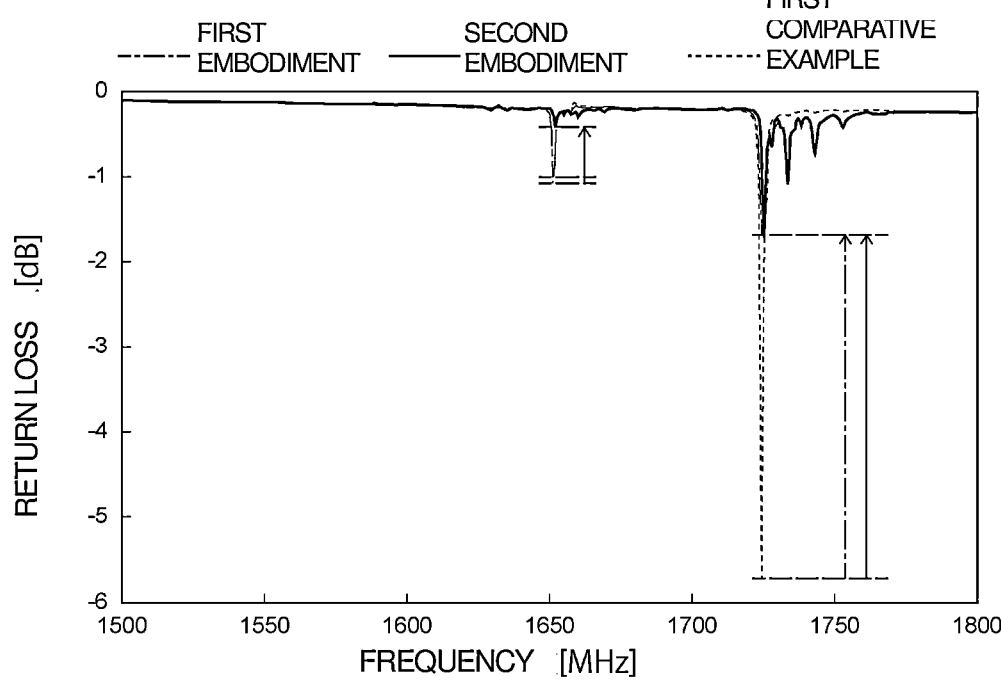
FIG. 26 is a view showing a return loss in the first example embodiment, the second example embodiment, and the first comparative example of the present invention.

FIG. 26 is a view showing the return loss in the first example embodiment, the second example embodiment, and the first comparative example.

As shown in FIG. 26, in the first example embodiment and the second example embodiment, the unwanted wave in the vicinity of about 1,725 MHz can be further reduced or prevented than the first comparative example. The unwanted waves are the unwanted waves generated in the series arm resonator. Furthermore, in the second example embodiment, it can be understood that unwanted waves in the vicinity of about 1,650 MHz can also be reduced or prevented. The unwanted waves are the unwanted waves generated in the parallel arm resonator. Therefore, in the second example embodiment, both the unwanted waves outside the band caused by the series arm resonator and the unwanted waves outside the band caused by the parallel arm resonator can be effectively reduced or prevented. In this manner, in the multiplexer, influence of the unwanted waves on the filter other than the first filter 21A can be effectively reduced or prevented.

In the second example embodiment, the parallel arm resonator assembly P21 includes only one parallel arm resonator, but the parallel arm resonator assembly P21 may include a plurality of parallel arm resonators. In this case, in the plurality of parallel arm resonator assemblies, it is preferable that at least one parallel arm resonator of the parallel arm resonator assembly P21 located closest to the first signal terminal 3A side is the excitation angle change resonator. It is more preferable that half or more of the parallel arm resonators in the parallel arm resonator assembly P21 are the excitation angle change resonators, and it is much more preferable that all of the parallel arm resonators of the parallel arm resonator assembly P21 are the excitation angle change resonators. In this manner, the influence of the unwanted waves on other filters can be effectively reduced or prevented.

It is preferable that at least one resonator of at least one of the series arm resonator assembly S1 located closest to the first signal terminal 3A side and the parallel arm resonator assembly P21 located closest to the first signal terminal 3A side is the excitation angle change resonator. When both the series arm resonator assembly S1 and the parallel arm resonator assembly P21 include the plurality of resonators, it is more preferable that half or more of the resonators in the series arm resonator assembly S1 and the parallel arm resonator assembly P21 are the excitation angle change resonators. In both of these, it is much more preferable that all of the resonators are the excitation angle change resonators. In this manner, the influence of the unwanted waves on other filters can be more reliably and effectively reduced or prevented.

Figure 27:
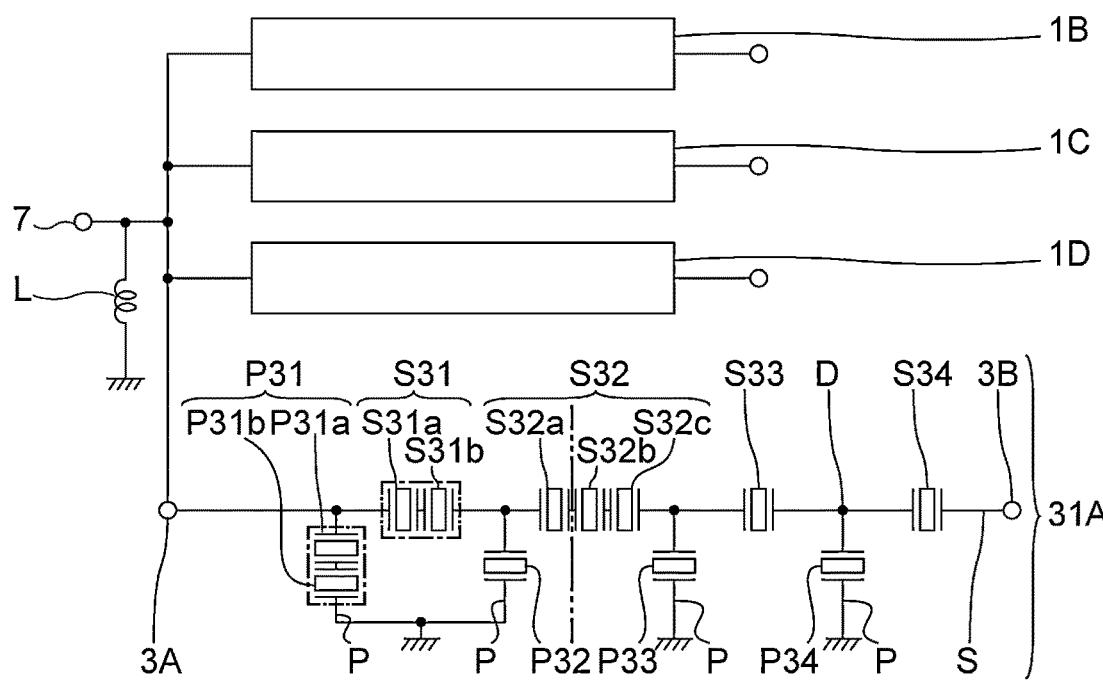
FIG. 27 is a schematic circuit diagram of a multiplexer according to a third example embodiment of the present invention.

FIG. 27 is a schematic circuit diagram of the multiplexer according to a third example embodiment of the present invention.

The present example embodiment is different from the second example embodiment in a circuit configuration of a first filter 31A and a disposition of the excitation angle change resonators. Except for the above-described points, the multiplexer of the present example embodiment has the same or substantially the same configuration as the multiplexer of the second example embodiment.

The plurality of series arm resonator assemblies of the first filter 31A are a series arm resonator assembly S31, a series arm resonator assembly S32, a series arm resonator assembly S33, and a series arm resonator assembly S34. In the present example embodiment, the series arm resonator assembly S31 includes a series arm resonator S31a and a series arm resonator S31b. The series arm resonator S31a and the series arm resonator S31b are connected to each other in series. The series arm resonator assembly S32 includes a series arm resonator S32a, a series arm resonator S32b, and a series arm resonator S32c. The series arm resonator S32a, the series arm resonator S32b, and the series arm resonator S32c are connected to each other in series in this order. On the other hand, each of the series arm resonator assembly S33 and the series arm resonator assembly S34 includes one series arm resonator.

From the first signal terminal 3A side, the series arm resonator assembly S31, the series arm resonator assembly S32, the series arm resonator assembly S33, and the series arm resonator assembly S34 are connected to each other in series in this order.

The plurality of parallel arm resonator assemblies of the first filter 31A are a parallel arm resonator assembly P31, a parallel arm resonator assembly P32, a parallel arm resonator assembly P33, and a parallel arm resonator assembly P34. The parallel arm resonator assembly P31 includes a parallel arm resonator P31a and a parallel arm resonator P31b. The parallel arm resonator P31a and the parallel arm resonator P31b are connected to each other in series. In the present example embodiment, the parallel arm resonator P31a and the parallel arm resonator P31b are resonators divided in series. On the other hand, the parallel arm resonator assembly P32, the parallel arm resonator assembly P33, and the parallel arm resonator assembly P34 include one parallel arm resonator.

When the parallel arm resonator assembly includes the plurality of parallel arm resonators, the plurality of parallel arm resonators do not need to be the parallel arm resonators divided in series. A relationship between the structural parameters in the plurality of parallel arm resonators of the parallel arm resonator assembly is not particularly limited. The plurality of parallel arm resonators of the parallel arm resonator assembly may be connected to each other in series, or may be connected to each other in parallel. Alternatively, the plurality of parallel arm resonators of the parallel arm resonator assembly may be located in the parallel arms different from each other which are located in the same section.

The parallel arm resonator assembly P31 is connected between a node D between the first signal terminal 3A and the series arm resonator assembly S31 and a ground potential. The parallel arm resonator assembly P32 is connected between the node D between the series arm resonator assembly S31 and the series arm resonator assembly S32 and the ground potential. The parallel arm resonator assembly P33 is connected between the node D between the series arm resonator assembly S32 and the series arm resonator assembly S33 and the ground potential. The parallel arm resonator assembly P34 is connected between the node D between the series arm resonator assembly S33 and the series arm resonator assembly S34 and the ground potential. In the present example embodiment, the resonator assemblies located closest to the first signal terminal 3A side in the plurality of resonator assemblies are the series arm resonator assembly S31 and the parallel arm resonator assembly P31.

In the first filter 31A of the present example embodiment, all of the series arm resonators of the series arm resonator assembly S31 and all of the parallel arm resonators of the parallel arm resonator assembly P31 are the excitation angle change resonators. On the other hand, all of the acoustic wave resonators other than these resonators are not the excitation angle change resonators. Specifically, each acoustic wave resonators which is not the excitation angle change resonators is formed in the same manner as that in the acoustic wave resonator shown in FIG. 7. That is, the IDT electrode of each of the acoustic wave resonators is an inclined IDT electrode.

Figure 28:
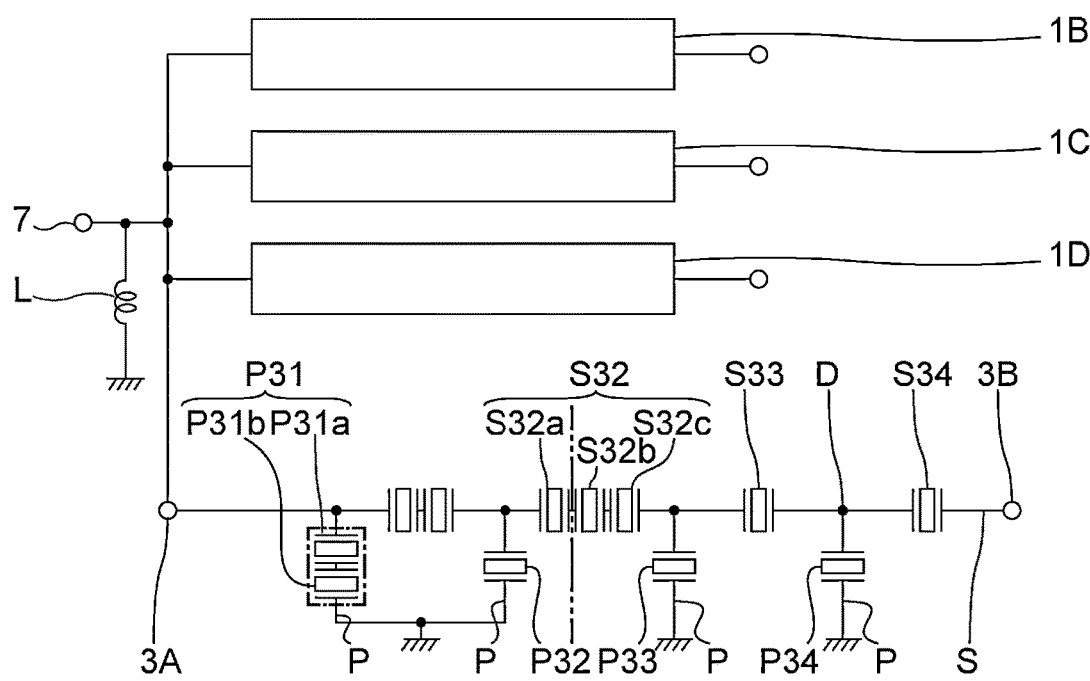
FIG. 28 is a schematic circuit diagram of a multiplexer according to a modified example of the third example embodiment of the present invention.

For example, only the parallel arm resonator of the parallel arm resonator assembly P31 may be the excitation angle change resonator. In the modified example of the third example embodiment shown in FIG. 28, in the first filter, all of the parallel arm resonators of the parallel arm resonator assembly P31 are the excitation angle change resonators. On the other hand, all of the acoustic wave resonators other than the parallel arm resonators of the parallel arm resonator assembly P31 are formed in the same manner as that in the acoustic wave resonator shown in FIG. 7.

The return losses on the common connection terminal side of the first filter are compared in the third example embodiment, the modified example thereof, and the second comparative example. The second comparative example is different from the third example embodiment in that all of the acoustic wave resonators are formed in the same manner as that in the acoustic wave resonator shown in FIG. 7. The circuit configuration of the multiplexer of the second comparative example is the same as the circuit configuration of the third example embodiment.

Figure 29:
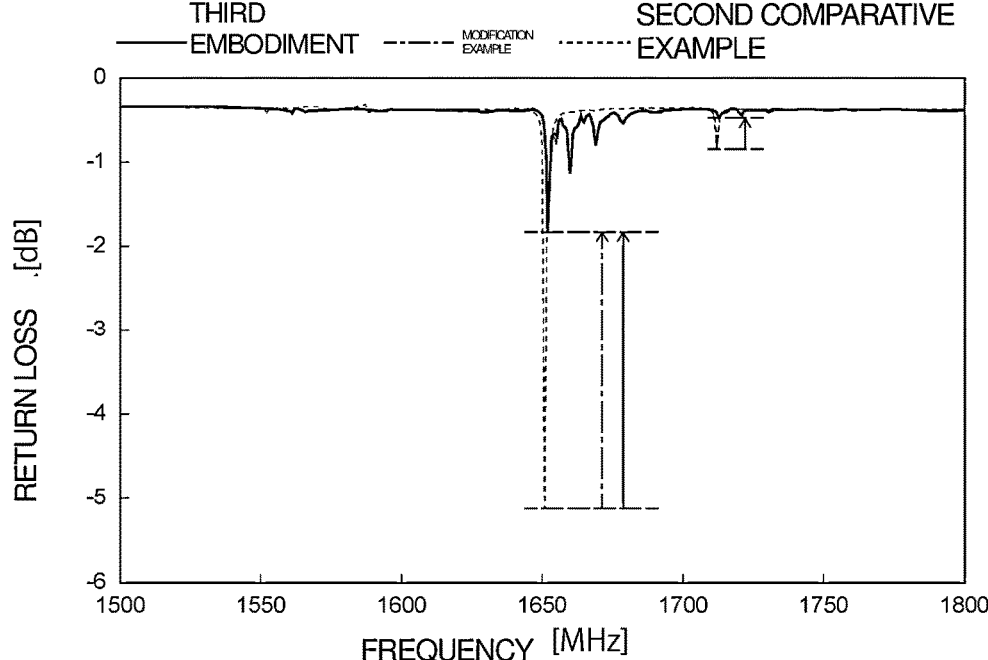
FIG. 29 is a view showing a return loss in a third example embodiment of the present invention, a modified example thereof, and a second comparative example.

FIG. 29 is a view showing the return losses in the third example embodiment, the modified example thereof, and the second comparative example.

The unwanted waves generated in the vicinity of about 1,725 MHz shown in FIG. 29 are the unwanted waves generated in the series arm resonator. The unwanted waves generated in the vicinity of about 1,650 MHz are the unwanted waves generated in the parallel arm resonator. In the third example embodiment and the modified example thereof, it can be understood that the unwanted waves caused by the parallel arm resonator can be further reduced or prevented than the second comparative example. The reason is that in the third example embodiment and the modified example thereof, each parallel arm resonator of the parallel arm resonator assembly P31 is the excitation angle change resonator.

In the modified example of the third example embodiment, the unwanted waves in the vicinity of about 1,725 MHz are generated to the same or substantially the same extent as that in the second comparative example. On the other hand, in the third example embodiment, the unwanted waves in the vicinity of about 1,725 MHz can be reduced or prevented. The reason is that in the third example embodiment, each series arm resonator of the series arm resonator assembly S31 is the excitation angle change resonator.

In the third example embodiment, both of the unwanted waves outside the band caused by the series arm resonator and the unwanted waves outside the band caused by the parallel arm resonator can be effectively reduced or prevented. In this manner, influence of the unwanted waves on the filter other than the first filter 31A can be effectively reduced or prevented in the multiplexer.

Figure 30:
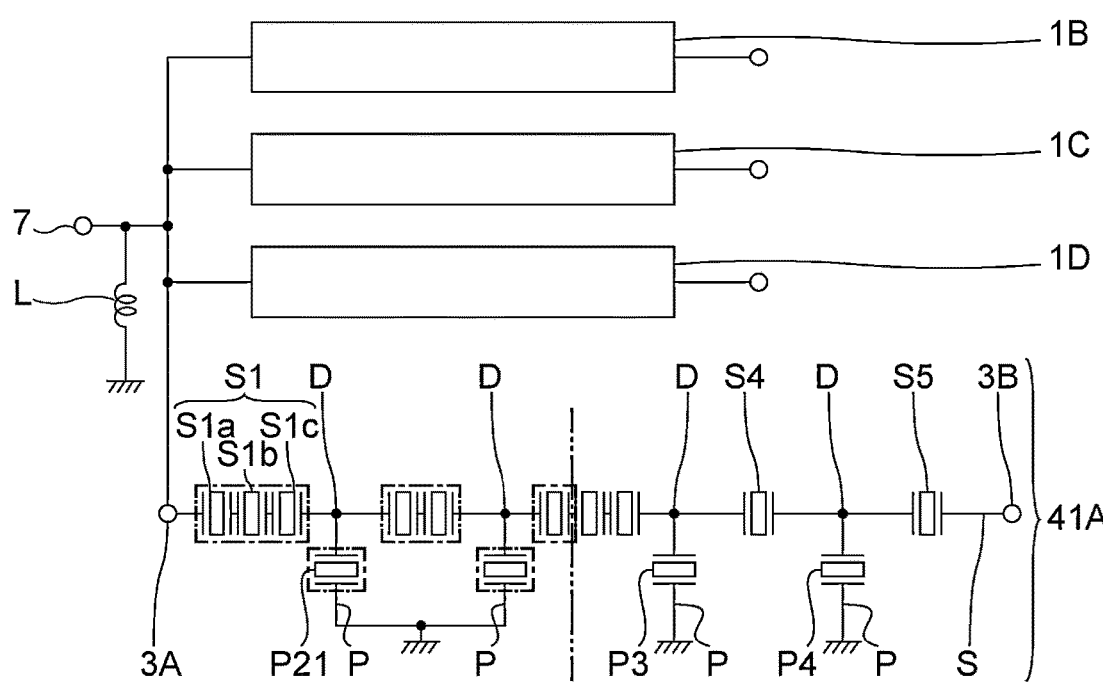
FIG. 30 is a schematic circuit diagram of a multiplexer according to a fourth example embodiment of the present invention.

FIG. 30 is a schematic circuit diagram of the multiplexer according to a fourth example embodiment of the present invention.

The present example embodiment is different from the first example embodiment in that all of the front half resonators are the excitation angle change resonators. Except for the above-described points, the multiplexer of the present example embodiment has the same or substantially the same configuration as the multiplexer of the second example embodiment.

As described above, when the unwanted waves outside the band are generated in the front half resonators, the influence of the unwanted wave on other filters is particularly large. In addition, in the present example embodiment, all of the front half resonators are the excitation angle change resonators. Therefore, the unwanted waves outside the band can be reduced or prevented in all of the front half resonators. In this manner, it is possible to reduce or prevent the influence of the unwanted waves such as the Rayleigh waves on the filter other than the first filter 41A in the multiplexer.

Figure 31:
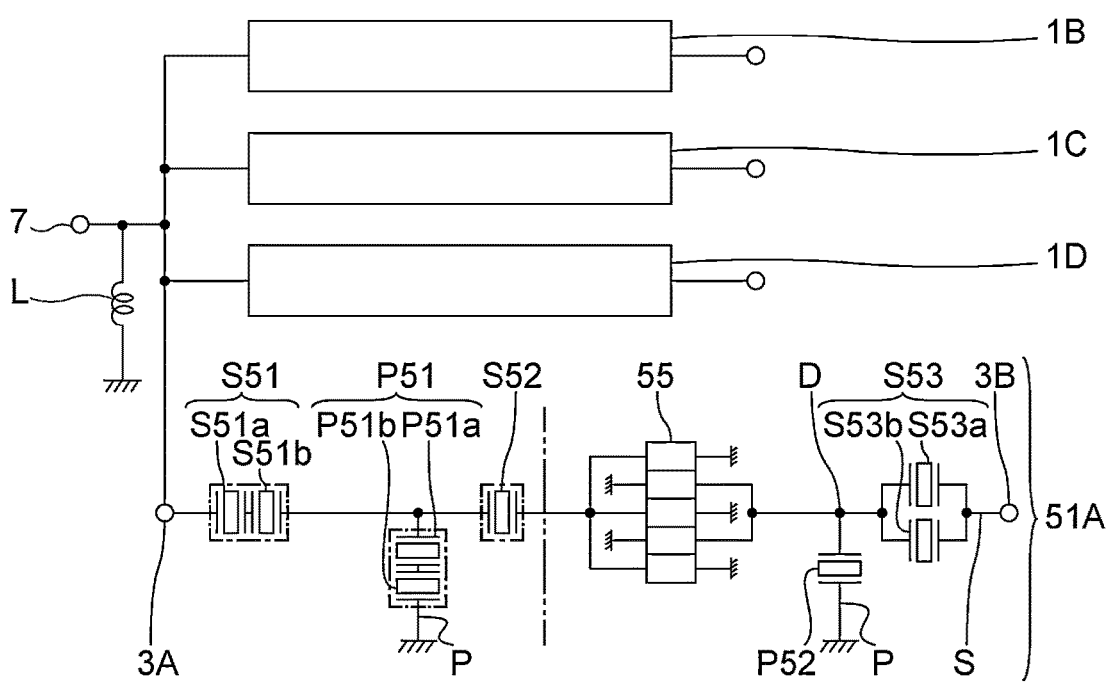
FIG. 31 is a schematic circuit diagram of a multiplexer according to a fifth example embodiment of the present invention.

FIG. 31 is a schematic circuit diagram of the multiplexer according to a fifth example embodiment of the present invention.

The present example embodiment is different from the second example embodiment in a circuit configuration of a first filter 51A and a disposition of the excitation angle change resonators. The present example embodiment is different from the second example embodiment in that the first filter 51A includes a longitudinally coupled resonator acoustic wave filter 55. Except for the above-described points, the multiplexer of the present example embodiment preferably has the same or substantially the same configuration as the multiplexer of the second example embodiment.

The longitudinally coupled resonator acoustic wave filter 55 of the first filter 51A has a configuration of one stage of 5 IDT type. However, the number of IDT electrodes of the longitudinally coupled resonator acoustic wave filter 55 is not limited to five. For example, the longitudinally coupled resonator acoustic wave filter 55 may be 3 IDT type, 7 IDT type, or 9 IDT type. The longitudinally coupled resonator acoustic wave filter 55 may have a configuration of two or more stages.

In the present specification, in the ladder portion forming the filter, the longitudinally coupled resonator acoustic wave filter 1s treated as the series arm resonator assembly. Even when the longitudinally coupled resonator acoustic wave filter has the configuration of two or more stages, the longitudinally coupled resonator acoustic wave filter 1*s* treated as one series arm resonator assembly in the ladder portion.

The longitudinally coupled resonator acoustic wave filter 55 is provided between the first signal terminal 3A and the second signal terminal 3B.

The plurality of series arm resonator assemblies of the first filter 51A are a series arm resonator assembly S51, a series arm resonator assembly S52, and a series arm resonator assembly S53. In the present example embodiment, the series arm resonator assembly S51 includes a series arm resonator S51*a* and a series arm resonator S51*b*. The series arm resonator S51*a* and the series arm resonator S51*b* are connected to each other in series. The series arm resonator assembly S53 includes a series arm resonator S53*a* and a series arm resonator S53*b*. The series arm resonator S53*a* and the series arm resonator S53*b* are connected to each other in parallel. On the other hand, the series arm resonator assembly S52 includes one series arm resonator.

The series arm resonator assembly S51 and the series arm resonator assembly S52 are connected between the first signal terminal 3A and the longitudinally coupled resonator acoustic wave filter 55. In the series arm resonator assembly S51 and the series arm resonator assembly S52, the series arm resonator assembly S51 is located on the first signal terminal 3A side. The series arm resonator assembly S53 is connected between the longitudinally coupled resonator acoustic wave filter 55 and the second signal terminal 3B.

The plurality of parallel arm resonator assemblies of the first filter 51A are a parallel arm resonator assembly P51 and a parallel arm resonator assembly P52. The parallel arm resonator assembly P51 includes a parallel arm resonator P51*a* and a parallel arm resonator P51*b*. The parallel arm resonator P51*a* and the parallel arm resonator P51*b* are connected to each other in series. On the other hand, the parallel arm resonator assembly P52 includes one parallel arm resonator.

The parallel arm resonator assembly P51 is connected between the node D between the series arm resonator assembly S51 and the series arm resonator assembly S52 and the ground potential. The parallel arm resonator assembly P52 is connected between the node D between the longitudinally coupled resonator acoustic wave filter 55 and the series arm resonator assembly S53 and the ground potential. In the present example embodiment, in the plurality of resonator assemblies, the resonator assembly located closest to the first signal terminal 3A side is the series arm resonator assembly S51.

Figure 32:
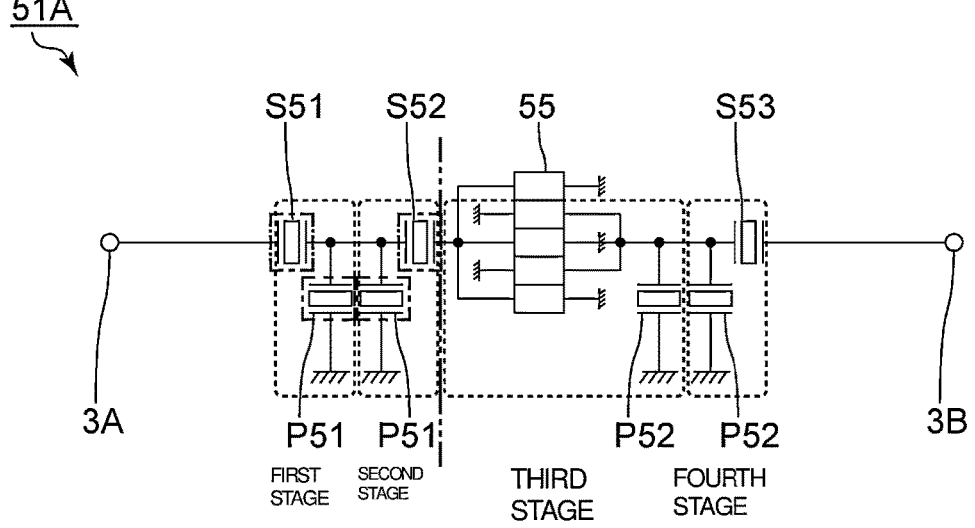
FIG. 32 is a circuit diagram describing a ladder portion of the first filter in the fifth example embodiment of the present invention.

FIG. 32 is a circuit diagram describing the ladder portion of the first filter according to the fifth example embodiment. In FIG. 32, in order to describe the ladder portion, for convenience, one parallel arm and the parallel arm resonator assembly located on the parallel arm are indicated by reference numerals of two parallel arms and two resonators.

In the first filter 51A, the ladder portions in four stages are formed between the first signal terminal 3A and the second signal terminal 3B. The ladder portions in first to fourth stages are aligned in order from the first signal terminal 3A side to the second signal terminal 3B side. The ladder portion in the third stage is the ladder portion in which the longitudinally coupled resonator acoustic wave filter 55 is treated as one series arm resonator assembly.

In the present example embodiment, the ladder portion in the first stage and the ladder portion in the second stage are the front half ladder portions. The front half resonators are the series arm resonators S51*a*, the series arm resonator S51*b*, the parallel arm resonator P51*a*, the parallel arm resonator P51*b*, and the series arm resonator of the series arm resonator assembly S52 which are shown in FIG. 31. All of the front half resonators are the excitation angle change resonators. Therefore, the unwanted waves outside the band can be reduced or prevented in all of the front half resonators. Therefore, the influence of the unwanted wave on the filter other than the first filter 51A in the multiplexer can be effectively reduced or prevented.

In the first to fifth example embodiments, when the resonator assembly includes the plurality of resonators, and all of the plurality of resonators are the excitation angle change resonators, the plurality of resonators are formed in the same manner. However, the configurations of the plurality of excitation angle change resonators included in the same resonator assembly may be different from each other. This example will be described by a sixth example embodiment. The circuit configuration in the sixth example embodiment is the same as that of the first example embodiment. Therefore, the drawings and the reference numerals which are used in describing the first example embodiment may be used in describing the sixth example embodiment.

Figure 33:
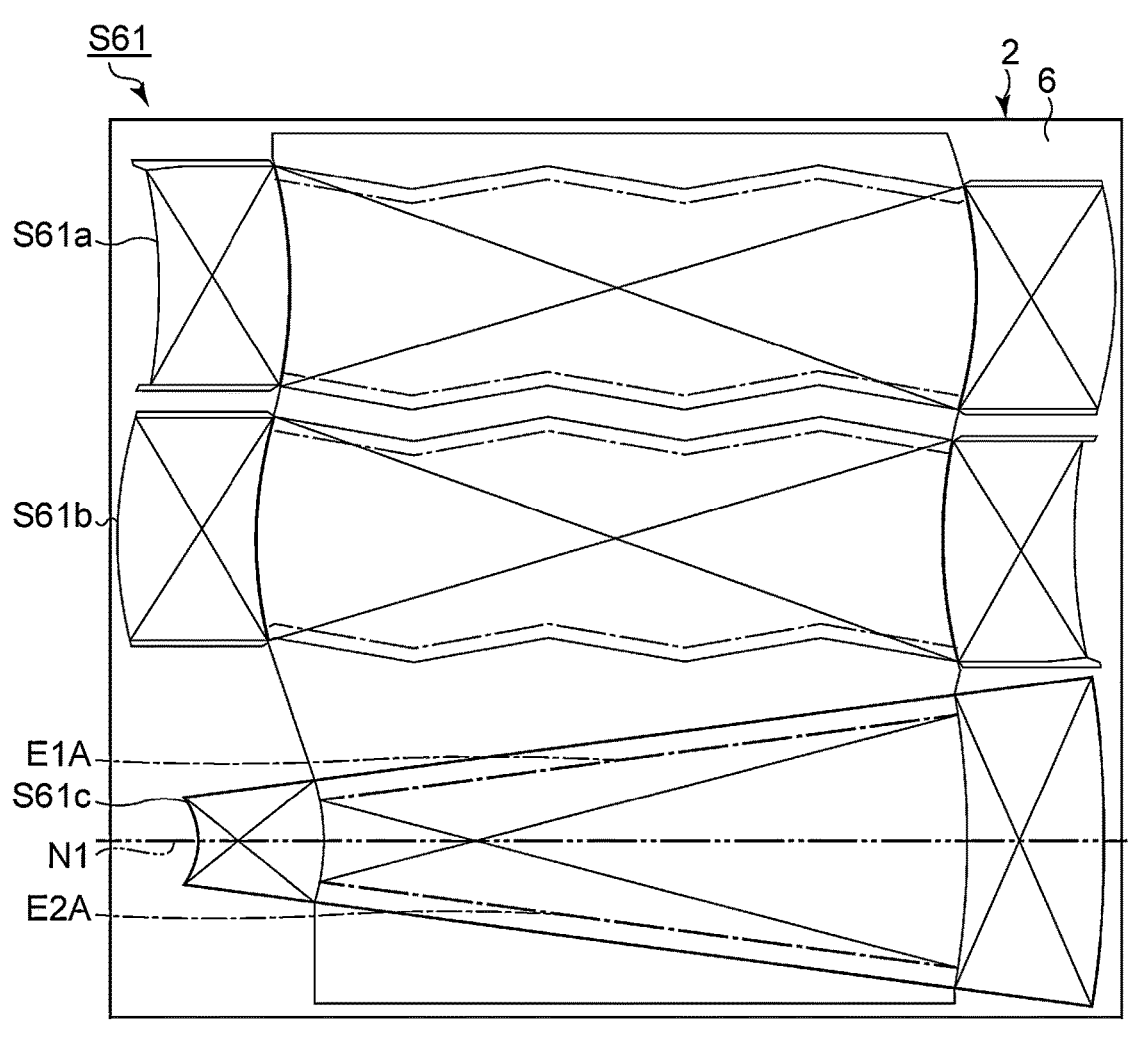
FIG. 33 is a schematic plan view of a plurality of excitation angle change resonators of the first filter in a sixth example embodiment of the present invention.

FIG. 33 is a schematic plan view of the plurality of excitation angle change resonators of the first filter in the sixth example embodiment. FIG. 33 shows the plurality of series arm resonators in the series arm resonator assembly S61 located closest to the first signal terminal 3A side in the plurality of series arm resonator assemblies.

The present example embodiment is different from the first example embodiment in that the configurations of three series arm resonators in the series arm resonator assembly S61 are different from each other. Except for the above-described points, the multiplexer of the present example embodiment has the same or substantially the same configuration as that of the multiplexer 1 of the first example embodiment.

The series arm resonator assembly S61 includes a series arm resonator S61*a*, a series arm resonator S61*b*, and a series arm resonator S61*c*. The series arm resonator S61*a*, the series arm resonator S61*b*, and the series arm resonator S61*c* are connected to each other in series in this order.

The series arm resonator S61*a*, the series arm resonator S61*b*, and the series arm resonator S61*c* are connected to each other by a wiring electrode. In FIG. 33, a solid boundary line is drawn between each busbar and the wiring electrode. In this manner, in FIG. 33, each busbar and the wiring electrode are schematically divided and shown. In the present example embodiment, each busbar and the wiring electrode are integrally formed of the same material. However, each busbar and the wiring electrode may be formed of materials different from each other. Alternatively, multilayer configurations of each busbar and the wiring electrode may be different from each other.

The series arm resonator S61*a* and the series arm resonator S61*b* are formed in the same manner as that in the excitation angle change resonator in the first example embodiment shown in FIG. 5. However, duty ratios of the series arm resonator S61*a* and the series arm resonator S61*b* are different from each other. In addition, the series arm resonator S61*a* and the series arm resonator S61*b* are disposed to be different from each other by about 180°. Specifically, the plurality of electrode fingers of the series arm resonator S61*a* are curved to protrude in the right direction in FIG. 33. The plurality of electrode fingers in the series arm resonator S61*b* are curved to protrude in the left direction in FIG. 33.

The series arm resonator S61$c$ is formed in the same manner as that in the excitation angle change resonator in the fifth modified example of the first example embodiment shown in FIG. 13. A two-dot chain line N1 in FIG. 33 coincides with the reference line. An angle between the extension line of the first envelope curve E1A and the reference line is the intersection angle $\theta_{C\_AP1}$, and an angle between the extension line of the second envelope curve E2A and the reference line is the intersection angle $\theta_{C\_AP2}$.

In the series arm resonator S61$c$, the duty ratio is changed in accordance with the excitation angle $\theta_{C\_prop}$ such that the resonant frequencies or the anti-resonant frequencies substantially coincide with each other in all of the intersection regions. The plurality of electrode fingers in the series arm resonator S61$c$ are curved to protrude in the right direction in FIG. 33.

In the first filter of the present example embodiment, the unwanted waves outside the band can be effectively reduced or prevented. The reason is that each series arm resonator of the series arm resonator assembly S61 is the excitation angle change resonator, and in addition, that the frequency of the unwanted waves generated in each series arm resonator can be dispersed. This will be described below. The structural parameters of the series arm resonator S61$a$ are as follows. The structural parameters are the same as the structural parameters of the excitation angle change resonator in the first example embodiment according to the comparison shown in FIG. 9.

Support Substrate: Material_Si, Surface Orientation_ (100), $\psi$ at Euler Angles ($\varphi$, $\theta$, $\psi$) about 45°

First Layer of Intermediate Layer: Material_SiN, Thickness about 0.514$\lambda$

Second Layer of Intermediate Layer: Material SiO$_2$, Thickness about 0.384$\lambda$ Piezoelectric Body Layer: Material_Rotational Y-cut 50° X-propagation LiTaO$_3$, Thickness about 0.343$\lambda$ IDT Electrode: Material_Al, Thickness about 0.05$\lambda$ Dielectric Film: Material SiO$_2$, Thickness about 0.02$\lambda$ Wavelength $\lambda$: about 1.7509 μm in the portion where the Excitation Angle $\theta_{C\_prop}$ is about 0°

Number of Pairs of Electrode Fingers of IDT Electrode: 100 pairs

Duty Ratio: about 0.5

Gap Length: about 0.135$\lambda$

Length of Offset Electrode: about 3.5$\lambda$

Distance in Direction Orthogonal to Propagation Axis between First Envelope Curve and Second Envelope Curve: about 25$\lambda$ First Envelope curve: Absolute Value of Inclination Angle with respect to Propagation Axis about 20°, Number of Pairs of Electrode Fingers Between Bending Portions V1_20 Pairs Second Envelope Curve: Absolute Value of Inclination Angle with respect to Propagation Axis: about 20°, Number of Pairs of Electrode Fingers between Bending Portions V2: 20 pairs Excitation Angle on First Envelope Curve: $\theta_{C\_AP1\_1}$=about 12°, $\theta_{C\_AP1\_2}$=about 8°, $\theta_{C\_AP1\_3}$=about 16°, $\theta_{C\_AP1\_4}$=about 10°, $\theta_{C\_AP1\_5}$=about 16°, $\theta_{C\_AP1\_6}$=about 9°

Excitation Angle on Second Envelope Curve: $\theta_{C\_AP1\_1}$=about 9°, $\theta_{C\_AP1\_2}$=about 15°, $\theta_{C\_AP1\_3}$=about 8°, $\theta_{C\_AP1\_4}$=about 15.5°, $\theta_{C\_AP1\_5}$=about 10°, $\theta_{C\_AP1\_6}$=about 16°

Each Reflector: Number of Pairs of Reflector Electrode Fingers_20 Pairs

The structural parameters of the series arm resonator S61$b$ are different from the structural parameters of the series arm resonator S61$a$ only in that the duty ratio is about 0.634.

In the series arm resonator S61$c$, for example, the duty ratio is about 0.5 in the portion where the excitation angle $\theta_{C\_prop}$ is about 0°. The duty ratio decreases as the absolute value of the excitation angle $\theta_{C\_prop}$ increases. The intersection angle $\theta_{C\_AP1}$ is about 7.5°. The intersection angle $\theta_{C\_AP2}$ is about −7.5°.

Figure 34:
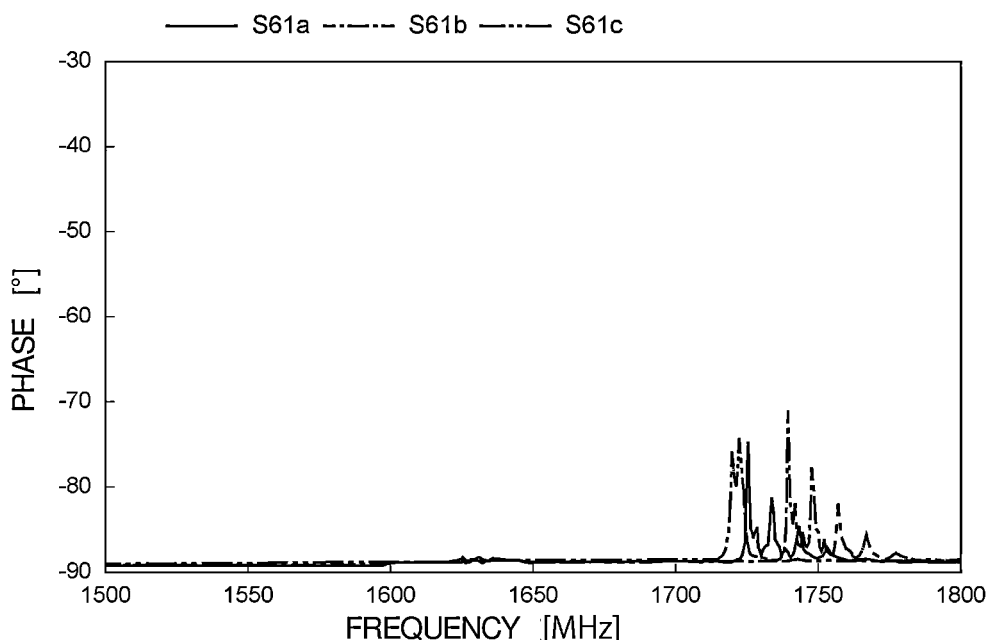
FIG. 34 is a view showing phase characteristics of each of the excitation angle change resonators in the sixth example embodiment of the present invention.

FIG. 34 is a view showing phase characteristics of each excitation angle change resonator in the sixth example embodiment of the present invention.

As shown in FIG. 34, the unwanted waves are sufficiently reduced or prevented in the series arm resonator S61$a$, the series arm resonator S61$b$, and the series arm resonator S61$c$, which are the excitation angle change resonators. Furthermore, it can be understood that the frequencies at which the unwanted waves are generated are different from each other in the series arm resonators. In this manner, the unwanted waves can be effectively reduced or prevented as a whole in the plurality of series arm resonators of the series arm resonator assembly S61. In this manner, influence of the unwanted waves on the filter other than the first filter can be effectively reduced or prevented in the multiplexer.

As described above, when the unwanted waves are generated in the front half resonators, the influence of the unwanted waves on other filters is particularly large. In particular, when the unwanted waves are generated in the resonator in the resonator assembly located closest to the first signal terminal 3A side in the plurality of resonator assemblies, the influence of the unwanted waves on other filters is larger. In the present example embodiment, types of shapes of the electrode fingers in a plan view are different from each other in the series arm resonator S61$a$ and the series arm resonator S61$c$ of the series arm resonator assembly S61 which are located closest to the first signal terminal 3A side. In this manner, the frequencies at which the unwanted waves are generated can be different from each other in both the series arm resonators.

In the present specification, the type of the shape of the electrode finger in a plan view means the type of the shape such as the arc or the elliptical arc. For example, description that the types of the shapes of the electrode fingers are different in a plan view means a case where one has the arc shape and the other has the elliptical arc shape, or a case where one has the arc shape and the other has the curve shape that can be approximated to the arc. For example, when the shapes of both the electrode fingers in a plan view are the curve shapes that can be approximated to the arc, and parameters having any constant value are different from each other, the types of the shapes of both the electrode fingers in a plan view are the same. Alternatively, for example, when the shape of both the electrode fingers is the arc in a plan view, and aspects in which any parameter is changed in accordance with the excitation angle $\theta_{C\_prop}$ are different from each other, the types of the shapes of both the electrode fingers in a plan view are the same. In the present example embodiment, the types of the shapes of the electrode fingers in a plan view are the same in the series arm resonator S61$a$ and the series arm resonator S61$b$.

The duty ratio of the series arm resonator S61$a$ and the series arm resonator S61$b$ is constant. In both the resonators, the duty ratios in the portion where the excitation angle $\theta_{C\_prop}$ is about 0° are different from each other. In this manner, the frequencies at which the unwanted waves are generated can be more reliably different from each other in both the resonators.

An advantageous effect that the frequency at which the unwanted waves are generated can be dispersed in the sixth example embodiment will be further described. The return losses on the common connection terminal side are compared in the first filter in the first example embodiment, the sixth example embodiment, and the first comparative example. In the first example embodiment, all of the excitation angle change resonators have the same shape in the series arm resonator assembly S1 shown in FIG. 3.

Figure 35:
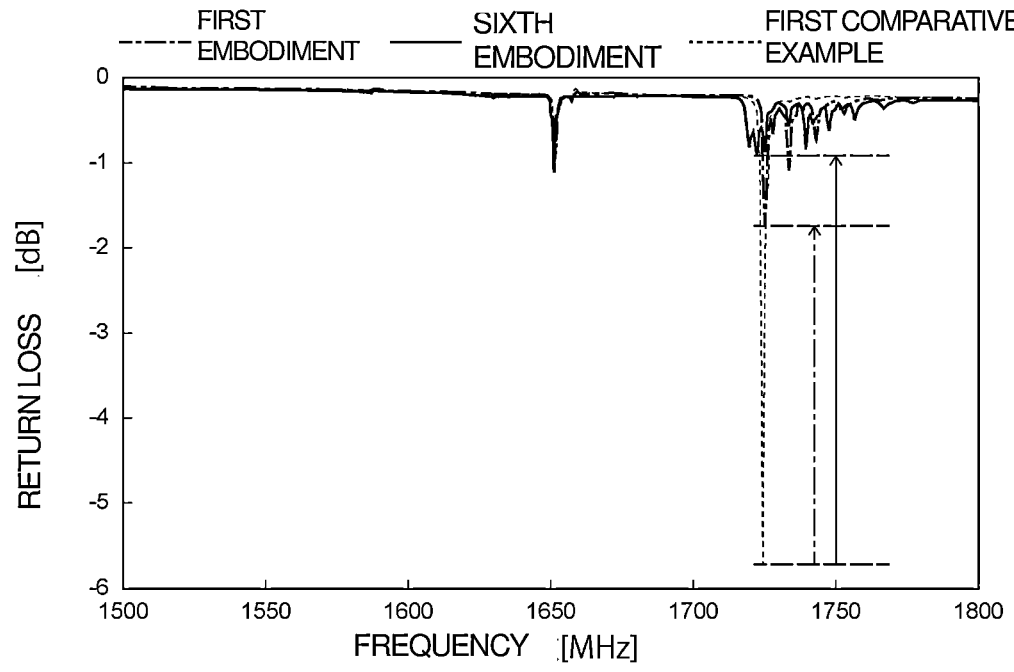
FIG. 35 is a view showing a return loss in the first example embodiment, the sixth example embodiment, and the first comparative example of the present invention.

FIG. 35 is a view showing the return losses in the first example embodiment, the sixth example embodiment, and the first comparative example.

As shown in FIG. 35, in the first example embodiment and the sixth example embodiment, the unwanted wave in the vicinity of 1,725 MHz can be further reduced or prevented than the first comparative example. Furthermore, in the sixth example embodiment, it can be understood that the unwanted waves in the vicinity of 1,725 MHz can be further reduced or prevented than the first example embodiment.

Hereinafter, when the resonator assembly located closest to the first signal terminal side includes the plurality of resonators, even when the resonator assembly is any one of the series arm resonator assembly and the parallel arm resonator assembly, a preferable configuration will be described.

It is preferable that the resonator assembly located closest to the first signal terminal side includes at least two excitation angle change resonators, and that the types of the shapes of the electrode fingers in a plan view between at least two of the excitation angle change resonators are different from each other. As this example, for example, in at least one of the excitation angle change resonators included in the resonator assembly located closest to the first signal terminal side, the shape of the electrode finger in a plan view is the arc. In this case, in at least another excitation angle change resonator, the shape of the electrode finger in a plan view may be any shape other than the arc. In this manner, the frequency of the unwanted waves generated in the plurality of resonators of the resonator assembly can be more reliably dispersed, and the unwanted waves can be more reliably and effectively reduced or prevented.

It is more preferable that the resonator assembly located closest to the first signal terminal side includes at least three excitation angle change resonators, and that the types of the shapes of the electrode fingers in a plan view are different from each other in at least three of the excitation angle change resonators in the resonator assembly. In this manner, the frequency of the unwanted waves generated in the plurality of resonators of the resonator assembly can be more reliably dispersed, and the unwanted waves can be more reliably and effectively reduced or prevented.

The duty ratio in the portion where at least the excitation angle $\theta_{C\_prop}$ is about 0° is constant in each of at least two of the excitation angle change resonators in the resonator assembly located closest to the first signal terminal side. In this case, it is preferable that the duty ratios in the portion where the excitation angle $\theta_{C\_prop}$ is about 0° are different from each other in at least two of the excitation angle change resonators in the resonator assembly. Alternatively, the duty ratio in the portion where at least the excitation angle $\theta_{C\_prop}$ is about 0° is constant in each of at least three of the excitation angle change resonators in the resonator assembly located closest to the first signal terminal side. In this case, it is more preferable that the duty ratios in the portion where the excitation angle $\theta_{C\_prop}$ is about 0° are different from each other in at least three of the excitation angle change resonators in the resonator assembly. In this manner, the frequency of the unwanted waves generated in the plurality of resonators of the resonator assembly can be more reliably dispersed, and the unwanted waves can be more reliably and effectively reduced or prevented.

It is preferable that the resonant frequencies or the anti-resonant frequencies in the intersection region substantially coincide with each other in at least two excitation angle change resonators included in the resonator assembly located closest to the first signal terminal side. The excitation angle change resonators correspond to the resonators divided in series or divided in parallel. High power tends to be applied to the resonator assembly. In contrast, the resonators having the desired resonant frequency or the desired anti-resonant frequency are divided in series or divided in parallel. Therefore, the applied power can be dispersed. Therefore, the resonators having the desired resonant frequency or the desired anti-resonant frequency are less likely to be damaged.

Figure 36:
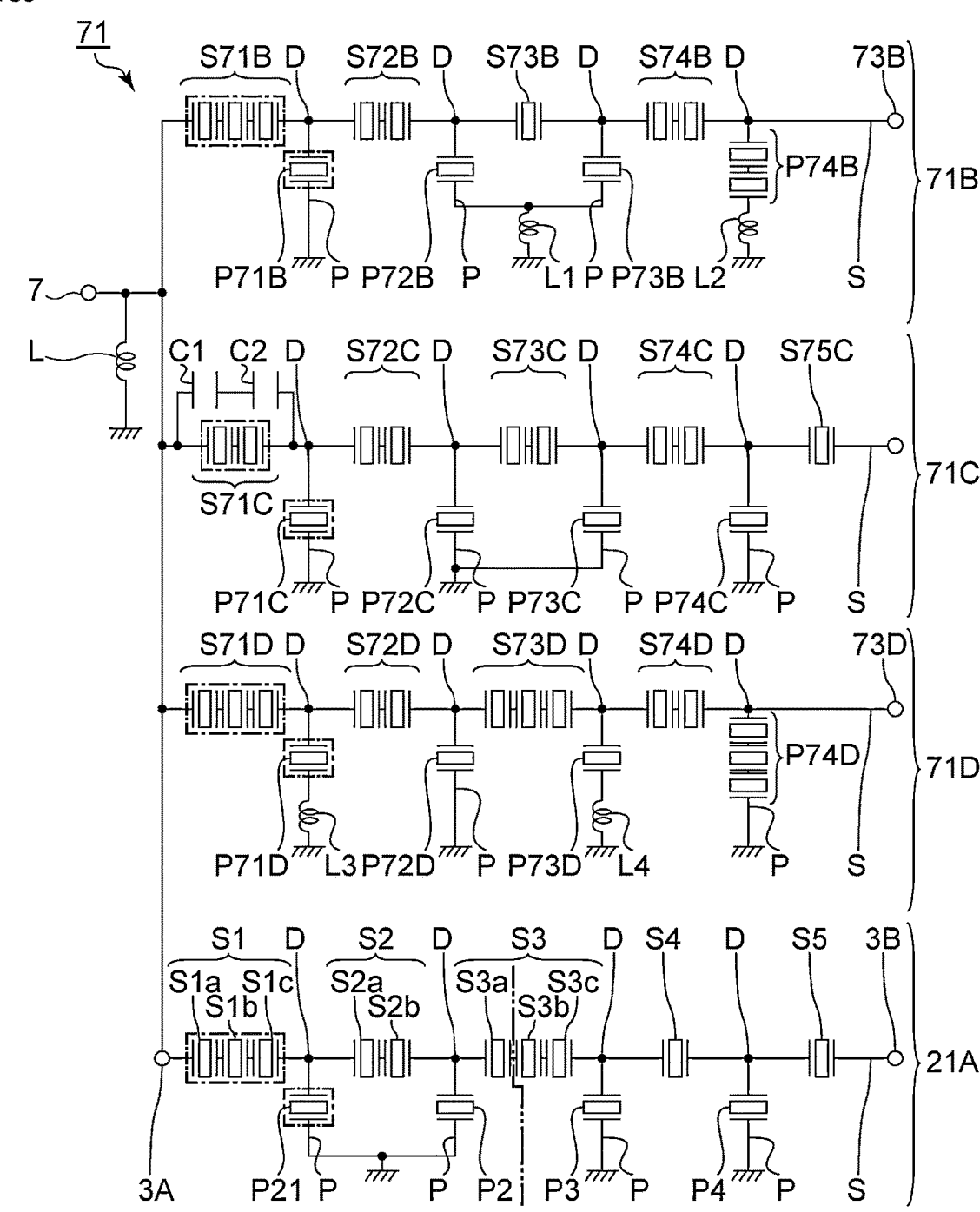
FIG. 36 is a circuit diagram of a multiplexer according to a seventh example embodiment of the present invention.

FIG. 36 is a circuit diagram of a multiplexer according to a seventh example embodiment of the present invention.

A multiplexer 71 includes a first filter 21A, a second filter 71B, a third filter 71C, and a fourth filter 71D. The pass band of each filter 1*s* the same or substantially the same as that of the first example embodiment and the second example embodiment.

The configuration of the first filter 21A is the same or substantially the same as that of the second example embodiment. Therefore, all of the resonators of the series arm resonator assembly S1 and the parallel arm resonator assembly P21 which are located closest to the common connection terminal 7 side in the first filter 21A are the excitation angle change resonators. The same applies to each filter other than the first filter. That is, in the present example embodiment, in all filters connected in common to the common connection terminal 7, all of the resonators in the series arm resonator assembly and the parallel arm resonator assembly which are located closest to the common connection terminal 7 side are the excitation angle change resonators. In this manner, the influence of the unwanted waves can be effectively reduced or prevented in all of the filters in the multiplexer 71.

Hereinafter, the circuit configurations of the second filter 71B, the third filter 71C, and the fourth filter 71D will be described. Each of the second filter 71B, the third filter 71C, and the fourth filter 71D includes a signal terminal, a plurality of series arm resonator assemblies, and a plurality of parallel arm resonator assemblies.

The plurality of series arm resonator assemblies of the second filter 71B are a series arm resonator assembly S71B, a series arm resonator assembly S72B, a series arm resonator assembly S73B, and a series arm resonator assembly S74B. The series arm resonator assembly S71B includes three series arm resonators connected to each other in series. Each of the series arm resonator assembly S72B and the series arm resonator assembly S74B includes two series arm resonators connected to each other in series. On the other hand, the series arm resonator assembly S73B includes one series arm resonator.

The series arm resonator assembly S71B, the series arm resonator assembly S72B, the series arm resonator assembly S73B, and the series arm resonator assembly S74B are connected to each other in series in this order from the common connection terminal 7 side. In the plurality of series arm resonator assemblies, the series arm resonator assembly S71B is located closest to the common connection terminal 7 side.

The plurality of parallel arm resonator assemblies of the second filter 71B are a parallel arm resonator assembly P71B, a parallel arm resonator assembly P72B, a parallel arm resonator assembly P73B, and a parallel arm resonator assembly P74B. The parallel arm resonator assembly P74B includes two parallel arm resonators connected to each other in series. On the other hand, each of the parallel arm resonator assembly P71B, the parallel arm resonator assembly P72B, and the parallel arm resonator assembly P73B includes one parallel arm resonator.

The parallel arm resonator assembly P71B is connected between the node D between the series arm resonator assembly S71B and the series arm resonator assembly S72B and the ground potential. The parallel arm resonator assembly P72B is connected between the node D between the series arm resonator assembly S72B and the series arm resonator assembly S73B and the ground potential. The parallel arm resonator assembly P73B is connected between the node D between the series arm resonator assembly S73B and the series arm resonator assembly S74B and the ground potential. The parallel arm resonator assembly P74B is connected between the node D between the series arm resonator assembly S74B and the signal terminal 73B and the ground potential. In the plurality of parallel arm resonator assemblies, the parallel arm resonator assembly P71B is located closest to the common connection terminal 7 side.

The second filter 71B includes an inductor L1 and an inductor L2. The parallel arm resonator assembly P72B and the parallel arm resonator assembly P73B are connected in common to the inductor L1. The inductor L1 is connected to the ground potential. The inductor L2 is connected between the parallel arm resonator assembly P74B and the ground potential.

The plurality of series arm resonator assemblies of the third filter 71C are a series arm resonator assembly S71C, a series arm resonator assembly S72C, a series arm resonator assembly S73C, a series arm resonator assembly S74C, and a series arm resonator assembly S75C. Each of the series arm resonator assembly S71C, the series arm resonator assembly S72C, the series arm resonator assembly S73C, and the series arm resonator assembly S74C includes two series arm resonators connected to each other in series. On the other hand, the series arm resonator assembly S75C includes one series arm resonator.

The series arm resonator assembly S71C, the series arm resonator assembly S72C, the series arm resonator assembly S73C, the series arm resonator assembly S74C, and the series arm resonator assembly S75C are connected to each other in series in this order from the common connection terminal 7 side. In the plurality of series arm resonator assemblies, the series arm resonator assembly S71C is located closest to the common connection terminal 7 side.

The plurality of parallel arm resonator assemblies of the third filter 71C are a parallel arm resonator assembly P71C, a parallel arm resonator assembly P72C, a parallel arm resonator assembly P73C, and a parallel arm resonator assembly P74C. Each parallel arm resonator assembly of the third filter 71C includes one parallel arm resonator.

The parallel arm resonator assembly P71C is connected between the node D between the series arm resonator assembly S71C and the series arm resonator assembly S72C and the ground potential. The parallel arm resonator assembly P72C is connected between the node D between the series arm resonator assembly S72C and the series arm resonator assembly S73C and the ground potential. The parallel arm resonator assembly P73C is connected between the node D between the series arm resonator assembly S73C and the series arm resonator assembly S74C and the ground potential. The parallel arm resonator assembly P74C is connected between the node D between the series arm resonator assembly S74C and the series arm resonator assembly S75C and the ground potential. In the plurality of parallel arm resonator assemblies, the parallel arm resonator assembly P71C is located closest to the common connection terminal 7 side.

The third filter 71C includes a capacitance element C1 and a capacitance element C2. The capacitance element C1 and the capacitance element C2 are connected in parallel to the series arm resonator assembly S71C. The capacitance element C1 and the capacitance element C2 are connected to each other in series in this order from the common connection terminal 7 side.

The plurality of series arm resonator assemblies of the fourth filter 71D are a series arm resonator assembly S71D, a series arm resonator assembly S72D, a series arm resonator assembly S73D, and a series arm resonator assembly S74D. Each of the series arm resonator assembly S71D and the series arm resonator assembly S73D includes three series arm resonators connected to each other in series. Each of the series arm resonator assembly S72D and the series arm resonator assembly S74D includes two series arm resonators connected to each other in series.

The series arm resonator assembly S71D, the series arm resonator assembly S72D, the series arm resonator assembly S73D, and the series arm resonator assembly S74D are connected to each other in series in this order from the common connection terminal 7 side. In the plurality of series arm resonator assemblies, the series arm resonator assembly S71D is located closest to the common connection terminal 7 side.

The plurality of parallel arm resonator assemblies of the fourth filter 71D are a parallel arm resonator assembly P71D, a parallel arm resonator assembly P72D, a parallel arm resonator assembly P73D, and a parallel arm resonator assembly P74D. The parallel arm resonator assembly P74D includes three parallel arm resonators connected to each other in series. On the other hand, each of the parallel arm resonator assembly P71D, the parallel arm resonator assembly P72D, and the parallel arm resonator assembly P73D includes one parallel arm resonator.

The parallel arm resonator assembly P71D is connected between the node D between the series arm resonator assembly S71D and the series arm resonator assembly S72D and the ground potential. The parallel arm resonator assembly P72D is connected between the node D between the series arm resonator assembly S72D and the series arm resonator assembly S73D and the ground potential. The parallel arm resonator assembly P73D is connected between the node D between the series arm resonator assembly S73D and the series arm resonator assembly S74D and the ground potential. The parallel arm resonator assembly P74D is connected between the node D between the series arm resonator assembly S74D and the signal terminal 73D and the ground potential. In the plurality of parallel arm resonator assemblies, the parallel arm resonator assembly P71D is located closest to the common connection terminal 7 side.

The fourth filter 71D includes an inductor L3 and an inductor L4. The inductor L3 is connected between the parallel arm resonator assembly P71D and the ground potential. The inductor L4 is connected between the parallel arm resonator assembly P73D and the ground potential.

In the present example embodiment, all of the filters of the multiplexer 71 are mounted on the same mounting substrate. The communication bands of the multiplexer 71 are Band 1 and Band 3. Specifically, the first filter 21A is a reception filter of Band 1. The second filter 71B is a transmission filter of Band 3. The third filter 71C is a reception filter of Band 3. The fourth filter 71D is a transmission filter of Band 1. However, the multiplexer 71 may include filters that are not mounted on the same mounting substrate.

In this case, for example, the multiplexer 71 may include a module substrate on which the mounting substrate is mounted. A filter that does not share the mounting substrate with the first filter 21A, the second filter 71B, the third filter 71C, and the fourth filter 71D may be mounted on the module substrate. The first filter 21A, the second filter 71B, the third filter 71C, the fourth filter 71D, and other filters may be connected in common to the common connection terminal 7. The common connection terminal 7 may be provided on the module substrate.

For example, the multiplexer 71 may include the reception filter of Band 32 in addition to the transmission filter and the reception filter of Band 1 and the transmission filter and the reception filter of Band 3. The pass band of the reception filter 1s preferably about 1,452 MHz to about 1,496 MHz, for example.

The frequency at which the Rayleigh waves are generated in the resonator of the transmission filter of Band 1 tends to be located inside the pass band of the reception filter. However, in the fourth filter 71D defining and functioning as the resonator of the transmission filter of Band 1, the influence of the Rayleigh waves which are the unwanted waves on other filters can be reduced or prevented.

For example, the multiplexer 71 may include Band 7, Band 41, and the transmission filter of n77, or n78. Alternatively, the multiplexer 71 may include the reception filter of n77 or n78. The pass band of the transmission filter of Band 7 is preferably about 2,500 MHz to about 2,570 MHz. The pass band of the transmission filter of Band 41 is preferably about 2,496 MHz to about 2,690 MHz. The band of n77 is preferably about 3,300 MHz to about 4,800 MHz. The band of n78 is preferably about 3,300 MHz to about 4,200 MHz.

There is a possibility that the frequency at which the unwanted waves are generated in the resonator of other filters is located inside the pass band of the transmission filter or the reception filter. However, in the first filter 21A, the second filter 71B, the third filter 71C, and the fourth filter 71D, the influence of the unwanted waves generated on the higher band side than the anti-resonant frequency of the resonator on other filters can be reduced or prevented.

Incidentally, in the first filter defining and functioning as the filter device according to the present invention, the multilayer configuration of the piezoelectric substrate is not limited to the configuration shown in FIG. 4. Through an eighth example embodiment, an example in which the first filter includes the piezoelectric substrate different from that of the first example embodiment will be described.

Figure 37:
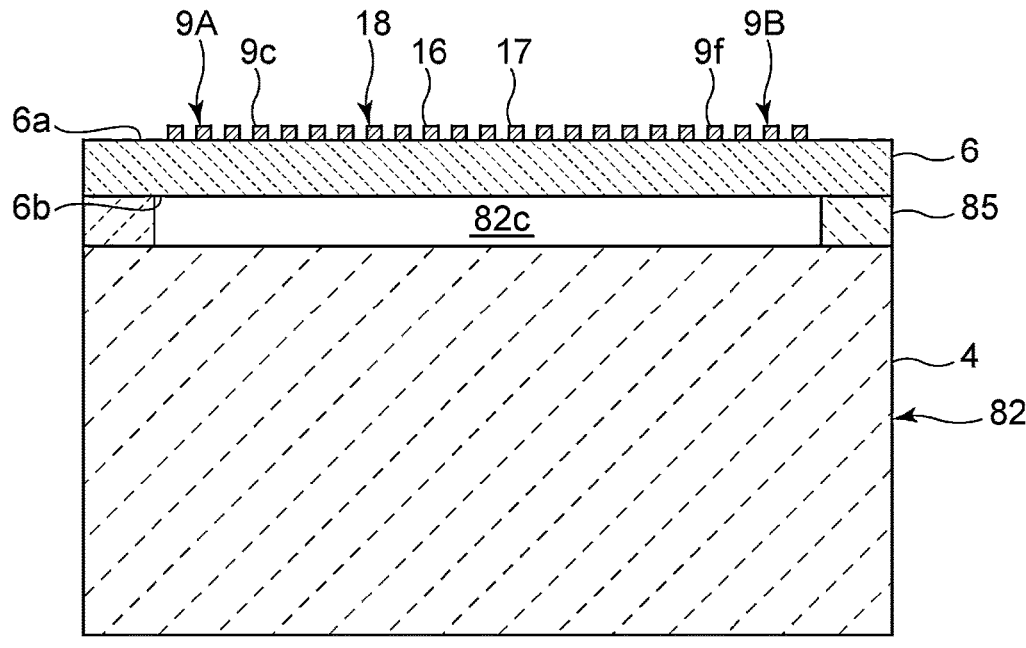
FIG. 37 is a schematic elevational cross-sectional view of the excitation angle change resonator of the first filter in an eighth example embodiment of the present invention.

FIG. 37 is a schematic elevational cross-sectional view of the excitation angle change resonator of the first filter according to the eighth example embodiment.

The present example embodiment is different from the first example embodiment in a multilayer configuration of a piezoelectric substrate 82. The present example embodiment is different from the first example embodiment in that the dielectric film 8 is not provided on the piezoelectric substrate 82. Except for the above-described points, the multiplexer of the present example embodiment has the same configuration as that of the multiplexer 1 of the first example embodiment.

The piezoelectric substrate 82 includes the support substrate 4, an intermediate layer 85, and the piezoelectric body layer 6. The intermediate layer 85 is provided on the support substrate 4. The piezoelectric body layer 6 is provided on the intermediate layer 85. In the present example embodiment, the intermediate layer 85 preferably has a frame shape. That is, the intermediate layer 85 includes a through-hole. The support substrate 4 closes one side of the through-hole of the intermediate layer 85. The piezoelectric body layer 6 closes the other side of the through-hole of the intermediate layer 85. In this manner, a hollow portion 82c is formed in the piezoelectric substrate 82. A portion of the piezoelectric body layer 6 and a portion of the support substrate 4 oppose each other with the hollow portion 82c interposed therebetween. At least a portion of the IDT electrode 18 overlaps the hollow portion 82c in a plan view.

In the present example embodiment, the main mode can be reflected to the piezoelectric body layer 6 side. Therefore, energy of the acoustic wave can be effectively confined on the piezoelectric body layer 6 side. In addition, as in the first example embodiment, the influence of the unwanted waves can be reduced or prevented in the multiplexer.

The piezoelectric substrate 82 may include a plurality of the hollow portions 82c. In addition, the plurality of IDT electrodes in the first filter may overlap the hollow portions 82c different from each other in a plan view. Alternatively, the plurality of IDT electrodes may overlap the same hollow portion 82c in a plan view.

Hereinafter, a first modified example and a second modified example of the eighth example embodiment which are different from the eighth example embodiment only in the multilayer configuration of the piezoelectric substrate will be described. As in the eighth example embodiment, in the first modified example and the second modified example, the influence of unwanted waves can also be reduced or prevented in the multiplexer. Furthermore, in the first filter, the energy of the acoustic wave can be effectively confined on the piezoelectric body layer 6 side.

Figure 38:
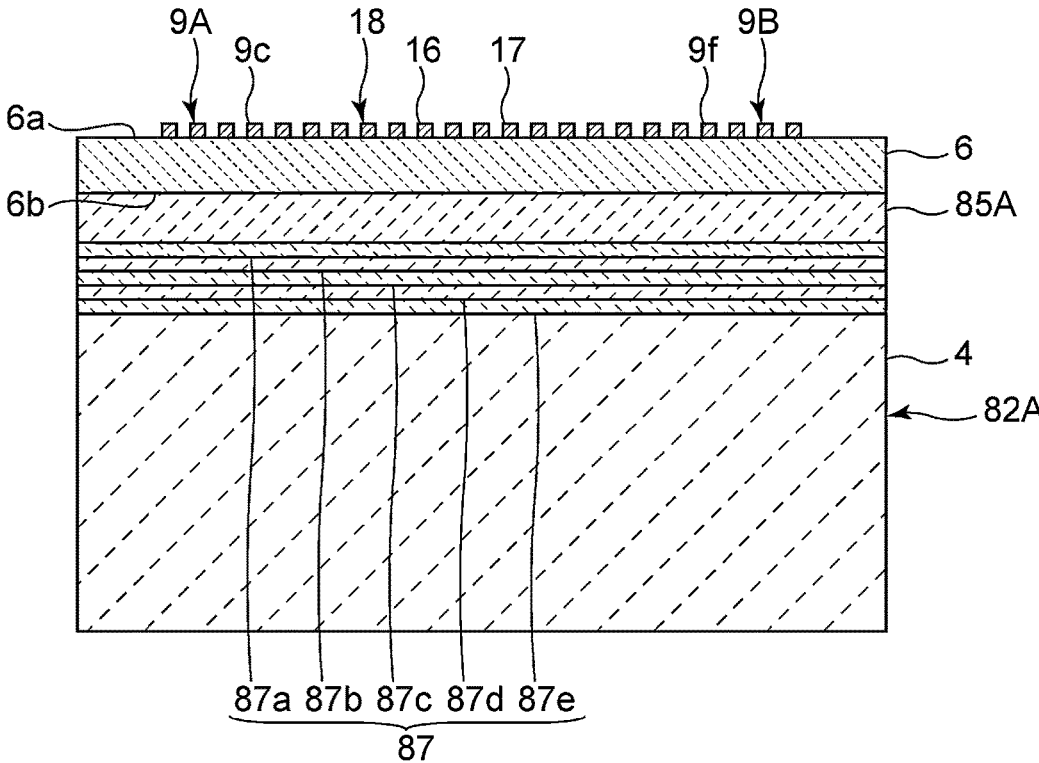
FIG. 38 is a schematic elevational cross-sectional view of the excitation angle change resonator of the first filter in a first modified example of the eighth example embodiment of the present invention.

In the first modified example shown in FIG. 38, a piezoelectric substrate 82A includes the support substrate 4, an acoustic reflection film 87, an intermediate layer 85A, and the piezoelectric body layer 6. The acoustic reflection film 87 is provided on the support substrate 4. The intermediate layer 85A is provided on the acoustic reflection film 87. The piezoelectric body layer 6 is provided on the intermediate layer 85A. The intermediate layer 85A is the low acoustic velocity film.

The acoustic reflection film 87 is a multilayer body having a plurality of acoustic impedance layers. Specifically, the acoustic reflection film 87 includes a plurality of low acoustic impedance layers and a plurality of high acoustic impedance layers. The high acoustic impedance layer is a layer having a relatively high acoustic impedance. More specifically, the plurality of high acoustic impedance layers of the acoustic reflection film 87 are a high acoustic impedance layer 87a, a high acoustic impedance layer 87c, and a high acoustic impedance layer 87e. On the other hand, the low acoustic impedance layer is a layer having a relatively low acoustic impedance. More specifically, the plurality of low acoustic impedance layers of the acoustic reflection film 87 are a low acoustic impedance layer 87b and a low acoustic impedance layer 87d. The low acoustic impedance layer and the high acoustic impedance layer are alternately laminated. The high acoustic impedance layer 87a is a layer located closest to the piezoelectric body layer 6 side in the acoustic reflection film 87.

The acoustic reflection film 87 preferably includes two low acoustic impedance layers and three high acoustic impedance layers. However, the acoustic reflection film 87 may have at least one low acoustic impedance layer and at least one high acoustic impedance layer.

As a material of the low acoustic impedance layer, for example, silicon oxide or aluminum can be used. As a material of the high acoustic impedance layer, for example, metal such as platinum or tungsten, or a dielectric such as aluminum nitride or silicon nitride can be used. The material of the intermediate layer 85A may be the same as the material of the low acoustic impedance layer.

Figure 39:
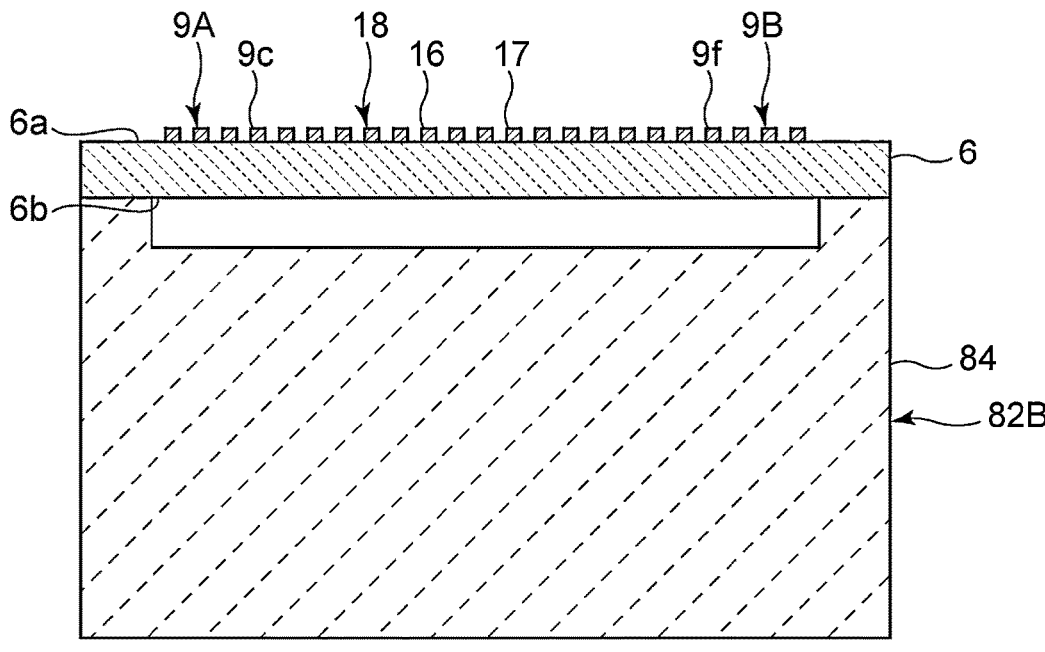
FIG. 39 is a schematic elevational cross-sectional view of the excitation angle change resonator of the first filter in a second modified example of the eighth example embodiment of the present invention.

In the second modified example shown in FIG. 39, a piezoelectric substrate 82B includes a support substrate 84 and the piezoelectric body layer 6. The piezoelectric body layer 6 is directly provided on the support substrate 84. More specifically, the support substrate 84 includes a recessed portion. The piezoelectric body layer 6 is provided on the support substrate 84 to close the recessed portion. In this manner, a hollow portion is provided in the piezoelectric substrate 82B. The hollow portion overlaps at least a portion of the IDT electrode 18 in a plan view.

Figure 40:
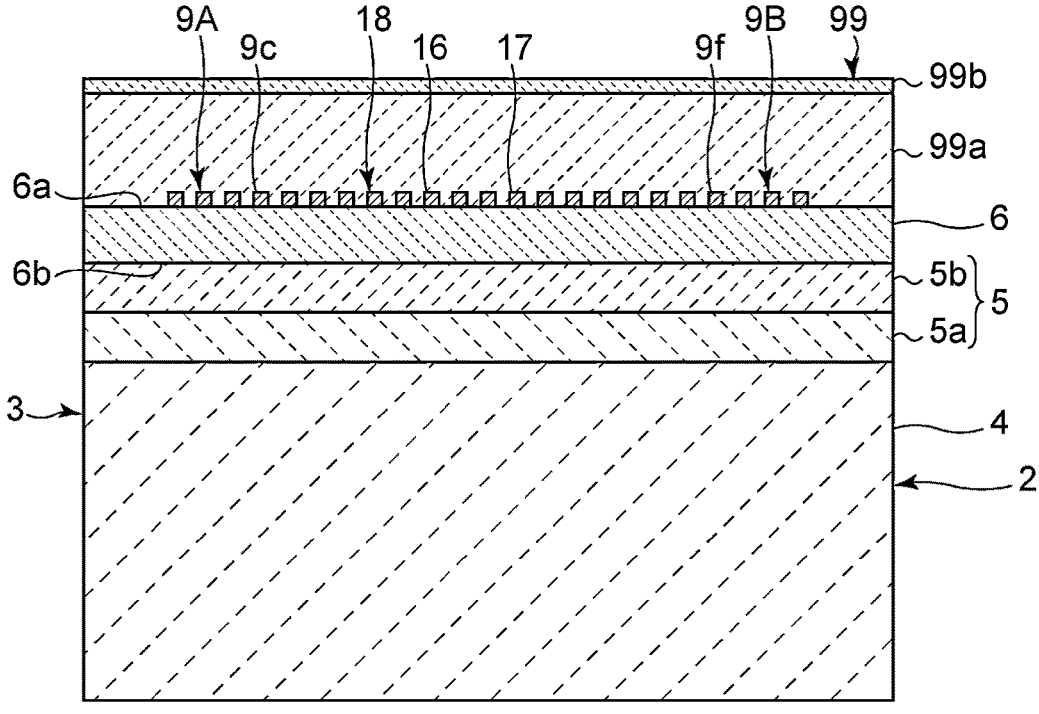
FIG. 40 is a schematic elevational cross-sectional view of the excitation angle change resonator of the first filter in a ninth example embodiment of the present invention.

FIG. 40 is a schematic elevational cross-sectional view of the excitation angle change resonator of the first filter according to a ninth example embodiment of the present invention.

The present example embodiment is different from the first example embodiment in that the IDT electrode 18 is embedded in a protection film 99. Although not shown, another IDT electrode in the first filter 1s also embedded in the protection film 99. Except for the above-described points, the multiplexer of the present example embodiment has the same or substantially the same configuration as that of the multiplexer 1 of the first example embodiment.

Specifically, the protection film 99 is preferably provided on the piezoelectric body layer 6 to cover the IDT electrode 18. The thickness of the protection film 99 is thicker than the thickness of the IDT electrode 18. The IDT electrode 18 is embedded in the protection film 99. In this manner, the IDT electrode 18 is less likely to be damaged.

The protection film 99 includes a first protection layer 99a and a second protection layer 99b. The IDT electrode 18 is embedded in the first protection layer 99a. The second protection layer 99b is provided on the first protection layer 99a. In this manner, a plurality of advantageous effects can be achieved by the protection film 99. Specifically, in the present example embodiment, silicon oxide is used as the material of the first protection layer 99a. In this manner, an absolute value of a temperature coefficient of a frequency (TCF) in each resonator can be reduced. Therefore, temperature characteristics of each resonator can be improved. Silicon nitride is used for the second protection layer 99b. In this manner, humidity resistance can be improved.

In addition, in the present example embodiment, as in the first example embodiment, the influence of the unwanted waves can also be reduced or prevented in the multiplexer.

The materials of the first protection layer 99a and the second protection layer 99b are not limited to the above-described example. The protection film 99 may be a single layer, or may be a multilayer body having three or more layers.

Figure 41:
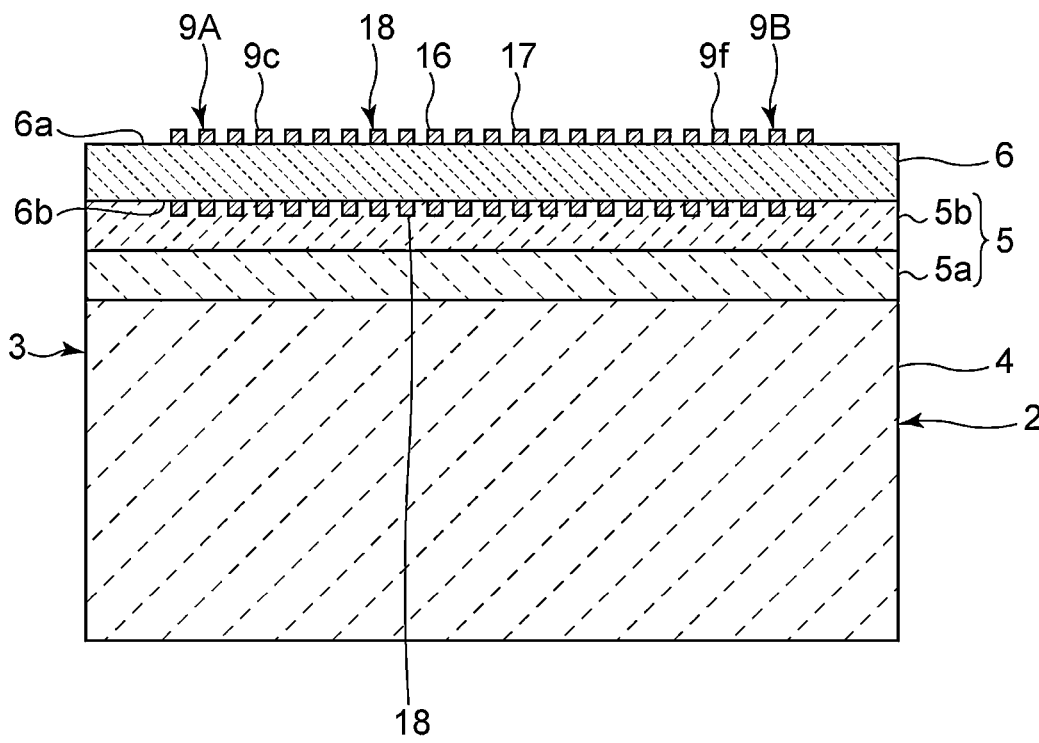
FIG. 41 is a schematic elevational cross-sectional view of the excitation angle change resonator of the first filter in a tenth example embodiment of the present invention.

FIG. 41 is a schematic elevational cross-sectional view of the excitation angle change resonator of the first filter according to a tenth example embodiment of the present invention.

The present example embodiment is different from the first example embodiment in that the IDT electrode 18 is provided on both the first main surface 6a and the second main surface 6b of the piezoelectric body layer 6. The IDT electrode 18 provided on the second main surface 6b is embedded in the second layer 5b of the intermediate layer 5. The present example embodiment is different from the first example embodiment in that the dielectric film 8 is not provided on the first main surface 6a. Except for the above-described points, the multiplexer of the present example embodiment has the same or substantially the same configuration as that of the multiplexer 1 of the first example embodiment.

The IDT electrode 18 provided on the first main surface 6a of the piezoelectric body layer 6 and the IDT electrode 18 provided on the second main surface 6b oppose each other with the piezoelectric body layer 6 interposed therebetween. As in the first example embodiment, in the present example embodiment, the influence of the unwanted waves can also be reduced or prevented in the multiplexer.

For example, the IDT electrodes 18 provided on the first main surface 6a and the second main surface 6b of the piezoelectric body layer 6 may have different structural parameters.

The IDT electrode may be provided on the second main surface 6b of the piezoelectric body layer 6 in addition to the portion shown in FIG. 41. For example, in the first filter, in the portion other than the portion shown in FIG. 41, the IDT electrodes may oppose each other with the piezoelectric body layer 6 interposed therebetween.

Hereinafter, first to third modified examples in which at least only one of the configuration of the electrode provided on the second main surface of the piezoelectric body layer and the multilayer configuration of the piezoelectric substrate is different from that of the tenth example embodiment will be described. As in the tenth example embodiment, in the first to third modified examples, the influence of the unwanted waves can also be reduced or prevented in the multiplexer.

Figure 42:
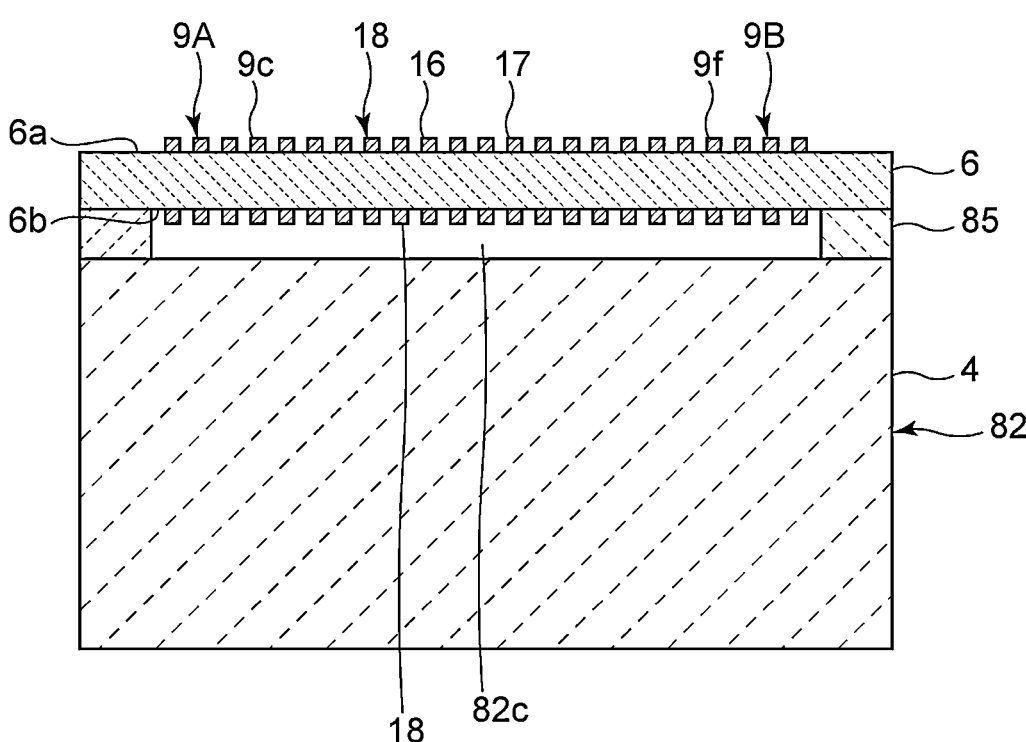
FIG. 42 is a schematic elevational cross-sectional view of the excitation angle change resonator of the first filter in a first modified example of the tenth example embodiment of the present invention.

In the first modified example shown in FIG. 42, the piezoelectric substrate 82 is formed in the same manner as that in the eighth example embodiment. Specifically, the piezoelectric substrate 82 includes the support substrate 4, the intermediate layer 85, and the piezoelectric body layer 6. The IDT electrode 18 provided on the second main surface 6b of the piezoelectric body layer 6 is located inside the hollow portion 82c.

Figure 43:
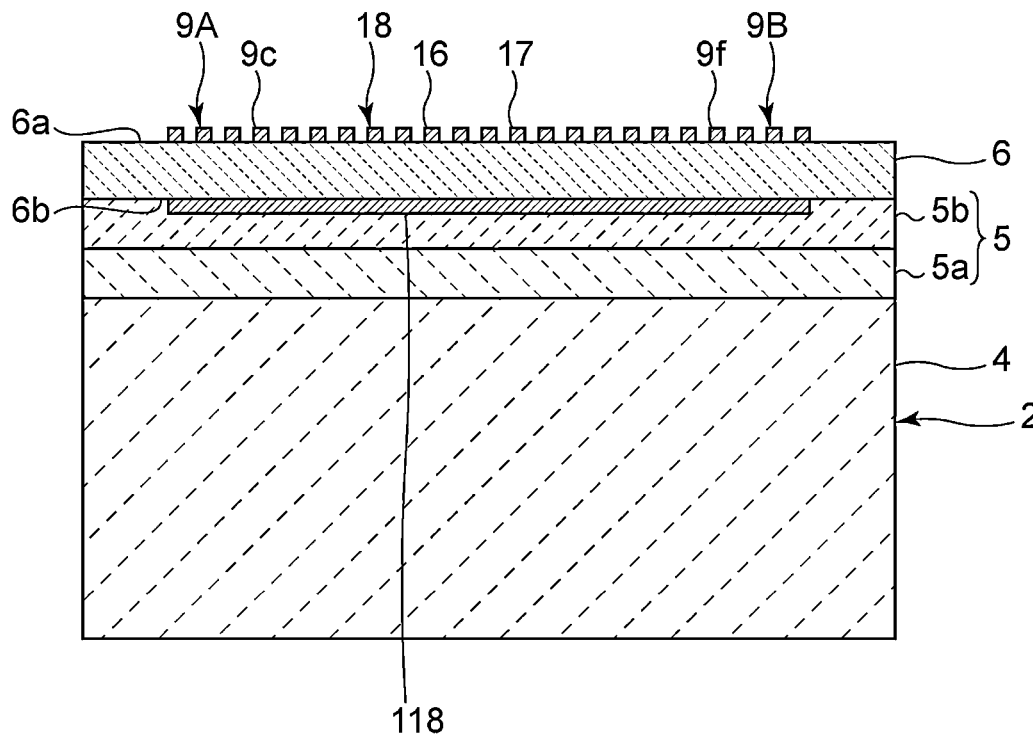
FIG. 43 is a schematic elevational cross-sectional view of the excitation angle change resonator of the first filter in a second modified example of the tenth example embodiment of the present invention.

In the second modified example shown in FIG. 43, a plate-shaped electrode 118 is provided on the second main surface 6b of the piezoelectric body layer 6. The electrode 118 is embedded in the second layer 5b of the intermediate layer 5. The IDT electrode 18 and the electrode 118 oppose each other with the piezoelectric body layer 6 interposed therebetween. The second main surface 6b of the piezoelectric body layer 6 may be provided with other electrodes 118 in addition to the portion shown in FIG. 43. For example, in the first filter, in the portion other than the portion shown in FIG. 43, the IDT electrode and the electrode 118 may oppose each other with the piezoelectric body layer 6 interposed therebetween.

Figure 44:
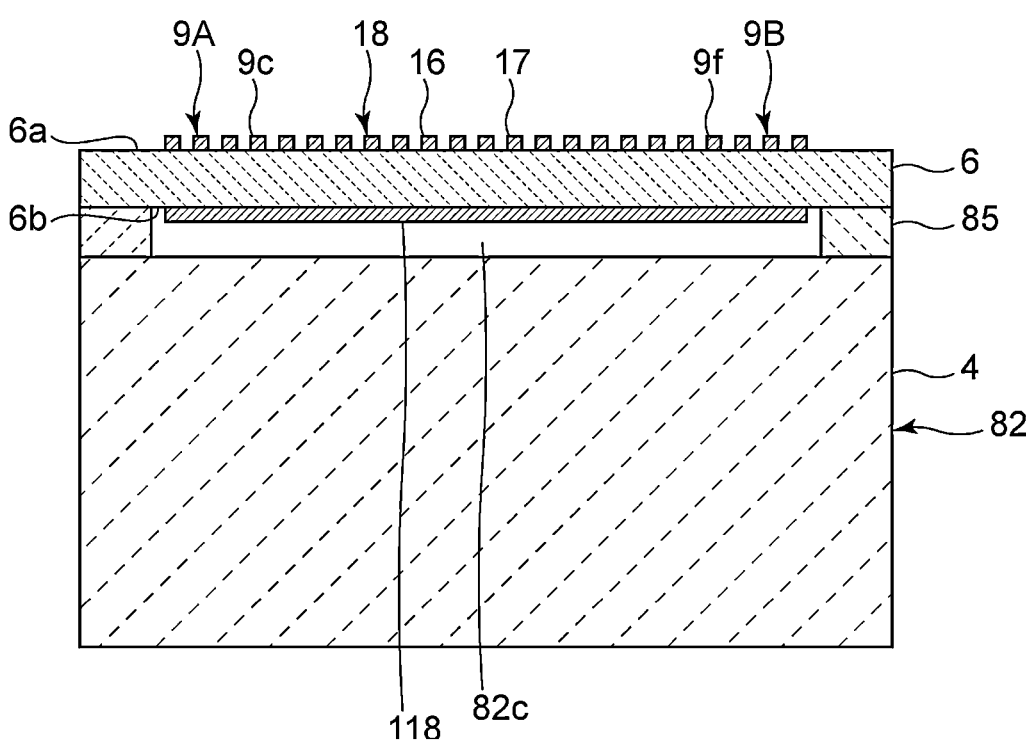
FIG. 44 is a schematic elevational cross-sectional view of the excitation angle change resonator of the first filter in a third modified example of the tenth example embodiment of the present invention.

In the third modified example shown in FIG. 44, the piezoelectric substrate 82 is formed in the same manner as that in the first modified example, and the electrode 118 the same as that in the second modified example is provided on the second main surface 6b of the piezoelectric body layer 6. The electrode 118 is located inside the hollow portion 82c. The IDT electrode 18 and the electrode 118 oppose each other with the piezoelectric body layer 6 interposed therebetween.

While example embodiments of the present invention have been described above, it is to be understood that variations and modifications will be apparent to those skilled in the art without departing from the scope and spirit of the present invention. The scope of the present invention, there- fore, is to be determined solely by the following claims.

What is claimed is:

1. A filter device comprising:
a first signal terminal and a second signal terminal; and
a plurality of resonators including a plurality of series arm resonators and a plurality of parallel arm resonators; wherein
at least one of the plurality of series arm resonators and the plurality of parallel arm resonators is an excitation angle change resonator;
the excitation angle change resonator includes a piezo- electric substrate including a piezoelectric body layer, and an interdigital transducer (IDT) electrode including a plurality of electrode fingers provided on the piezo- electric substrate;
the piezoelectric body layer includes a propagation axis;
the plurality of electrode fingers are curved;
an excitation direction of an acoustic wave in a portion of an electrode finger in the plurality of electrode fingers is one of a first direction perpendicular or substantially perpendicular to an extending direction of the electrode finger, a second direction connecting a shortest distance between the electrode finger and an electrode finger adjacent to the electrode finger, and a third direction of an electric field vector generated between the electrode finger and the electrode finger adjacent to the electrode finger;
when an angle between the excitation direction and an extending direction of the propagation axis is defined as an excitation angle, the excitation angle is not uniform in the IDT electrode of the excitation angle change resonator;
when a set of the series arm resonator and the parallel arm resonator which are adjacent to each other is defined as one ladder portion, a plurality of the ladder portions are provided between the first signal terminal and the second signal terminal;
at least one of the series arm resonator and the parallel arm resonator is a mutually different resonator in the adjacent ladder portions; and
when half the ladder portions located on a first signal terminal side in all of the ladder portions are defined as front half ladder portions, and the resonators in the plurality of resonators, from the resonator located clos- est to the first signal terminal side to the series arm resonator and the parallel arm resonator of the ladder portion located closest to a second signal terminal side in the front half ladder portions are defined as front half resonators, at least one of the front half resonators is the excitation angle change resonator.

2. The filter device according to claim 1, wherein the first signal terminal is connected to an antenna.

3. The filter device according to claim 1, wherein in the IDT electrode of the at least one excitation angle change resonator, a shape of the plurality of electrode fingers in a plan view includes an arc shape or an elliptical arc shape.

4. The filter device according to claim 1, wherein
the plurality of electrode fingers in the IDT electrode of the at least one of the excitation angle change resonator include a plurality of first electrode fingers and a plurality of second electrode fingers which interdigitate each other;

a virtual line connecting tips in tip portions of the plurality of second electrode fingers is defined as a first envelope curve, and a virtual line connecting tips in tip portions of the plurality of first electrode fingers is defined as a second envelope curve;
a region between the first envelope curve and the second envelope curve is an intersection region in the IDT electrode;
a portion including a portion located on the first envelope curve in the first electrode finger and adjacent to the tip portion of one of the second electrode fingers is an adjacent portion of the first electrode finger;
a portion including a portion located on the second envelope curve in the second electrode finger and adjacent to the tip portion of one of the first electrode fingers is an adjacent portion of the second electrode finger;
the intersection region includes at least one curve region where each shape of the plurality of first electrode fingers and the plurality of second electrode fingers in a plan view is a curve shape;
the at least one curve region includes the curve region where one end edge is the first envelope curve;
each curvature of the first electrode fingers and the second electrode fingers is not constant in the curve region; and
the curvatures are different from each other between the tip portions located on a first envelope curve side, between the adjacent portions, or between the tip portion and the adjacent portion, in at least one set of the electrode fingers in the plurality of first electrode fingers and the plurality of second electrode fingers.

5. The filter device according to claim 3, wherein the at least one excitation angle change resonator includes a pair of reflectors provided on the piezoelectric body layer to oppose each other with the IDT electrode interposed therebetween, and each including a plurality of reflector electrode fingers; and
shapes of the plurality of reflector electrode fingers in a plan view include a curve shape.

6. The filter device according to claim 1, wherein
the plurality of electrode fingers in the IDT electrode of the at least one of the excitation angle change resonator include a plurality of first electrode fingers and a plurality of second electrode fingers which interdigitate each other;
a virtual line connecting tip portions of the plurality of second electrode fingers is defined as a first envelope curve, a virtual line connecting tip portions of the plurality of first electrode fingers is defined as a second envelope curve, and a region between the first envelope curve and the second envelope curve in the IDT elec- trode is an intersection region;
the intersection region includes a plurality of parallel regions where the plurality of first electrode fingers and the plurality of second electrode fingers extend in parallel, and a non-parallel region where extending directions of the plurality of first electrode fingers and the plurality of second electrode fingers intersect each other;
in at least a portion of the intersection region, the parallel region and the non-parallel region are alternately pro- vided; and
each of the plurality of first electrode fingers and the plurality of second electrode fingers linearly extends in the plurality of parallel regions and the non-parallel region, and is curved at a boundary between the parallel region and the non-parallel region.

7. The filter device according to claim 6, wherein

The at least one excitation angle change resonator includes a pair of reflectors provided on the piezoelectric body layer to oppose each other with the IDT electrode interposed therebetween, and each including a plurality of reflector electrode fingers; and shapes of the plurality of reflector electrode fingers in a plan view include a shape curved in a plurality of nodes.

8. The filter device according to claim 1, wherein at least one of an electrode finger pitch and a duty ratio is constant in a portion where the excitation angles are the same in the IDT electrode of the at least one of the excitation angle change resonator.

9. The filter device according to claim 1, wherein the plurality of electrode fingers in the IDT electrode of the at least one excitation angle change resonator include a plurality of first electrode fingers and a plurality of second electrode fingers which interdigitate each other;

a virtual line connecting tips in tip portions of the plurality of second electrode fingers is defined as a first envelope curve, a virtual line connecting tips in tip portions of the plurality of first electrode fingers is defined as a second envelope curve, a region between the first envelope curve and the second envelope curve is an intersection region in the IDT electrode; and in the intersection region of at least one of the excitation angle change resonators, resonant frequencies or anti-resonant frequencies substantially coincide with each other.

10. The filter device according to claim 1, wherein a path connecting the first signal terminal and the second signal terminal is a series arm;

each path that branches from the series arm to a ground potential is a parallel arm;

each connection point between the series arm and the parallel arm is a node;

when one of the series arm resonators or a group of the plurality of series arm resonators connected in series without using the node is defined as a series arm resonator assembly, a plurality of the series arm resonator assemblies are formed in the series arm;

when each of a portion between the first signal terminal and the series arm resonator assembly, a portion between the second signal terminal and the series arm resonator assembly, and a portion between the adjacent series arm resonator assemblies is defined as a section, at least one of the nodes is located in each of the sections between at least the adjacent series arm resonator assemblies;

when the parallel arm resonator located in the parallel arm connected to the node located in the same section is defined as one parallel arm resonator assembly, a plurality of the parallel arm resonator assemblies are formed; and at least one of the resonators in at least one of the series arm resonator assembly located closest to the first signal terminal side and the parallel arm resonator assembly located closest to the first signal terminal side is the excitation angle change resonator.

11. The filter device according to claim 10, wherein, when the plurality of series arm resonator assemblies and the plurality of parallel arm resonator assemblies are defined as a plurality of resonator assemblies, at least one of the resonators in the resonator assembly located closest to the first signal terminal side is the excitation angle change resonator.

12. The filter device according to claim 11, wherein the resonator assembly located closest to the first signal terminal side includes a plurality of the resonators; and a half or more of the resonators of the plurality of resonators are the excitation angle change resonators.

13. The filter device according to claim 10, wherein when the plurality of series arm resonator assemblies and the plurality of parallel arm resonator assemblies are defined as a plurality of resonator assemblies, the resonator assembly located closest to the first signal terminal side includes a plurality of the resonators;

at least two of the plurality of resonators are the excitation angle change resonators; and in at least two of the excitation angle change resonators in the resonator assembly located closest to the first signal terminal side, types of shapes of the electrode fingers in a plan view are different from each other.

14. The filter device according to claim 10, wherein when the plurality of series arm resonator assemblies and the plurality of parallel arm resonator assemblies are defined as a plurality of resonator assemblies, the resonator assembly located closest to the first signal terminal side includes a plurality of the resonators;

at least two of the plurality of resonators are the excitation angle change resonators;

a duty ratio in a portion where at least the excitation angle is about 0° is constant in each of at least two of the excitation angle change resonators in the resonator assembly located closest to the first signal terminal side; and duty ratios in the portion where the excitation angle is about 0° are different from each other in at least two of the excitation angle change resonators in the resonator assembly located closest to the first signal terminal side.

15. The filter device according to claim 13, wherein the resonator assembly located closest to the first signal terminal side includes a plurality of the resonators;

at least three of the plurality of resonators in the plurality of resonators are the excitation angle change resonators; and types of shapes of the electrode fingers in a plan view are different from each other in at least three of the excitation angle change resonators in the resonator assembly located closest to the first signal terminal side.

16. The filter device according to claim 13, wherein the resonator assembly located closest to the first signal terminal side includes a plurality of the resonators;

at least three of the resonators in the plurality of resonators are the excitation angle change resonators;

a duty ratio in a portion where at least the excitation angle is 0° is constant in each of at least three of the excitation angle change resonators in the resonator assembly located closest to the first signal terminal side; and duty ratios in the portion where the excitation angle is 0° are different from each other in at least three of the excitation angle change resonators in the resonator assembly located closest to the first signal terminal side.

17. The filter device according to claim 13, wherein in at least one of the excitation angle change resonators included in the resonator assembly located closest to the first signal terminal side, a shape of the electrode finger in a plan view is an arc shape; and in at least another one of the excitation angle change resonators, the shape of the electrode finger in the plan view is a shape other than the arc shape.

18. The filter device according to claim 10, wherein when the plurality of series arm resonator assemblies and the plurality of parallel arm resonator assemblies are defined as a plurality of resonator assemblies, the resonator assembly located closest to the first signal terminal side includes a plurality of the resonators;

at least two of the plurality of resonators are the excitation angle change resonators;

the plurality of electrode fingers in the IDT electrode of each of the excitation angle change resonators include a plurality of first electrode fingers and a plurality of second electrode fingers which interdigitate each other;

in each of the excitation angle change resonators, a virtual line formed by connecting tips in tip portions of the plurality of second electrode fingers is defined as a first envelope curve;

a virtual line formed by connecting tips in tip portions of the plurality of first electrode fingers is defined as a second envelope curve;

a region between the first envelope curve and the second envelope curve is an intersection region in the IDT electrode;

in the intersection region, resonant frequencies or anti-resonant frequencies substantially coincide with each other; and in at least two of the excitation angle change resonators included in the resonator assembly located closest to the first signal terminal side, the resonant frequencies or the anti-resonant frequencies in the intersection region substantially coincide with each other.

19. The filter device according to claim 1, wherein the plurality of electrode fingers in the IDT electrode of the excitation angle change resonator include a plurality of first electrode fingers and a plurality of second electrode fingers which interdigitate each other;

a virtual line formed by connecting tips in tip portions of the plurality of second electrode fingers is defined as a first envelope curve, a virtual line formed by connecting tips in tip portions of the plurality of first electrode fingers is defined as a second envelope curve, a region between the first envelope curve and the second envelope curve is an intersection region in the IDT electrode; and in at least one of the excitation angle change resonators, at least one of the first envelope curve and the second envelope curve includes at least one bending portion whose extending direction is changed.

20. The filter device according to claim 1, wherein the plurality of electrode fingers in the IDT electrode of the excitation angle change resonator include a plurality of first electrode fingers and a plurality of second electrode fingers which interdigitate each other;

a virtual line formed by connecting tips in tip portions of the plurality of second electrode fingers is defined as a first envelope curve, a virtual line formed by connecting tips in tip portions of the plurality of first electrode fingers is defined as a second envelope curve, a region between the first envelope curve and the second envelope curve is an intersection region in the IDT electrode; and in at least one of the excitation angle change resonators, at least one of the first envelope curve and the second envelope curve is linear.

21. The filter device according to claim 1, wherein the plurality of electrode fingers in the IDT electrode of the excitation angle change resonator include a plurality of first electrode fingers and a plurality of second electrode fingers which interdigitate each other;

a virtual line formed by connecting tips in tip portions of the plurality of second electrode fingers is defined as a first envelope curve, a virtual line formed by connecting tips in tip portions of the plurality of first electrode fingers is defined as a second envelope curve, a region between the first envelope curve and the second envelope curve is an intersection region in the IDT electrode; and the intersection region includes a first edge region including the first envelope curve, a second edge region including the second envelope curve, and a central region interposed between the first edge region and the second edge region; and in at least one of the excitation angle change resonators, in at least a portion of at least one of the first edge region and the second edge region, a low acoustic velocity region whose acoustic velocity is lower than an acoustic velocity in the central region is formed.

22. The filter device according to claim 21, wherein, in at least one of the first edge region and the second edge region, at least one of the electrode fingers includes a wide portion whose width is wider than a width in the central region to define the low acoustic velocity region.

23. The filter device according to claim 21, further comprising:

a mass addition film provided to overlap at least one of the plurality of first electrode fingers and the plurality of second electrode fingers, when viewed in a plan view, in at least one of the first edge region and the second edge region; wherein the low acoustic velocity region is defined by providing the mass addition film.

24. The filter device according to claim 21, wherein, in at least one of the first edge region and the second edge region, the low acoustic velocity region is defined by causing a thickness of at least one of the electrode fingers to be thicker than a thickness of the electrode finger in the central region.

25. The filter device according to claim 21, wherein the low acoustic velocity region is provided in an entirety or substantially an entirety of both the first edge region and the second edge region.

26. The filter device according to claim 1, wherein a path connecting the first signal terminal and the second signal terminal is a series arm; and the plurality of resonators include a longitudinally coupled resonator acoustic wave filter located in the series arm.

27. The filter device according to claim 1, wherein the piezoelectric substrate includes a support substrate; and the piezoelectric body layer is provided on the support substrate.

28. The filter device according to claim 27, wherein the piezoelectric substrate includes an intermediate layer provided between the support substrate and the piezoelectric body layer.

29. The filter device according to claim 28, wherein a hollow portion is provided in the piezoelectric substrate; and a portion of the support substrate and a portion of the piezoelectric body layer oppose each other with the hollow portion interposed therebetween.

30. The filter device according to claim 1, wherein the piezoelectric substrate is defined by only the piezoelectric body layer.

31. The filter device according to claim 1, wherein all of the resonators share the same piezoelectric substrate.

32. A multiplexer comprising:

a common connection terminal; and a plurality of filters including a first filter and a second filter connected in common to the common connection terminal; wherein at least the first filter in the plurality of filters is the filter device according to claim 1.

33. The multiplexer according to claim 32, wherein the plurality of filters share the same piezoelectric substrate.

34. The multiplexer according to claim 32, further comprising:

a mounting substrate; wherein at least the second filter in the plurality of filters includes a substrate different from the piezoelectric substrate of the first filter; and the plurality of filters are mounted on the mounting substrate.

35. The multiplexer according to claim 32, wherein a pass band of the first filter $1s$ located on a higher band side with respect to a pass band of the second filter; and the pass band of the second filter includes at least a portion of a frequency which is equal to or higher than about 0.5 times and equal to or lower than about 0.9 times a resonant frequency of at least one of the excitation angle change resonators in the first filter.

36. The multiplexer according to claim 32, wherein a pass band of the first filter is located on a low band side with respect to a pass band of the second filter.

* * * * *